US012446302B2

(12) United States Patent
Tanaka et al.

(10) Patent No.: US 12,446,302 B2
(45) Date of Patent: Oct. 14, 2025

(54) METHOD FOR FORMING CAPACITOR, SEMICONDUCTOR DEVICE, MODULE, AND ELECTRONIC DEVICE

(71) Applicant: Semiconductor Energy Laboratory Co., Ltd., Atsugi (JP)

(72) Inventors: Tetsuhiro Tanaka, Kiyose (JP); Yutaka Okazaki, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/519,200

(22) Filed: Nov. 27, 2023

(65) Prior Publication Data
US 2024/0105713 A1    Mar. 28, 2024

Related U.S. Application Data

(60) Continuation of application No. 17/216,759, filed on Mar. 30, 2021, now abandoned, which is a division of
(Continued)

(30) Foreign Application Priority Data

Oct. 30, 2015  (JP) ................................ 2015-214050

(51) Int. Cl.
*H10D 84/80* (2025.01)
*H01G 4/008* (2006.01)
(Continued)

(52) U.S. Cl.
CPC .......... *H10D 84/813* (2025.01); *H01G 4/008* (2013.01); *H01G 4/105* (2013.01); *H01G 4/40* (2013.01);
(Continued)

(58) Field of Classification Search
CPC .......... H01L 27/0733; H01L 29/78696; H01L 29/94
See application file for complete search history.

(56) References Cited

U.S. PATENT DOCUMENTS

| 4,432,035 A | 2/1984 | Hsieh et al. |
| 5,485,019 A | 1/1996 | Yamazaki et al. |
| (Continued) |

FOREIGN PATENT DOCUMENTS

| EP | 0096773 A | 12/1983 |
| JP | 58-220457 A | 12/1983 |
| (Continued) |

OTHER PUBLICATIONS

Taiwanese Office Action (Application No. 105133583) Dated Jul. 22, 2020.
(Continued)

*Primary Examiner* — Marlon T Fletcher
*Assistant Examiner* — Christina A Sylvia
(74) *Attorney, Agent, or Firm* — Eric J. Robinson; Robinson Intellectual Property Law Office, P.C.

(57) ABSTRACT

A miniaturized transistor is provided. A transistor with low parasitic capacitance is provided. A transistor having high frequency characteristics is provided. A transistor having a large amount of on-state current is provided. A semiconductor device including the transistor is provided. A semiconductor device with high integration is provided. A novel capacitor is provided. The capacitor includes a first conductor, a second conductor, and an insulator. The first conductor includes a region overlapping with the second conductor with the insulator provided therebetween. The first conductor includes tungsten and silicon. The insulator includes a silicon oxide film that is formed by oxidizing the first conductor.

6 Claims, 62 Drawing Sheets

Related U.S. Application Data application No. 15/991,195, filed on May 29, 2018, now Pat. No. 10,971,491, which is a division of application No. 15/298,306, filed on Oct. 20, 2016, now Pat. No. 10,002,866.

(51) Int. Cl.

| | | |
|---|---|---|
| *H01G 4/10* | (2006.01) | |
| *H01G 4/40* | (2006.01) | |
| *H05K 1/18* | (2006.01) | |
| *H10D 1/66* | (2025.01) | |
| *H10D 30/01* | (2025.01) | |
| *H10D 30/67* | (2025.01) | |
| *H10D 86/40* | (2025.01) | |
| *H10D 86/60* | (2025.01) | |
| *H10B 41/70* | (2023.01) | |
| *H10D 84/08* | (2025.01) | |
| *H10D 88/00* | (2025.01) | |

(52) U.S. Cl.
CPC ............... *H05K 1/18* (2013.01); *H10D 1/66* (2025.01); *H10D 30/021* (2025.01); *H10D 30/6734* (2025.01); *H10D 30/6755* (2025.01); *H10D 30/6757* (2025.01); *H10D 86/423* (2025.01); *H10D 86/481* (2025.01); *H10D 86/60* (2025.01); *H05K 2201/10015* (2013.01); *H05K 2201/10083* (2013.01); *H05K 2201/10166* (2013.01); *H10B 41/70* (2023.02); *H10D 84/08* (2025.01); *H10D 84/811* (2025.01); *H10D 88/00* (2025.01)

(56) References Cited

U.S. PATENT DOCUMENTS

| | | |
|---|---|---|
| 5,858,831 A | 1/1999 | Sung |
| 5,933,741 A | 8/1999 | Tseng |
| 6,338,999 B1 | 1/2002 | Hsue et al. |
| 6,340,622 B1 | 1/2002 | Lee et al. |
| 6,368,941 B1 | 4/2002 | Chen et al. |
| 6,583,458 B1 | 6/2003 | Hayashi et al. |
| 6,737,728 B1 | 5/2004 | Block et al. |
| 7,118,957 B2 | 10/2006 | Hayashi et al. |
| 7,361,552 B2 | 4/2008 | Hayashi et al. |
| 7,608,531 B2 | 10/2009 | Isa et al. |
| 7,947,984 B2 | 5/2011 | Jang et al. |
| 8,048,735 B2 | 11/2011 | Takeda et al. |
| 8,274,814 B2 | 9/2012 | Tokunaga et al. |
| 8,410,002 B2 | 4/2013 | Yamazaki et al. |
| 8,487,436 B2 | 7/2013 | Isa et al. |
| 8,547,771 B2 | 10/2013 | Koyama |
| 8,559,220 B2 | 10/2013 | Yamazaki et al. |
| 8,648,346 B2 | 2/2014 | Isa et al. |
| 8,687,407 B2 | 4/2014 | Tokunaga et al. |
| 8,742,544 B2 | 6/2014 | Yamazaki et al. |
| 8,932,903 B2 | 1/2015 | Sato et al. |
| 8,995,174 B2 | 3/2015 | Koyama |
| 9,166,041 B2 | 10/2015 | Shinohara et al. |
| 9,209,795 B2 | 12/2015 | Okamoto et al. |
| 9,324,810 B2 | 4/2016 | Tokunaga et al. |
| 9,356,152 B2 | 5/2016 | Isa. et al. |
| 9,401,432 B2 | 7/2016 | Kobayashi et al. |
| 9,443,870 B2 | 9/2016 | Shinohara et al. |
| 9,443,872 B2 | 9/2016 | Miyairi |
| 9,466,615 B2 | 10/2016 | Miyairi et al. |
| 9,799,685 B2 | 10/2017 | Miyairi |
| 9,865,746 B2 | 1/2018 | Tokunaga et al. |
| 9,882,059 B2 | 1/2018 | Yamazaki et al. |
| 9,947,801 B2 | 4/2018 | Yamazaki et al. |
| 9,972,644 B2 | 5/2018 | Hsu et al. |
| 10,236,392 B2 | 3/2019 | Yamazaki et al. |
| 10,374,097 B2 | 8/2019 | Yamazaki et al. |
| 10,388,520 B2 | 8/2019 | Yamazaki et al. |
| 10,566,460 B2 | 2/2020 | Yamazaki et al. |
| 10,833,203 B2 | 11/2020 | Yamazaki et al. |
| 11,177,392 B2 | 11/2021 | Yamazaki et al. |
| 2003/0057466 A1 | 3/2003 | Otsuki |
| 2010/0193342 A1 | 8/2010 | Roh et al. |
| 2011/0089417 A1 | 4/2011 | Yamazaki et al. |
| 2012/0001179 A1 | 1/2012 | Yamazaki et al. |
| 2012/0062814 A1 | 3/2012 | Yamazaki et al. |
| 2012/0086879 A1 | 4/2012 | Yu et al. |
| 2012/0120360 A1 | 5/2012 | Jung et al. |
| 2012/0132997 A1 | 5/2012 | Tokita |
| 2012/0175618 A1 | 7/2012 | Yamada et al. |
| 2013/0320459 A1 | 12/2013 | Shue et al. |
| 2013/0341784 A1 | 12/2013 | Lin et al. |
| 2014/0151685 A1 | 6/2014 | Tokunaga et al. |
| 2014/0167041 A1 | 6/2014 | Yamazaki et al. |
| 2014/0339540 A1 | 11/2014 | Takemura |
| 2015/0111340 A1 | 4/2015 | Sato et al. |
| 2015/0179803 A1 | 6/2015 | Yamazaki et al. |
| 2015/0187814 A1* | 7/2015 | Miyairi ............. H01L 29/78603 257/43 |
| 2015/0214328 A1 | 7/2015 | Tanaka |
| 2015/0255490 A1* | 9/2015 | Miyairi ............... H01L 29/7869 257/43 |
| 2015/0280013 A1 | 10/2015 | Yamazaki et al. |
| 2015/0280691 A1 | 10/2015 | Koyama |
| 2016/0240685 A1 | 8/2016 | Tanaka |
| 2016/0329436 A1 | 11/2016 | Kobayashi et al. |
| 2019/0341495 A1 | 11/2019 | Yamazaki et al. |
| 2021/0305432 A1 | 9/2021 | Yamazaki et al. |
| 2021/0328074 A1 | 10/2021 | Kobayashi et al. |
| 2022/0069136 A1 | 3/2022 | Yamazaki et al. |

FOREIGN PATENT DOCUMENTS

| | | |
|---|---|---|
| JP | 2001-203330 A | 7/2001 |
| JP | 2004-071848 A | 3/2004 |
| JP | 2004-128466 A | 4/2004 |
| JP | 2005-210142 A | 8/2005 |
| JP | 2008-010609 A | 1/2008 |
| JP | 2010-010507 A | 1/2010 |
| JP | 2011-109079 A | 6/2011 |
| JP | 2011-135065 A | 7/2011 |
| JP | 2012-119383 A | 6/2012 |
| JP | 2012-257187 A | 12/2012 |
| JP | 2014-240833 A | 12/2014 |
| JP | 2014-241407 A | 12/2014 |
| JP | 2015-053345 A | 3/2015 |
| JP | 2015-143396 A | 8/2015 |
| JP | 2015-144271 A | 8/2015 |
| JP | 2015-156480 A | 8/2015 |
| JP | 2015-188070 A | 10/2015 |
| JP | 2015-195380 A | 11/2015 |
| TW | 201349432 | 12/2013 |
| TW | 201427016 | 7/2014 |
| TW | 201438226 | 10/2014 |
| TW | 201528510 | 7/2015 |
| WO | WO-2011/048929 | 4/2011 |
| WO | WO-2011/065258 | 6/2011 |
| WO | WO-2015/097588 | 7/2015 |
| WO | WO-2015/097589 | 7/2015 |
| WO | WO-2015/145292 | 10/2015 |

OTHER PUBLICATIONS

Taiwanese Office Action (Application No. 110106350) Dated Nov. 12, 2021.

\* cited by examiner

FIG. 17A
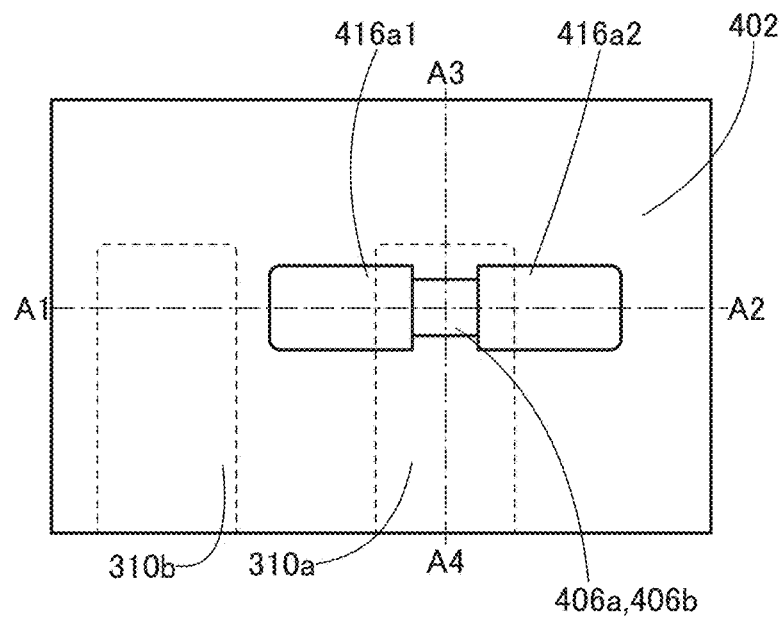
FIG. 17B
FIG. 17C
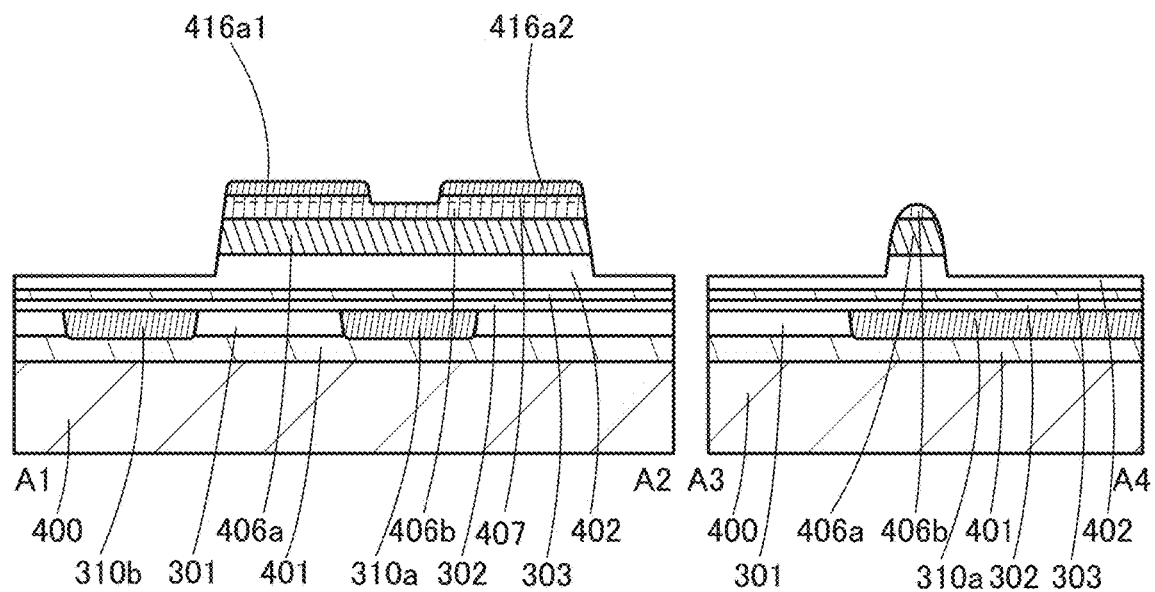

FIG. 18A
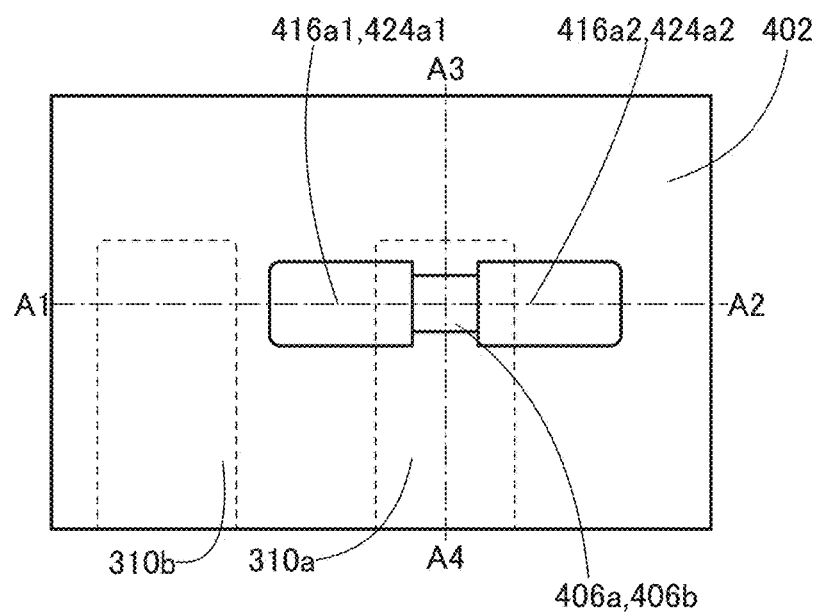
FIG. 18B
FIG. 18C
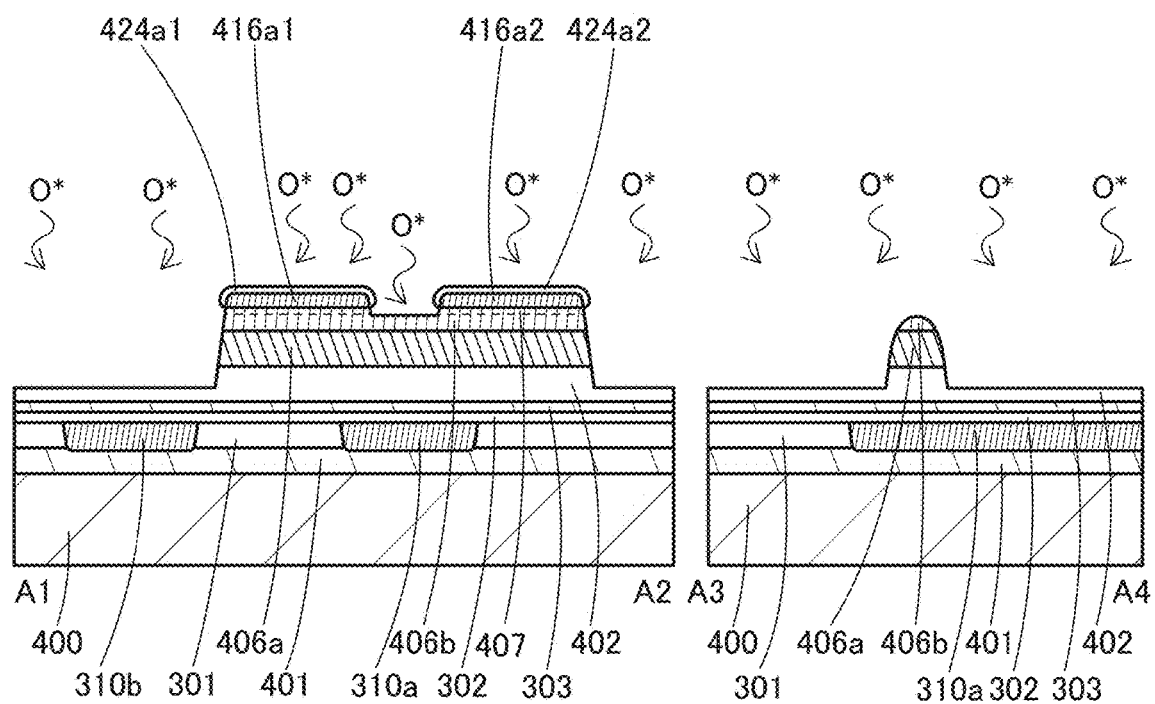

FIG. 19A
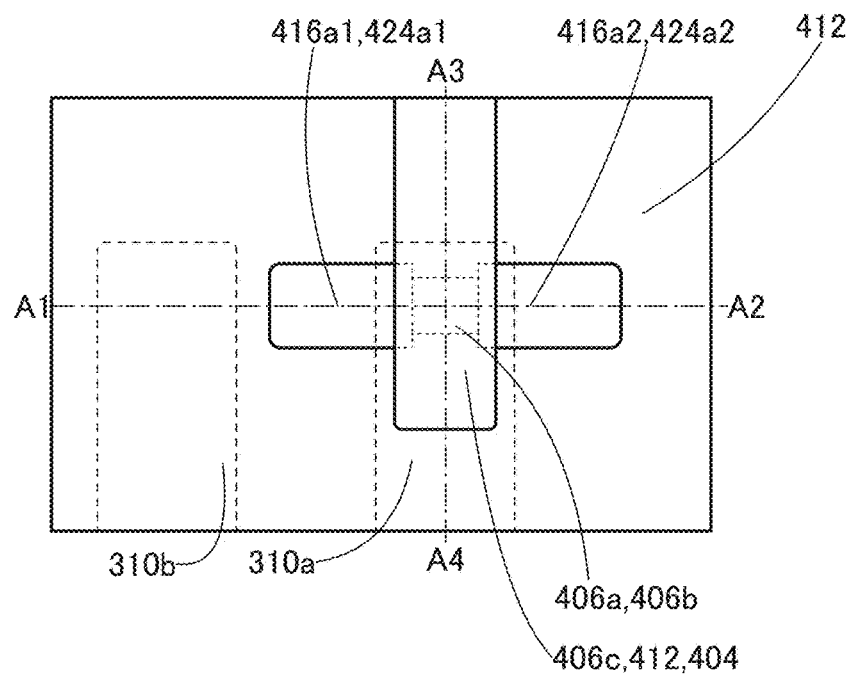
FIG. 19B
FIG. 19C
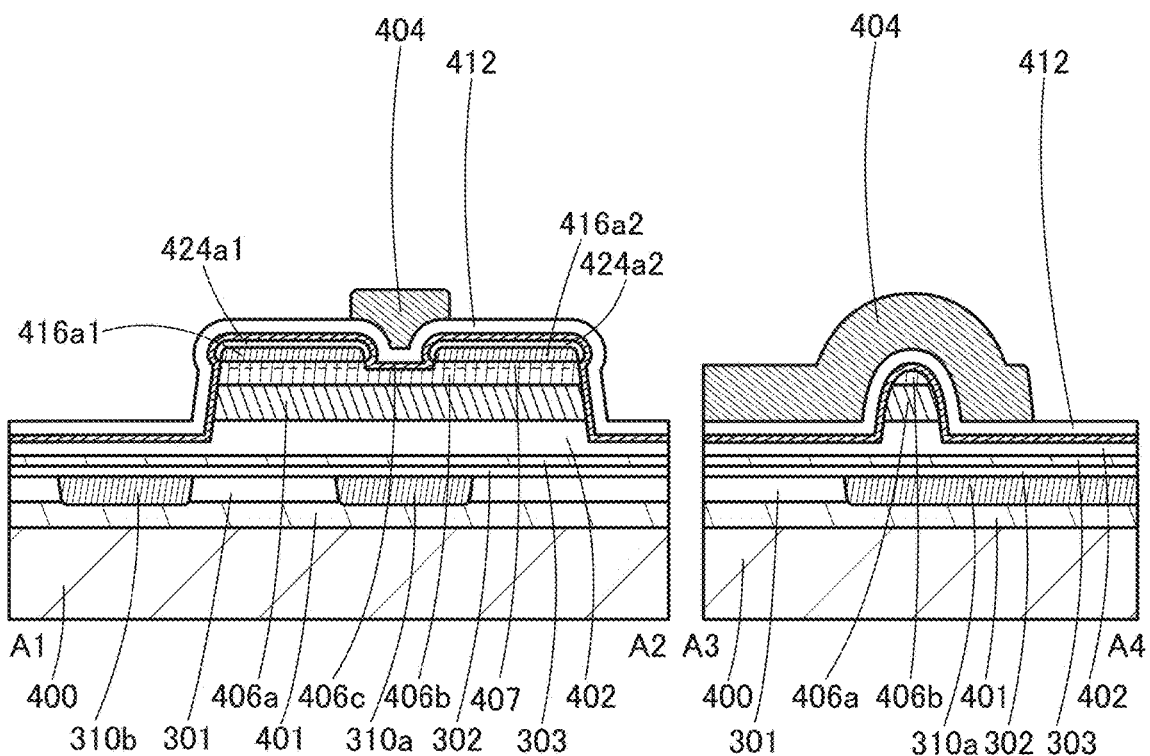

FIG. 20A
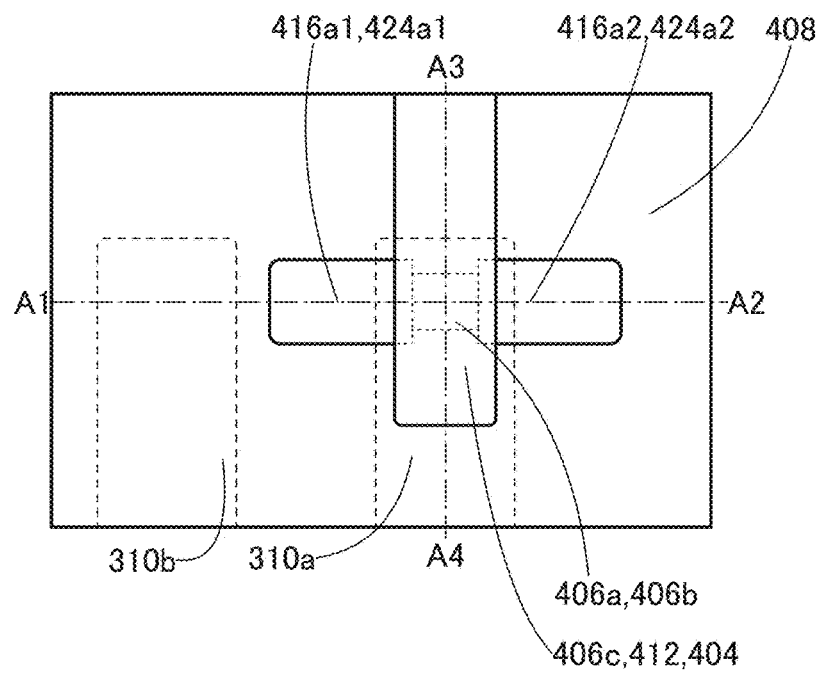
FIG. 20B
FIG. 20C
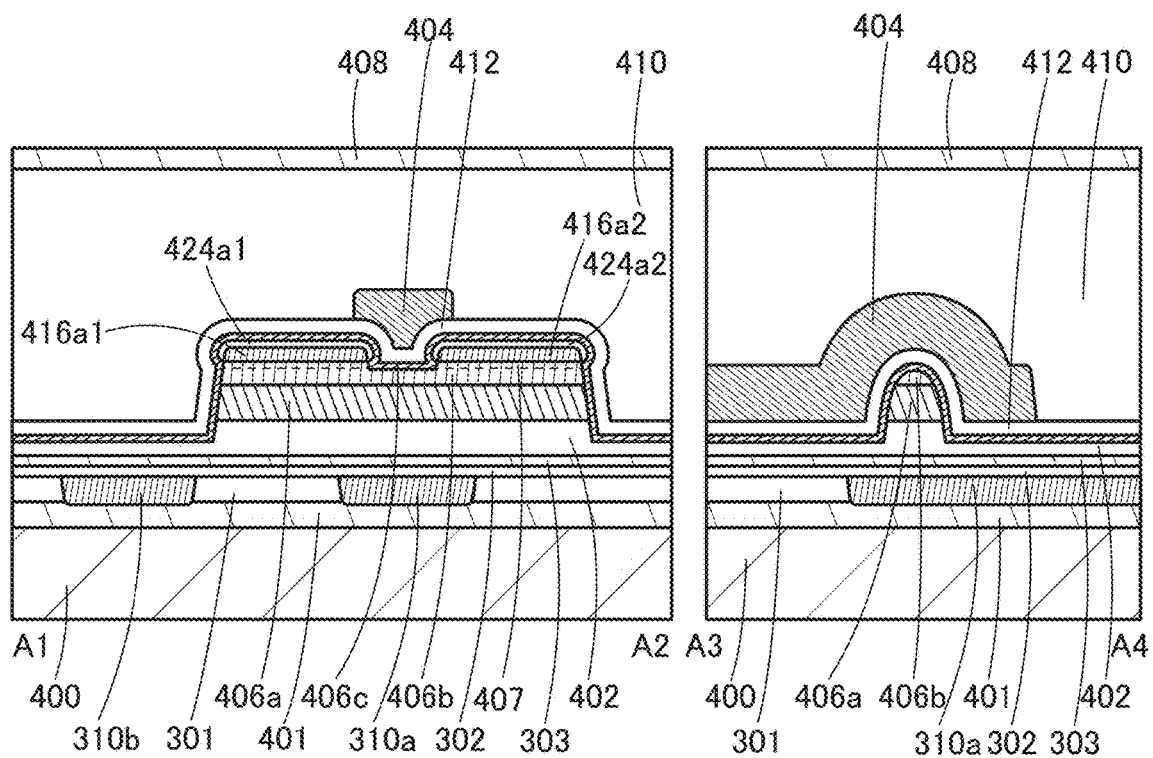

FIG. 21A
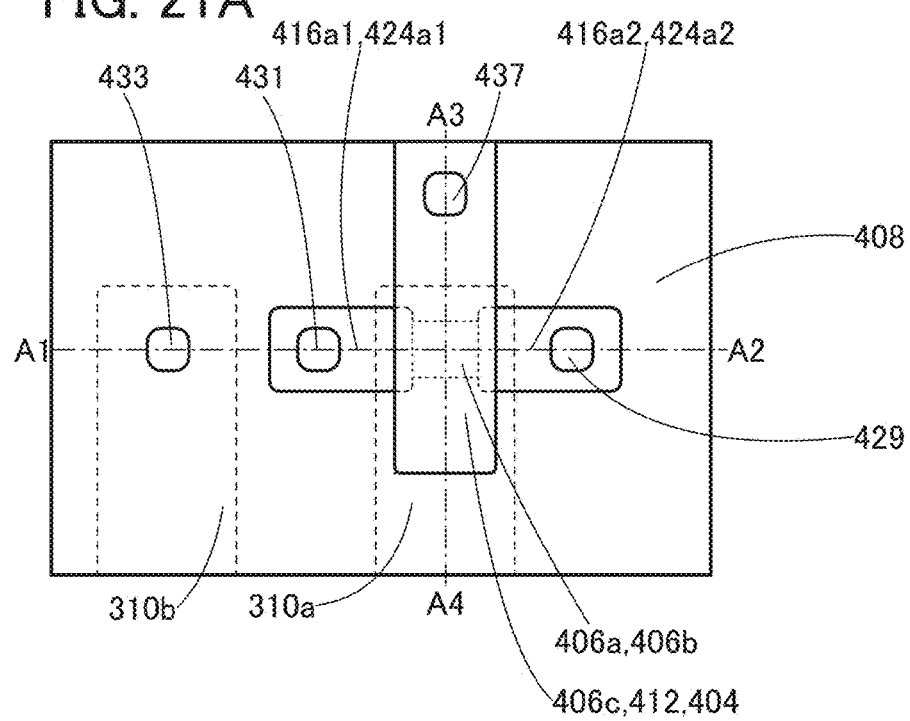
FIG. 21B
FIG. 21C
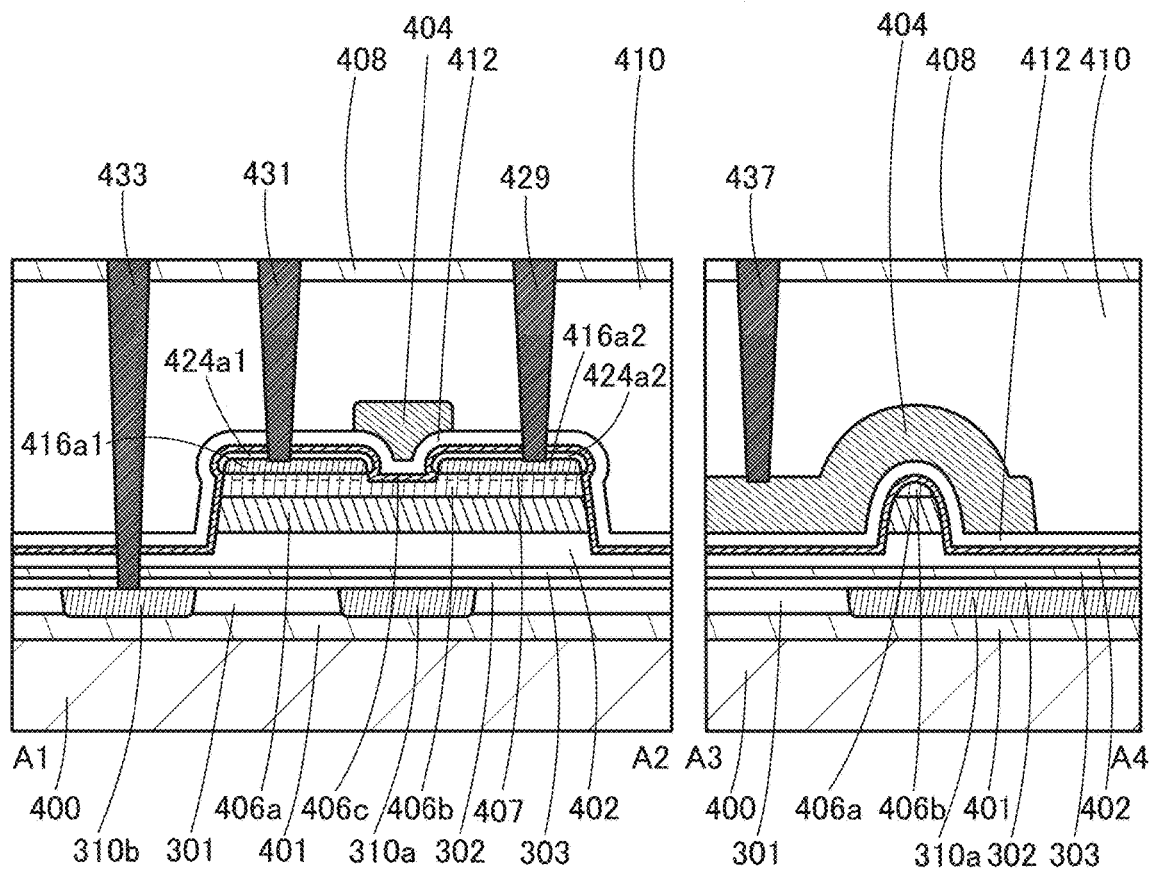

FIG. 25A
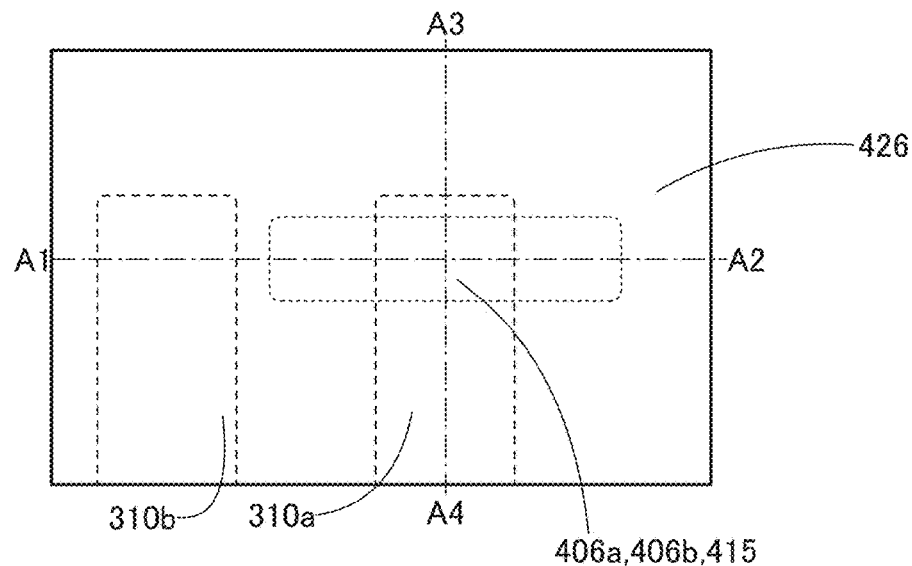
FIG. 25B
FIG. 25C
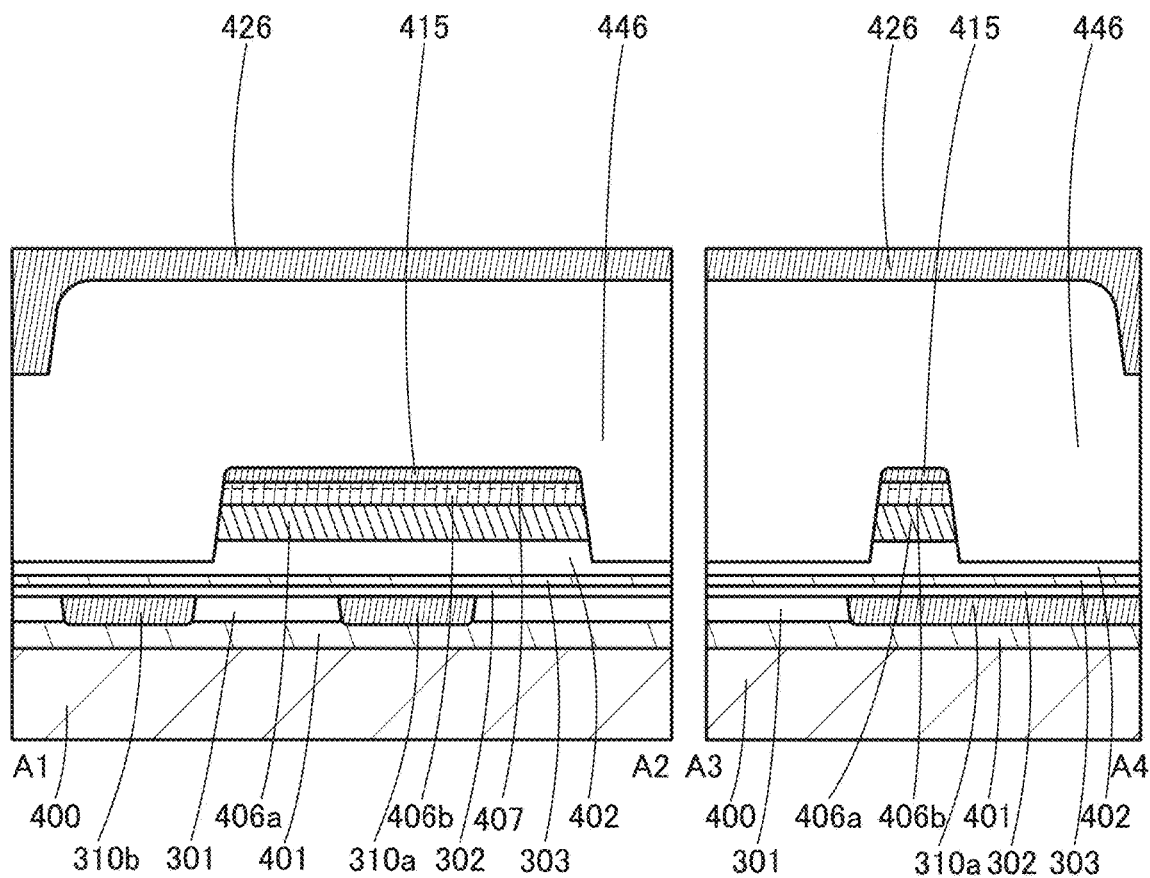

FIG. 26A
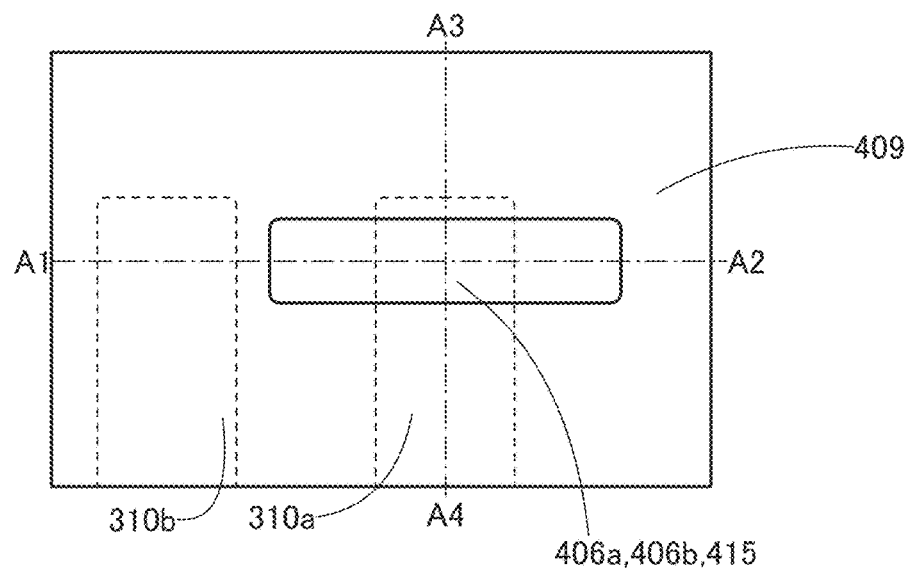
FIG. 26B
FIG. 26C
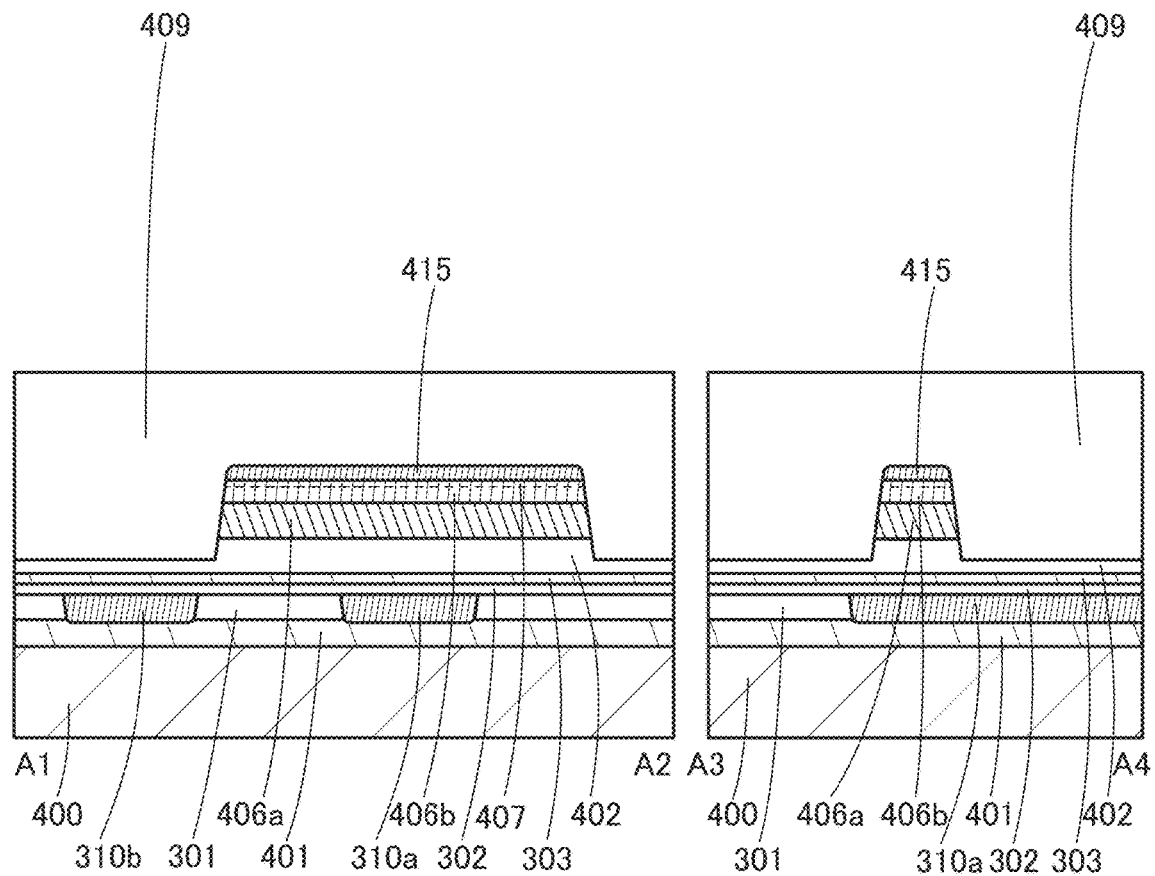

FIG. 28A
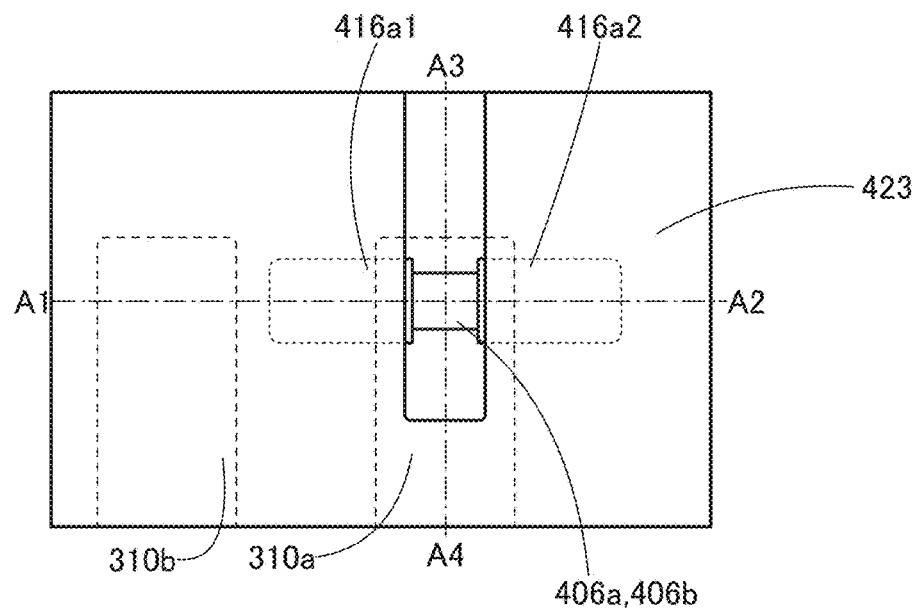
FIG. 28B
FIG. 28C
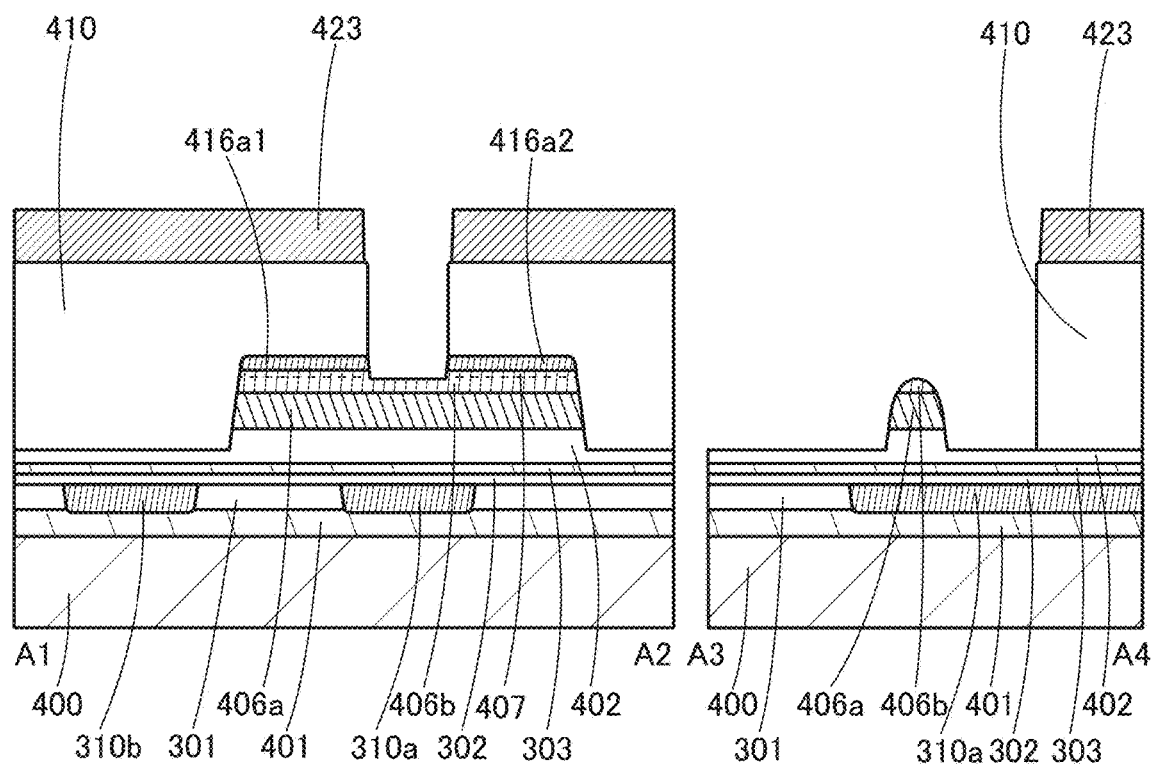

FIG. 29A
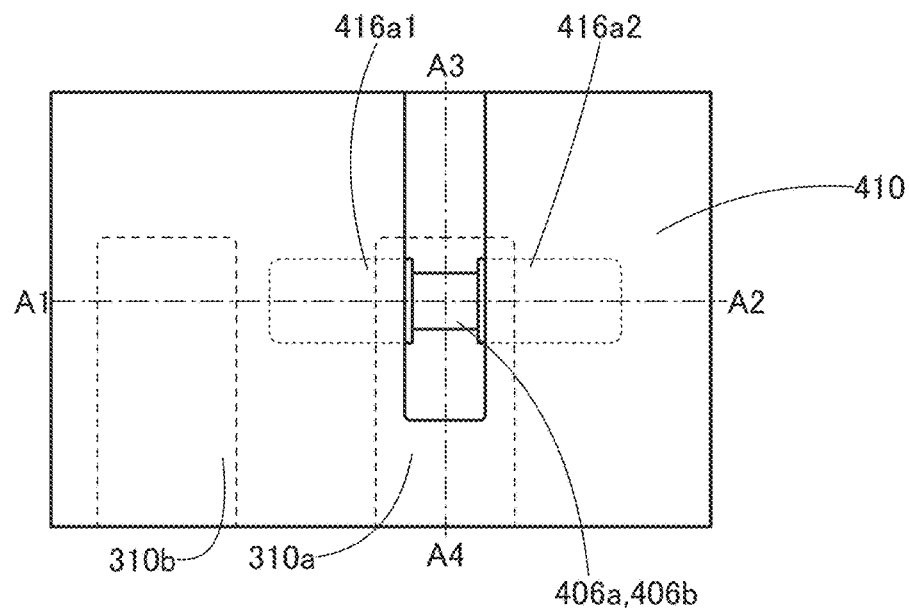
FIG. 29B
FIG. 29C
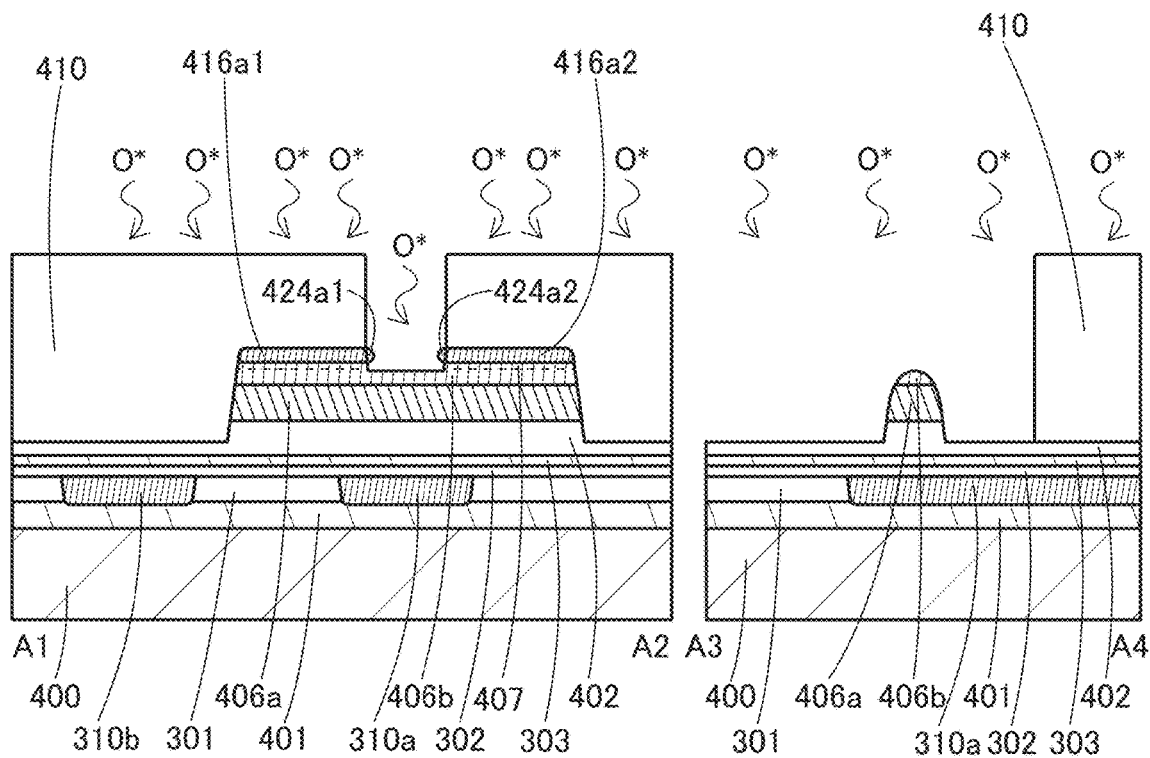

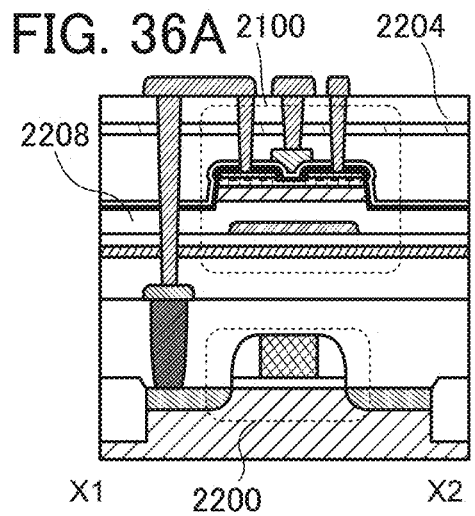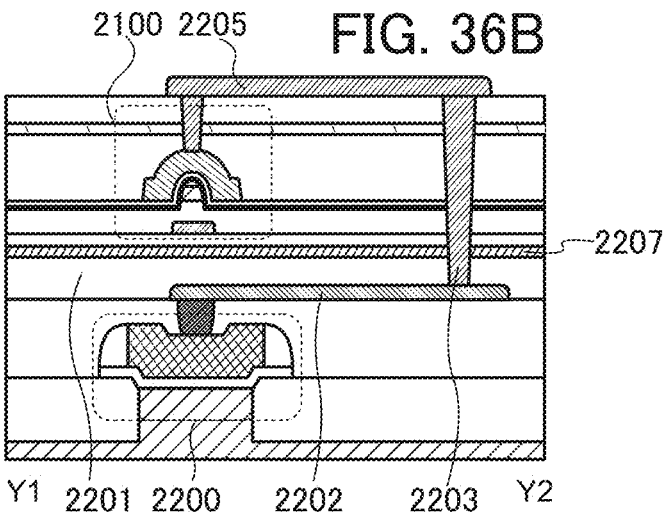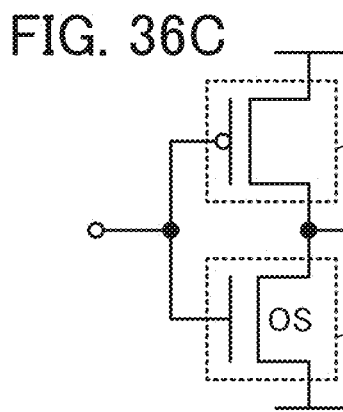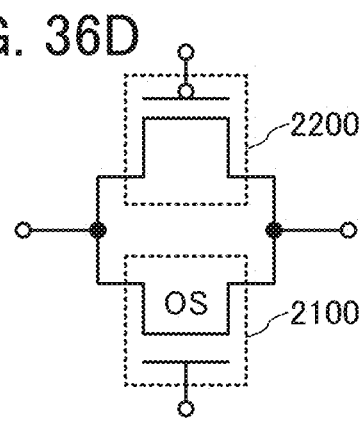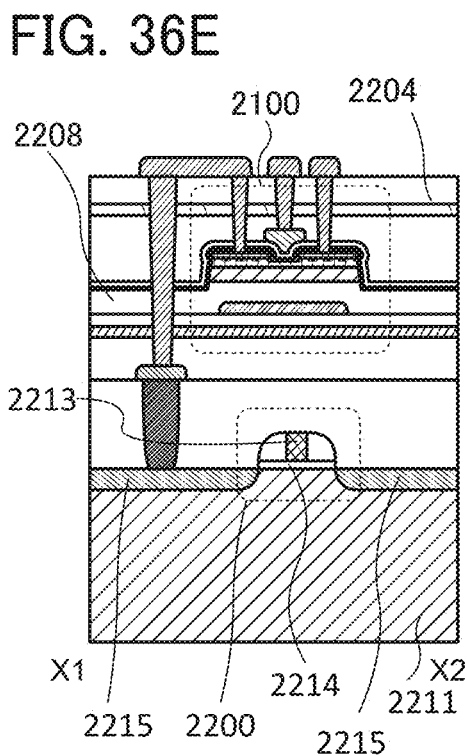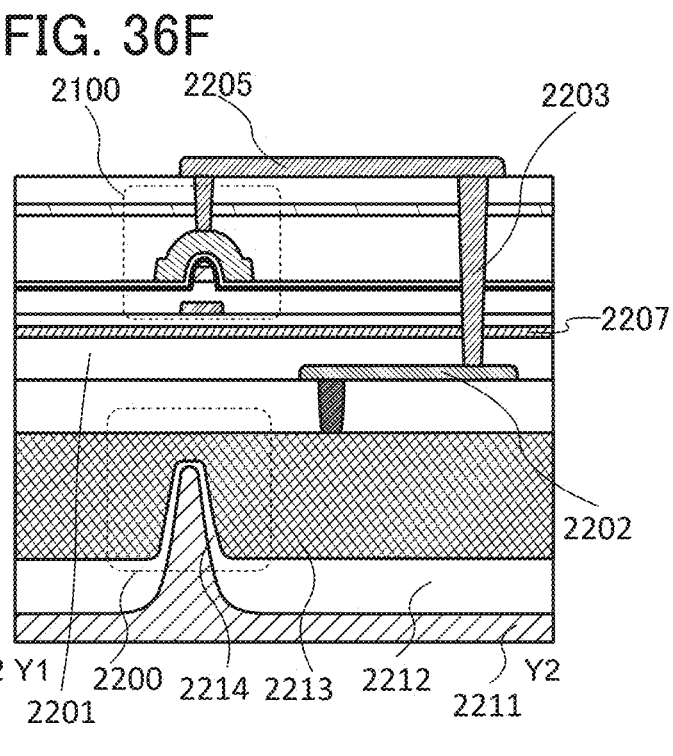

905D

905E

METHOD FOR FORMING CAPACITOR, SEMICONDUCTOR DEVICE, MODULE, AND ELECTRONIC DEVICE

BACKGROUND OF THE INVENTION

1. Field of the Invention

The present invention relates to a transistor and a semiconductor device, and a manufacturing method thereof, for example. The present invention relates to a display device, a light-emitting device, a lighting device, a power storage device, a memory device, a processor, or an electronic device, for example. The present invention relates to a method for manufacturing a display device, a liquid crystal display device, a light-emitting device, a memory device, or an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

In recent years, a transistor including an oxide semiconductor has attracted attention. An oxide semiconductor can be formed by a sputtering method or the like, and thus can be used for a semiconductor of a transistor in a large display device. In addition, there is an advantage in a transistor including an oxide semiconductor that capital investment can be reduced because part of production equipment for a transistor including amorphous silicon can be retrofitted and utilized.

It is known that a transistor including an oxide semiconductor has an extremely low leakage current in an off state. For example, a low-power-consumption CPU utilizing a characteristic of low leakage current of the transistor including an oxide semiconductor is disclosed (see Patent Document 1).

Furthermore, a method for manufacturing a transistor including an oxide semiconductor in which a gate electrode is embedded in an opening is disclosed (see Patent Documents 2 and 3).

REFERENCE

Patent Document

[Patent Document 1] Japanese Published Patent Application No. 2012-257187
[Patent Document 2] Japanese Published Patent Application No. 2014-241407
[Patent Document 3] Japanese Published Patent Application No. 2014-240833

SUMMARY OF THE INVENTION

An object is to provide a miniaturized transistor. Another object is to provide a transistor with low parasitic capacitance. Another object is to provide a transistor with high frequency characteristics. Another object is to provide a transistor with favorable electrical characteristics. Another object is to provide a transistor having stable electrical characteristics. Another object is to provide a transistor having a high current in an on state. Another object is to provide a transistor having low off-state current. Another object is to provide a novel transistor. Another object is to provide a semiconductor device including the transistor. Another object is to provide a semiconductor device which can operate at high speed. Another object is to provide a highly integrated semiconductor device. Another object is to provide a novel semiconductor device. Another object is to provide a module including any of the above semiconductor devices. Another object is to provide an electronic device including any of the above semiconductor devices or the module.

Note that the descriptions of these objects do not disturb the existence of other objects. In one embodiment of the present invention, there is no need to achieve all the objects. Other objects are apparent from and can be derived from the description of the specification, the drawings, and the claims.

(1)

One embodiment of the present invention is a capacitor including a first conductor, a second conductor, and an insulator, where the first conductor includes a region overlapping with the second conductor with the insulator provided therebetween, where the first conductor includes tungsten and silicon, and where the insulator includes a silicon oxide film formed by oxidizing the first conductor.

(2)

One embodiment of the present invention is a capacitor including a first conductor including tungsten and silicon, a second conductor, and an insulator in contact with the first conductor, where the first conductor includes a region overlapping with the second conductor with the insulator provided therebetween, where the second conductor and the insulator have regions in contact with each other, and where the insulator is a silicon oxide film and has a thickness less than or equal to 15 nm.

(3)

One embodiment of the present invention is a semiconductor device including a capacitor and a transistor, where the transistor includes a drain electrode, where the capacitor includes a first electrode and a second electrode, where the first electrode of the capacitor is electrically connected to the drain electrode, and where the capacitor is the capacitor described in (1) or (2).

(4)

One embodiment of the present invention is a module including the capacitor described in (1) or (2), the semiconductor device described in (3), and a printed circuit board.

(5)

One embodiment of the present invention is an electronic device including the capacitor described in (1) or (2), the semiconductor device described in (3), the module described in (4), and a speaker or an operation key.

(6)

One embodiment of the present invention is a method for manufacturing a capacitor including a step of forming a first conductor, a step of performing plasma treatment containing oxygen on the first conductor, so that a silicon oxide film is formed on a surface of the first conductor, and a step of forming a second conductor over the silicon oxide film, where the first conductor includes tungsten and silicon.

(7)

One embodiment of the present invention is the method for manufacturing a capacitor described in (6), where the plasma treatment contains treatment using high-density plasma.

(8)

One embodiment of the present invention is a method for manufacturing a semiconductor device, where the semiconductor device includes a capacitor and a transistor, where the transistor includes a drain electrode, where the capacitor includes a first electrode and a second electrode, where the first electrode of the capacitor is electrically connected to the drain electrode, and where the capacitor is manufactured by the method described in (6) or (7).

(9)

One embodiment of the present invention is a method for manufacturing a module, where the module includes the capacitor that is manufactured by the method described in (6) or (7), the semiconductor device that is manufactured by the method described in (8), and a printed circuit board.

(10)

One embodiment of the present invention is a method for manufacturing an electronic device, where the electronic device includes the capacitor that is manufactured by the method described in (6) or (7), the semiconductor device that is manufactured by the method described in (8), the module that is manufactured by the method described in (9), and a speaker or an operation key.

(11)

One embodiment of the present invention is a method for manufacturing a transistor, including a step of forming a second insulator over a first insulator, a step of forming a semiconductor over the second insulator, a step of forming a first conductor over the semiconductor, a step of etching a part of the first conductor by a first lithography method, a step of etching parts of the first conductor, the semiconductor, and the second insulator by a second lithography method, so that the first conductor is divided into a second conductor and a third conductor, a step of forming a multilayer film including the second conductor, the third conductor, the semiconductor, and the second insulator, a step of performing a plasma treatment containing oxygen on the second conductor and the third conductor, so that a silicon oxide film is formed on a side surface of the second conductor, a top surface of the second conductor, a side surface of the third conductor, and a top surface of the third conductor, a step of forming a third insulator to cover a top surface of the silicon oxide film, a top surface of the first insulator, a side surface of the second insulator, and a side surface of the semiconductor, a step of forming a fourth insulator over the third insulator, and a step of forming a fourth conductor over the fourth insulator, and a step of etching a part of the fourth conductor by a third lithography method, where the first conductor includes tungsten and silicon.

(12)

One embodiment of the present invention is a method for manufacturing the transistor described in (11), where the plasma treatment includes a treatment using high-density plasma.

(13)

One embodiment of the present invention is a method for manufacturing a semiconductor device, where the semiconductor device includes a transistor that is manufactured by the method described in (11) or (12).

(14)

One embodiment of the present invention is a method for manufacturing a module which includes the transistor manufactured by the method described in (11) or (12), the semiconductor device manufactured by the method described in (13), and a printed circuit board.

(15)

One embodiment of the present invention is a method for manufacturing an electronic device which includes the transistor manufactured by the method described in (11) or (12), the semiconductor device manufactured by the method described in (13), the module manufactured by the method described in (14), and a speaker or an operation key.

Note that in the semiconductor device of one embodiment of the present invention, the oxide semiconductor may be replaced with another semiconductor.

A miniaturized transistor can be provided. A transistor with low parasitic capacitance can be provided. A transistor with high frequency characteristics can be provided. A transistor with favorable electrical characteristics can be provided. A transistor having stable electrical characteristics can be provided. A transistor with a large amount of current in an on state can be provided. A transistor with a small amount of current in an off state can be provided. A novel transistor can be provided. A semiconductor device including the transistor can be provided. A semiconductor device which can operate at high speed can be provided. A highly integrated semiconductor device can be provided. A novel semiconductor device can be provided. A module including the semiconductor device can be provided. An electronic device including the semiconductor device or the module can be provided.

Note that the description of these effects does not disturb the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIGS. 17A to 17C are a top view and cross-sectional views illustrating a method for manufacturing a transistor of one embodiment of the present invention.

FIGS. 18A to 18C are a top view and cross-sectional views illustrating a method for manufacturing a transistor of one embodiment of the present invention.

FIGS. 19A to 19C are a top view and cross-sectional views illustrating a method for manufacturing a transistor of one embodiment of the present invention.

FIGS. 20A to 20C are a top view and cross-sectional views illustrating a method for manufacturing a transistor of one embodiment of the present invention.

FIGS. 21A to 21C are a top view and cross-sectional views illustrating a method for manufacturing a transistor of one embodiment of the present invention.

FIGS. 25A to 25C are a top view and cross-sectional views illustrating a method for manufacturing a transistor of one embodiment of the present invention.

FIGS. 26A to 26C are a top view and cross-sectional views illustrating a method for manufacturing a transistor of one embodiment of the present invention.

FIGS. 28A to 28C are a top view and cross-sectional views illustrating a method for manufacturing a transistor of one embodiment of the present invention.

FIGS. 29A to 29C are a top view and cross-sectional views illustrating a method for manufacturing a transistor of one embodiment of the present invention.

FIGS. 36A to 36F are circuit diagrams and cross-sectional views illustrating a semiconductor device of one embodiment of the present invention.

DETAILED DESCRIPTION OF THE INVENTION

Figure 1:
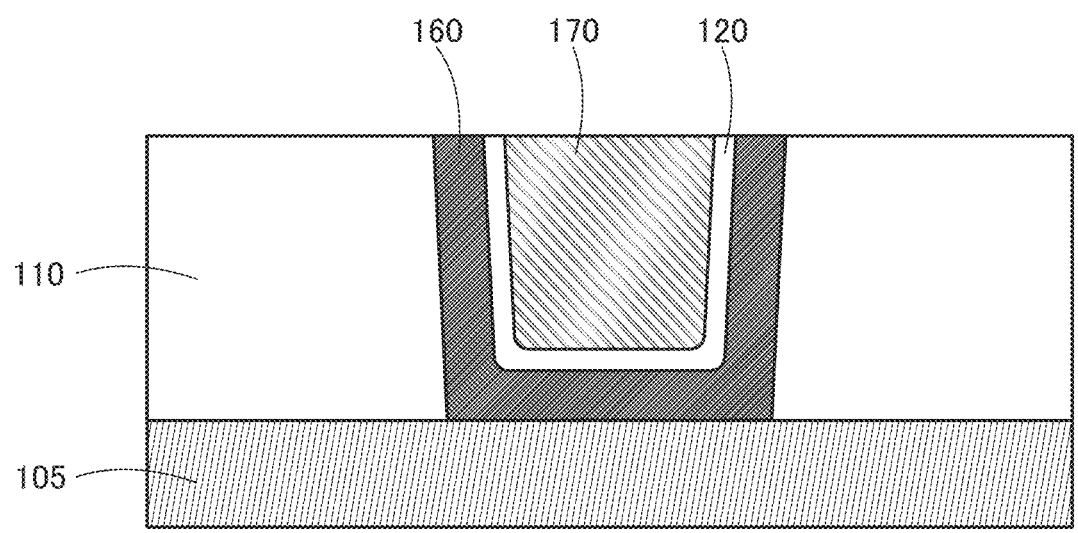
FIG. 1 is a cross-sectional view of a capacitor of one embodiment of the present invention.
Figure 2A:
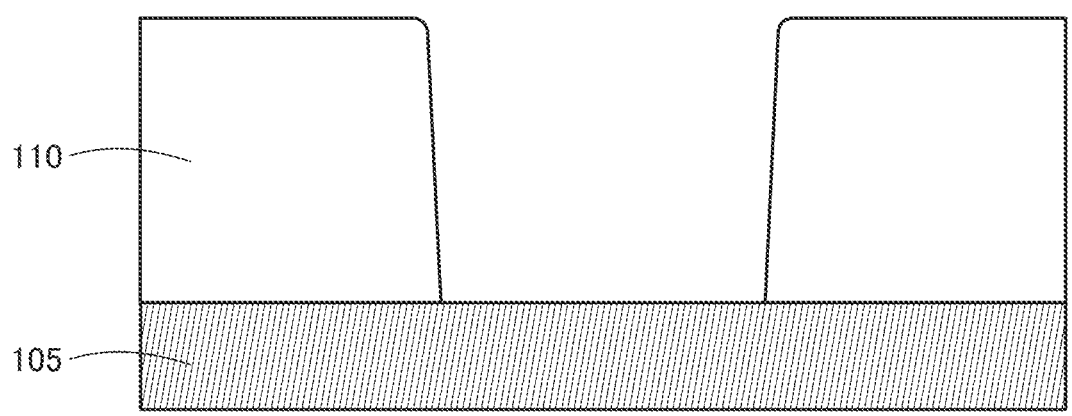
FIGS. 2A and 2B are cross-sectional views illustrating a method for manufacturing of a capacitor of one embodiment of the present invention.
Figure 2B:
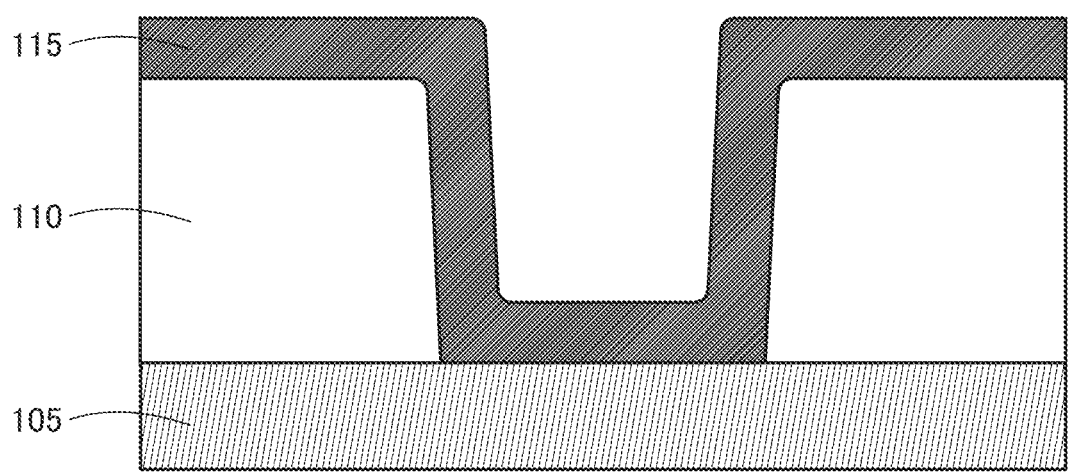
Figure 3A:
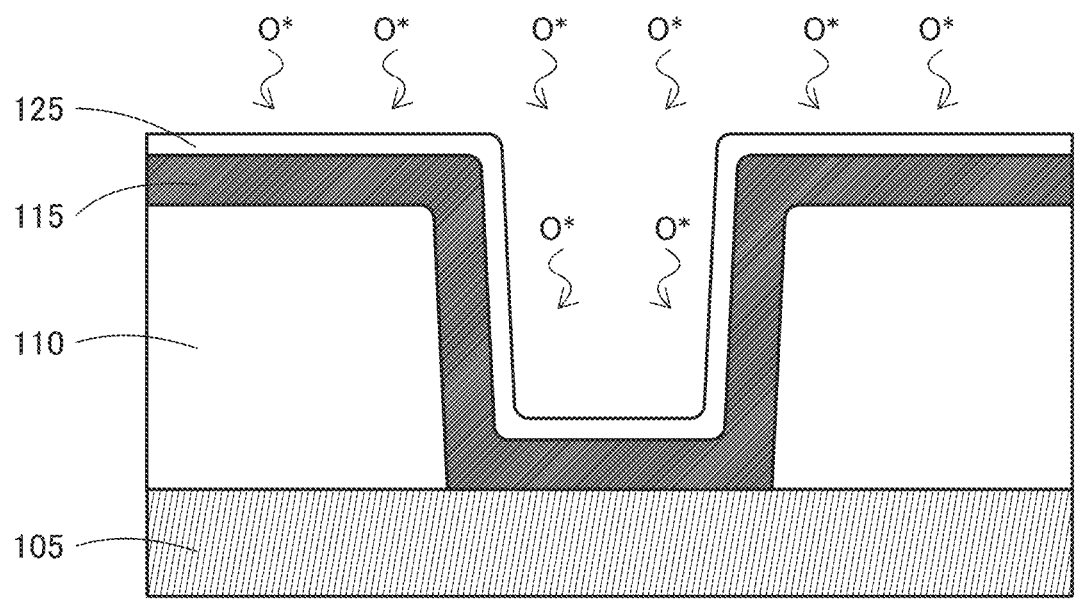
FIGS. 3A and 3B are cross-sectional views illustrating a method for manufacturing of a capacitor of one embodiment of the present invention.
Figure 3B:
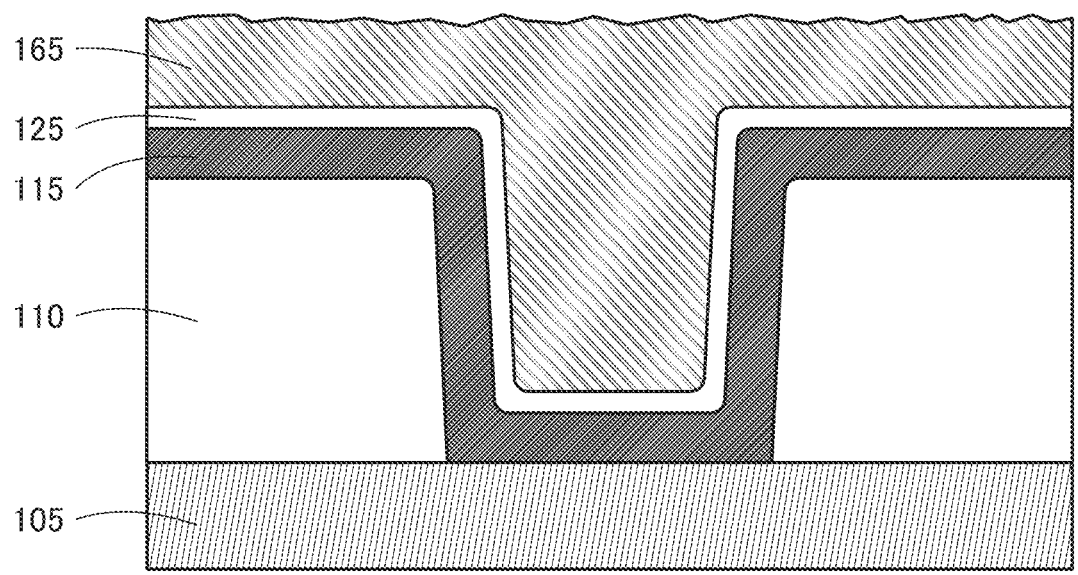

Embodiments according to the present invention will be described in detail with reference to the accompanying drawings. Note that the present invention is not limited to the description below, and it is easily understood by those skilled in the art that modes and details of the present invention can be modified in various ways. Accordingly, the present invention should not be interpreted as being limited to the content of the embodiments below. In describing structures of the invention with reference to the drawings, the same reference numerals are used in common for the same portions in different drawings. Note that the same hatch pattern is applied to similar parts, and the similar parts are not especially denoted by reference numerals in some cases. In the case where the description of a component denoted by a different reference numeral is referred to, the description of the thickness, composition, structure, shape, or the like of the component can be used as appropriate.

Note that the size, the thickness of films (layers), or regions in drawings is sometimes exaggerated for simplicity. In this specification, the terms "film" and "layer" can be interchanged with each other.

In this specification, for example, for describing the shape of an object, the length of one side of a minimal cube where the object fits, or an equivalent circle diameter of a cross section of the object can be interpreted as the "diameter", "grain size (diameter)", "dimension", "size", or "width" of the object. The term "equivalent circle diameter of a cross section of the object" refers to the diameter of a perfect circle having the same area as the cross section of the object.

A voltage usually refers to a potential difference between a given potential and a reference potential (e.g., a source potential or a ground potential (GND)). Thus, a voltage can be referred to as a potential and vice versa. In general, a potential (a voltage) is relative and is determined depending on the amount relative to a reference potential. Therefore, a potential which is represented as a "ground potential" or the like is not always 0 V. For example, the lowest potential in a circuit may be represented as a "ground potential". Alternatively, a substantially intermediate potential in a circuit may be represented as a "ground potential". In these cases, a positive potential and a negative potential are set using the potential as a reference.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that an impurity in a semiconductor refers to, for example, elements other than the main components of a semiconductor. For example, an element with a concentration lower than 0.1 atomic % is an impurity. When an impurity is contained, the density of states (DOS) may be formed in a semiconductor, the carrier mobility may be decreased, or the crystallinity may be decreased, for example. When the semiconductor is an oxide semiconductor, examples of an impurity which changes the characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, in the case where the semiconductor is a silicon film, examples of an impurity which changes characteristics of the semiconductor include oxygen, Group 1 elements except hydrogen, Group 2 elements, Group 13 elements, and Group 15 elements. Note that as well as the impurity, a main component element that is excessively contained might cause DOS. In that case, DOS can be lowered in some cases by a slight amount of an additive (e.g., greater than or equal to 0.001 atomic % and less than 3 atomic %). The above-described element that might serve as an impurity can be used as the additive.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of the transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view," for example, in the top view.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The terms "perpendicular" indicates that the angle formed between two straight lines is greater than or equal to 800 and less than or equal to 100°. Accordingly, the terms "perpendicular" includes the case where the angle formed between two straight lines is greater than or equal to 850 and less than or equal to 95°. In addition, the term "substantially perpendicular" indicates that the angle formed between two straight lines is greater than or equal to 600 and less than or equal to 120°.

In this specification, trigonal and rhombohedral crystal systems are included in a hexagonal crystal system.

In this specification, the term "semiconductor" can be replaced with any term for various semiconductors in some cases. For example, the term "semiconductor" can be replaced with the term for a Group 14 semiconductor such as silicon or germanium; an oxide semiconductor; a compound semiconductor such as silicon carbide, germanium silicide, gallium arsenide, indium phosphide, zinc selenide, or cadmium sulfide; or an organic semiconductor.

Here, an example of an etching method of part of a component with use of a lithography method in the manufacture of a semiconductor device of one embodiment of the present invention is described. First, a layer of a photosensitive organic or inorganic substance is formed over the component by a spin coating method or the like. Then, the layer of a photosensitive organic or inorganic substance is irradiated with light through a photomask. As the light, KrF excimer laser light, ArF excimer laser light, extreme ultraviolet (EUV) light, or the like may be used. Alternatively, a liquid immersion technique may be employed in which a portion between a substrate and a projection lens is filled with liquid (e.g., water) to perform light exposure. The layer of a photosensitive organic or inorganic substance may be irradiated with an electron beam or an ion beam instead of the above light. Note that a photomask is not necessary in the case of using an electron beam or an ion beam. After that, a region of the layer of the photosensitive organic or inorganic substance that has been exposed to light is removed or left with use of a developer, so that an etching mask including a resist is formed.

Note that a bottom anti-reflective coating (BARC) may be formed under the etching mask. In the case where the BARC is used, first, the BARC is etched using the etching mask. Next, the component is etched using the etching mask and the BARC. Note that an organic or inorganic substance which does not function as an anti-reflective layer may be used instead of the BARC. For the etching of the component, a plasma etching apparatus can be used.

After the etching of the component, the etching mask or the like is removed. For the removal of the etching mask or the like, plasma treatment and/or wet etching are/is used. Note that as the plasma treatment, plasma ashing is preferable. In the case where the removal of the etching mask or the like is not enough, the remaining etching mask or the like may be removed using ozone water and/or hydrofluoric acid at a concentration higher than or equal to 0.001 volume % and lower than or equal to 1 volume %, and the like.

As an apparatus used for plasma treatment and plasma etching, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. Examples of dry etching apparatus including a high-density plasma source include an inductively coupled plasma (ICP) etching apparatus, an electron cyclotron resonance (ECR) plasma etching apparatus, a helicon wave plasma (HWP) etching apparatus, a surface wave plasma (SWP) etching apparatus, and a magnetron plasma etching apparatus.

In this specification, the conductors, the insulators, and the semiconductors can be deposited by a sputtering method, a chemical vapor deposition (CVD) method, a molecular beam epitaxy (MBE) method, a pulsed laser deposition (PLD) method, an atomic layer deposition (ALD) method, a thermal oxidation method, a plasma oxidation method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

Embodiment 1

In this embodiment, a structure and a fabricating method of a capacitor of one embodiment of the present invention will be described.

FIG. 1 is a cross-sectional view of a capacitor of one embodiment of the present invention. The capacitor includes a conductor 105, an insulator 110 that is over the conductor 105 and has an opening reaching a top surface of the conductor 105, a conductor 160 in contact with a side surface of the insulator 110 and the conductor 105 in the opening, an insulator 120 over the conductor 160, and a conductor 170 having a region overlapping with the conductor 160 with the insulator 120 provided therebetween. In addition, the conductor 105 and the conductor 160 are electrically connected.

The conductor 105 has a function of one of electrodes of the capacitor, and the conductor 170 has a function of the other electrode. The insulator 120 has a function of a dielectric of the capacitor.

Each of the conductor 105 and the conductor 170 may be formed to have a single-layer structure or a layered structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, a film of an alloy or a compound containing the above element may be used: a conductor containing aluminum, a conductor containing copper and titanium, a conductor containing copper and manganese, a conductor containing indium, tin, and oxygen, a conductor containing titanium and nitrogen, or the like may be used.

The conductor 160 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used: a conductor containing aluminum, a conductor containing copper and titanium, a conductor containing copper and manganese, a conductor containing indium, tin, and oxygen, a conductor containing titanium and nitrogen, a conductor containing tungsten and silicon, or the like may be used.

As the insulator 120, an oxide film formed by oxidizing the conductor 160 may be used. The oxide film is formed by thermal oxidization method or a plasma oxidation method and does not include a film formed by other oxidation methods or natural oxidation. Furthermore, for example, the insulator 120 may be formed to be a multilayer film using a plurality of insulators that are selected as appropriate from metal oxides such as aluminum oxide, magnesium oxide, gallium oxide, germanium oxide, yttrium oxide, zirconium oxide, lanthanum oxide, neodymium oxide, hafnium oxide, and tantalum oxide; silicon nitride oxide; and silicon nitride.

The insulator 110 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon oxide, silicon oxynitride; silicon nitride oxide; or silicon nitride.

The method for manufacturing a capacitor in FIG. 1 of one embodiment of the present invention will be described with reference to FIGS. 2A and 2B to FIGS. 3A and 3B.

First, the conductor 105 is formed. The conductor 105 is deposited not only over a substrate but also over an insulating layer or a semiconductor device.

Next, over the conductor 105, an insulator that is to be the insulator 110 is formed. Then, the insulator that is to be the insulator 110 is processed by a lithography method, so that the insulator 110 having an opening that reaches a top surface of the conductor 105 is formed (see FIG. 2A).

Next, a conductor 115 is formed over the insulator 110 and in the opening. The conductor 115 may be formed using a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used: a conductor containing aluminum, a conductor containing copper and titanium, a conductor containing copper and manganese, a conductor containing indium, tin, and oxygen, a conductor containing titanium and nitrogen, a conductor containing tungsten and silicon, or the like may be used (see FIG. 2B).

Next, the conductor 115 is oxidized to form an insulator 125 on a surface of the conductor 115. As an oxidation method, a thermal oxidation method or plasma treatment containing oxygen may be employed. The oxidation by high-density plasma treatment containing oxygen is further preferable. For example, in the case where the conductor 115 is a conductor containing tungsten and silicon, a silicon oxide film can be formed by high-density plasma treatment containing oxygen performed on the conductor 115.

The insulator 125 can be formed to have a uniform thickness on the conductor 115 because the insulator 125 is formed by oxidation of a surface of the conductor 115. This is preferable because a variation in capacitance of capacitor can be reduced (see FIG. 3A).

The insulator 125 can have a multilayer film including two or more layers by depositing an insulator on the insulator 125. The multilayer film is preferable because it enables the amount of leakage current flowing between electrodes of the capacitor to be reduced and also enables a property of withstanding voltage between electrodes of the capacitor to be improved.

Next, a conductor 165 is formed. The conductor 165 is deposited so that the opening in the insulator 110 is filled. Therefore, a CVD method (an MCVD method, in particular) is preferred. A multilayer film of a conductor deposited by an ALD method or the like and a conductor deposited by a MCVD method is preferred in some cases to increase adhesion of the conductor deposited by an MCVD method and the insulator. For example, a multilayer film in which titanium nitride or tantalum nitride and tungsten are deposited in this order or the like can be used (see FIG. 3B).

Next, chemical mechanical polishing (CMP) treatment is performed on the conductor 165, the insulator 125, and the conductor 115 until the top surface of the insulator 110 is exposed. By the treatment, the conductor 160, the insulator 120, and the conductor 170 are embedded in the opening of the insulator 110. Accordingly, the capacitor in which one of electrodes is the conductor 105, the other electrode is the conductor 170, and a dielectric is the insulator 120 can be fabricated (see FIG. 1).

Embodiment 2

<Transistor Structure 1>

A structure of a transistor included in a semiconductor device of embodiments of the present invention will be described below.

Figure 4A:
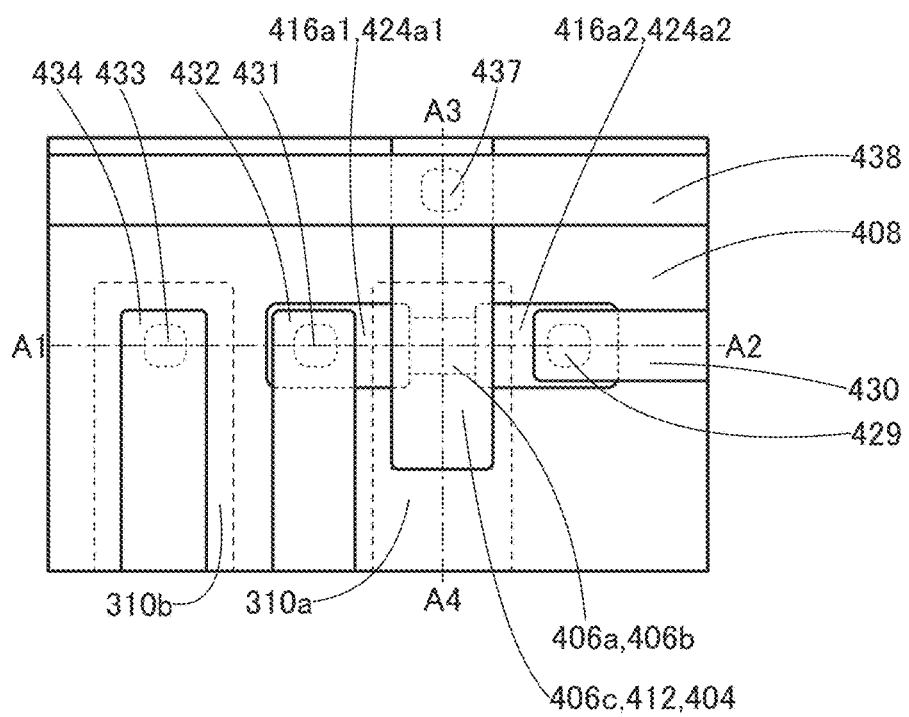
FIGS. 4A to 4C are a top view and cross-sectional views illustrating a transistor of one embodiment of the present invention.
Figure 4B:
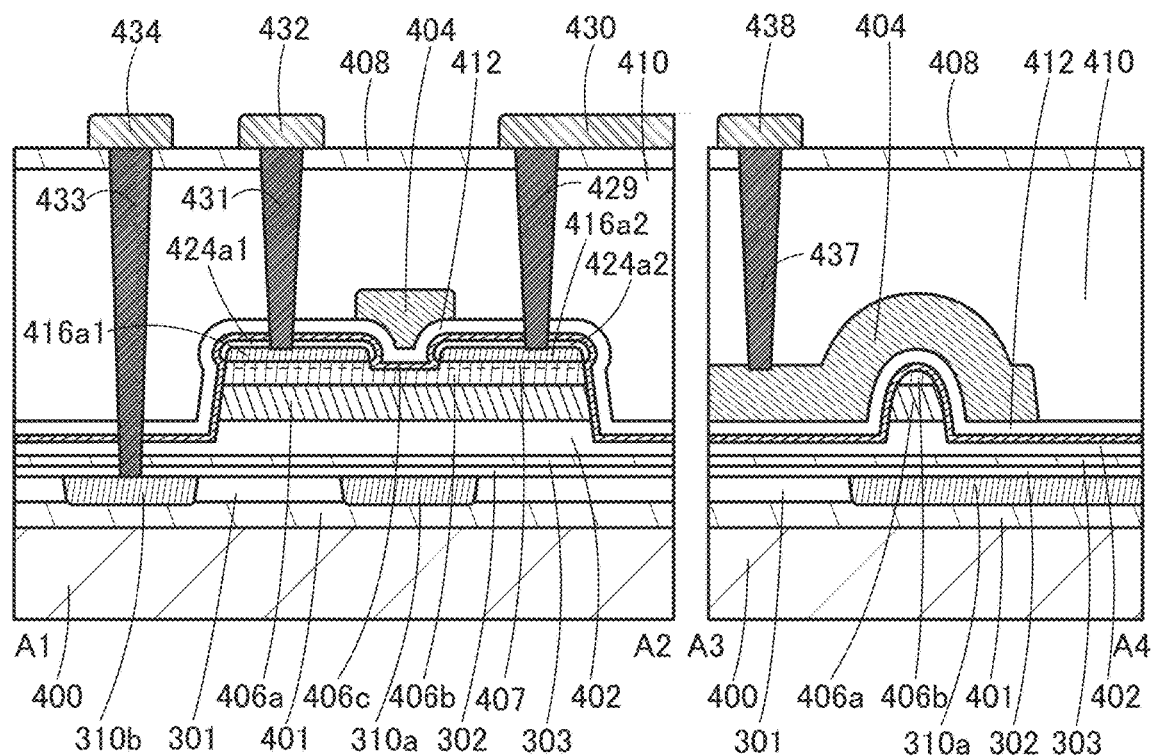
Figure 4C:
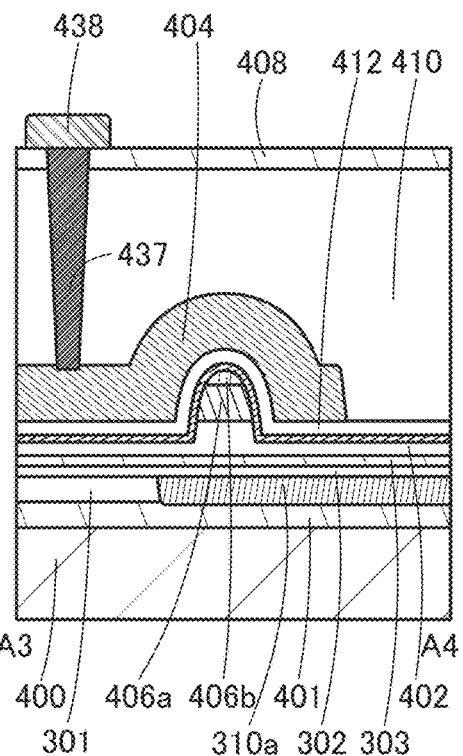

FIGS. 4A to 4C are a top view and cross-sectional views of a semiconductor device of one embodiment of the present invention. FIG. 4A is the top view. FIG. 4B is a cross-sectional view taken along dashed-dotted line A1-A2 in FIG. 4A. FIG. 4C is a cross-sectional view taken along dashed-dotted line A3-A4 illustrated in FIG. 4A. Note that for simplification of the drawing, some components in the top view in FIG. 4A are not illustrated.

As illustrated in FIGS. 4B and 4C, the transistor includes an insulator 401 over a substrate 400 and an insulator 301 over the insulator 401. The insulator 301 has openings, and a conductor 310a and a conductor 310b are provided in the openings. In addition, the transistor includes the following components: an insulator 302 over the insulator 301, the conductor 310a, and the conductor 310b; an insulator 303 over the insulator 302; an insulator 402 over the insulator 303; an insulator 406a over the insulator 402; a semiconductor 406b over the insulator 406a; a conductor 416a1 and a conductor 416a2 each having a region in contact with a top surface of the semiconductor 406b; an insulator 424a1 covering a side surface and a top surface of the conductor 416a1; an insulator 424a2 covering a side surface and a top surface of the conductor 416a2; an insulator 406c that is over the insulator 402 and in contact with a side surface of the insulator 406a, a side surface of the semiconductor 406b, a top surface of the semiconductor 406b, a side surface of the insulator 424a1, a top surface of the insulator 424a1, a side surface of the insulator 424a2, and a top surface of the insulator 424a2; an insulator 412 over the insulator 406c; a conductor 404 overlapping with the semiconductor 406b with the insulator 412 and the insulator 406c provided therebetween, an insulator 410 over the insulator 412 and the conductor 404; an insulator 408 over the insulator 410; a first opening that reaches the conductor 310b through the insulator 408, the insulator 410, the insulator 412, the insulator 406c, the insulator 402, the insulator 303, and the insulator 302; a second opening that reaches the conductor 416a1 through the insulator 408, the insulator 410, the insulator 412, the insulator 406c, and the insulator 424a1; a third opening that reaches the conductor 416a2 through the insulator 408, the insulator 410, the insulator 412, the insulator 406c, and the insulator 424a2; and a fourth opening that reaches the conductor 404 through the insulator 408 and the insulator 410. A conductor 433 is embedded in the first opening, a conductor 431 is embedded in the second opening, a conductor 429 is embedded in the third opening, and a conductor 437 is embedded in the fourth opening. Moreover, a conductor 434 having a region in contact with the conductor 433 is provided over the insulator 408. A conductor 432 having a region in contact with the conductor 431 is provided over the insulator 408. A conductor 430 having a region in contact with the conductor 429 is provided over the insulator 408. A conductor 438 having a region in contact with the conductor 437 is provided over the insulator 408.

Note that the semiconductor 406b includes a region 407 in which the top surface of the semiconductor 406b is in contact with the conductors 416a1 and 416a2.

In the transistor, the conductor 404 functions as a first gate electrode. Furthermore, the conductor 404 can have a stacked structure including a conductor that has a function of inhibiting penetration of oxygen. For example, when the conductor that has a function of inhibiting penetration of oxygen is formed as a lower layer, an increase in the electric resistance value due to oxidation of the conductor 404 can be prevented. The insulator 412 serves as a gate insulator. Note that the electric resistance values of the conductors can be measured by a two-terminal method or the like.

The resistance of the semiconductor 406b can be controlled by a potential applied to the conductor 404. That is, conduction or non-conduction between the conductor 416a1 and the conductor 416a2 can be controlled by the potential applied to the conductor 404.

The conductors 416a1 and 416a2 function as a source electrode and a drain electrode. The side surface and the top surface of the conductor 416a1 is covered with the insulator 424a1. The side surface and the top surface of the conductor 416a2 is covered with the insulator 424a2. The conductor 416a1 and the conductor 404 partly overlaps with each other with the insulator 412, the insulator 406c, and the insulator 424a1 interposed therebetween. The conductor 416a2 and the conductor 404 partly overlaps with each other with the insulator 412, the insulator 406c, and the insulator 424a2 interposed therebetween. Thus, in this transistor structure, the parasitic capacitance between the conductor 416a1 and the conductor 404 and the parasitic capacitance between the conductor 416a2 and the conductor 404 can be reduced. The transistor can be a transistor with high frequency characteristics, i.e., a transistor suitable for high-speed operation.

As illustrated in FIGS. 4B and 4C, the top surface of the semiconductor 406b is in contact with the conductors 416a1 and 416a2. In addition, the semiconductor 406b can be electrically surrounded by an electric field of the conductor 404 serving as the first gate electrode. A structure in which a semiconductor is electrically surrounded by an electric field of a gate electrode is referred to as a surrounded channel (s-channel) structure. Therefore, a channel is formed in the entire semiconductor 406b in some cases. In the s-channel structure, a large amount of current can flow between a source and a drain of the transistor, so that an on-state current can be increased. In addition, since the semiconductor 406b is surrounded by the electric field of the conductor 404, an off-state current can be decreased.

The conductor 310a functions as a second gate electrode. Furthermore, the conductor 310a can have a stacked structure including a conductor that has a function of inhibiting penetration of oxygen. For example, when the conductor that has a function of inhibiting penetration of oxygen is formed as a lower layer, a decrease in the conductivity due to oxidation of the conductor 310a can be prevented. The insulators 302, 303, and 402 serve as a gate insulating film. The threshold voltage of the transistor can be controlled by a potential applied to the conductor 310a. In addition, the threshold voltage of the transistor can be controlled by applying potentials to the conductor 310a so that electrons are injected to the insulator 303. The first gate electrode and the second gate electrode are electrically connected to each other, whereby a high on-state current can be obtained. Note that the function of the first gate electrode and that of the second gate electrode may be interchanged.

Figure 6A:
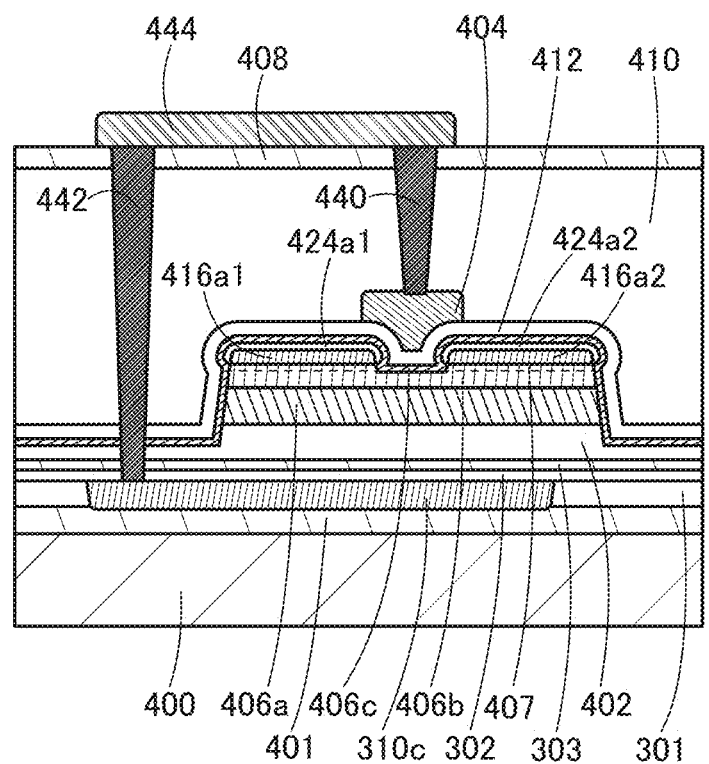
FIGS. 6A and 6B are cross-sectional views each illustrating a transistor of one embodiment of the present invention.

FIG. 6A illustrates an example in which the first gate electrode and the second gate electrode are electrically connected. In an opening reaching the conductor 404 through the insulators 408 and 410, a conductor 440 is embedded, and a top surface of the conductor 440 is electrically connected to a conductor 444 formed over the insulator 408. In an opening reaching a conductor 310c through the insulators 410, 408, 412, 406c, 402, 303, and 302, a conductor 442 is embedded, and a top surface of the conductor 442 is electrically connected to the conductor 444. That is, the conductor 404 functioning as the first gate electrode is electrically connected to the conductor 310c functioning as the second gate electrode through the conductors 440, 444, and 442.

Note that the transistor is surrounded by an insulator which has a function of blocking oxygen and impurities such as hydrogen, whereby stable electrical characteristics can be obtained. For example, as the insulator 408, an insulator which has a function of blocking oxygen and impurities such as hydrogen may be used.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulator 408 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulator 408 preferably contains aluminum oxide. For example, when the insulator 408 is formed using plasma including oxygen, oxygen can be added to the insulator 412 serving as a base layer of the insulator 408. The added oxygen becomes excess oxygen in the insulator 412. When the insulator 408 contains aluminum oxide, entry of impurities such as hydrogen into the semiconductor 406b can be inhibited. Furthermore, when the insulator 408 contains aluminum oxide, for example, outward diffusion of excess oxygen added to the insulator 412 described above can be reduced.

The insulator 401 may be formed using, for example, aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 401 preferably includes aluminum oxide or silicon nitride. For example, when the insulator 401 includes aluminum oxide or silicon nitride, entry of impurities such as hydrogen into the semiconductor 406b can be inhibited. Furthermore, when the insulator 401 includes aluminum oxide or silicon nitride, for example, outward diffusion of oxygen can be reduced.

The insulator 301 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 301 preferably includes silicon oxide or silicon oxynitride.

The insulator 303 may be formed to have, for example, a single-layer structure or a stacked-layer structure including an insulator or a metal oxide film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 303 preferably contains silicon nitride, hafnium oxide, or aluminum oxide.

The insulators 302 and 402 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 402 preferably contains silicon oxide or silicon oxynitride.

Note that the insulator 410 preferably includes an insulator with low relative dielectric constant. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

The insulator 412 may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 412 preferably contain silicon oxide or silicon oxynitride.

Note that the insulator 412 preferably contains an insulator with a high dielectric constant. For example, the insulator 412 preferably includes gallium oxide, hafnium oxide, oxide including aluminum and hafnium, oxynitride including aluminum and hafnium, oxide including silicon and hafnium, oxynitride including silicon and hafnium, or the like. The insulator 412 preferably has a stacked-layer structure including silicon oxide or silicon oxynitride and an insulator with a high dielectric constant. Because silicon oxide and silicon oxynitride have thermal stability, combination of silicon oxide or silicon oxynitride with an insulator with a high dielectric constant allows the stacked-layer structure to be thermally stable and have a high dielectric constant. For example, when an aluminum oxide, a gallium oxide, or a hafnium oxide of the insulator 412 is on the insulator 406c side, entry of silicon included in the silicon oxide or the silicon oxynitride into the semiconductor 406b can be suppressed. Alternatively, when the silicon oxide or the silicon oxynitride is on the insulator 406c side, a trap center may be formed at an interface between the aluminum oxide, the gallium oxide, or the hafnium oxide, and the silicon oxide or the silicon oxynitride in some cases. The trap centers can shift the threshold voltage of the transistor in the positive direction by trapping electrons in some cases.

The insulator 424a1 and the insulator 424a2 may be formed using an insulator that is obtained by oxidizing the conductor 416a1 and the conductor 416a2. Furthermore, for example, such an insulator may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon oxide; silicon nitride oxide; or silicon nitride.

Each of the conductors 416a1 and 416a2 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, platinum, silver, indium, tin, tantalum, and tungsten. For example, an alloy film or a compound film may be used: a conductor containing aluminum, a conductor containing copper and titanium, a conductor containing copper and manganese, a conductor containing indium, tin, and oxygen, a conductor containing titanium and nitrogen, conductor containing tungsten or silicon, or the like may be used.

Each of the conductors 310a, 310b, 310c, 404, 429, 430, 431, 432, 433, 434, 437, 438, 440, 442, and 444 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. Alternatively, a film of an alloy or a compound containing the above element may be used: a conductor containing aluminum, a conductor containing copper and titanium, a conductor containing copper and manganese, a conductor containing indium, tin, and oxygen, a conductor containing titanium and nitrogen, or the like may be used.

An oxide semiconductor is preferably used as the semiconductor 406b. However, silicon (including strained silicon), germanium, silicon germanium, silicon carbide, gallium arsenide, aluminum gallium arsenide, indium phosphide, gallium nitride, an organic semiconductor, or the like can be used in some cases.

As the insulator 406a and the insulator 406c, oxides containing one or more elements other than oxygen included in the semiconductor 406b are preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

<Transistor Structure 2>

Figure 5A:
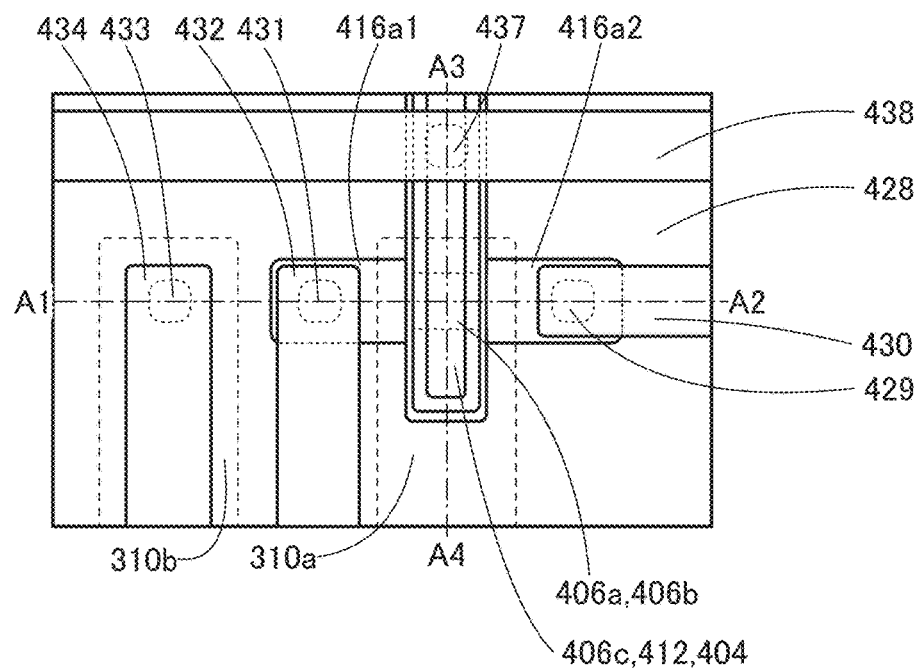
FIGS. 5A to 5C are a top view and cross-sectional views illustrating a transistor of one embodiment of the present invention.
Figures 5B, 5C:
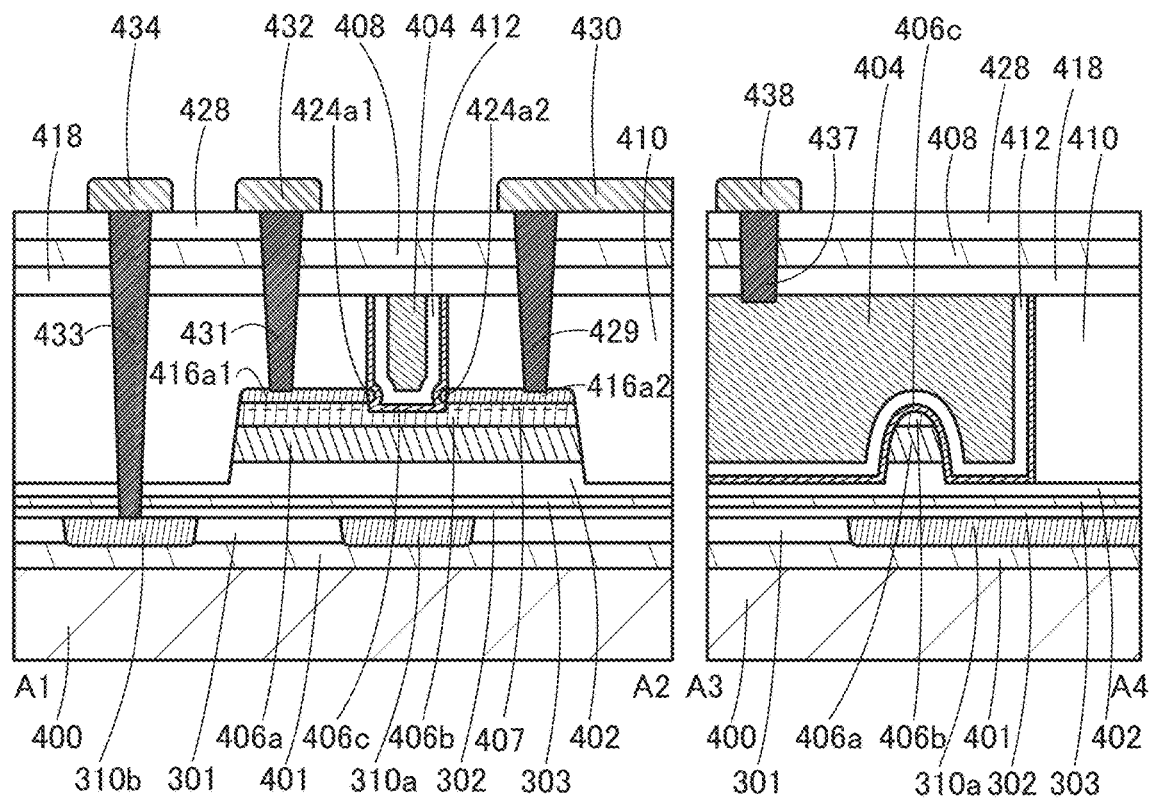

A transistor having a structure different from that in FIGS. 4A to 4C will be described with reference to FIGS. 5A to 5C. FIGS. 5A to 5C are a top view and cross-sectional views of the semiconductor device of one embodiment of the present invention. FIG. 5A is a top view. FIG. 5B is a cross-sectional view taken along dashed-dotted line A1-A2 in FIG. 5A. FIG. 5C is a cross-sectional view taken along dashed-dotted line A3-A4 illustrated in FIG. 5A. Note that for simplification of the drawing, some components are not illustrated in the top view of FIG. 5A.

As illustrated in FIGS. 5B and 5C, the transistor includes the insulator 401 over the substrate 400 and the insulator 301 over the insulator 401. The insulator 301 has an opening, and in the opening, the conductor 310a and the conductor 310b are provided. Furthermore, the transistor includes the following components: the insulator 302 over the insulator 301, the conductor 310a, and the conductor 310b; the insulator 303 over the insulator 302; the insulator 402 over the insulator 303; the insulator 406a over the insulator 402; the semiconductor 406b over the insulator 406a; the conductor 416a1 and the conductor 416a2 each having a region in contact with a top surface of the semiconductor 406b; the insulator 424a1 in a region that is on the side surface of the conductor 416a1 and in contact with the insulator 406c; the insulator 424a2 in a region that is on the side surface of the conductor 416a2 and in contact with the insulator 406c; the insulator 410 in contact with a top surface of the conductor 416a1 and a top surface of the conductor 416a2; the insulator 406c in contact with a top surface of the semiconductor 406b; the insulator 412 over the insulator 406c; the conductor 404 provided over the semiconductor 406b with the insulator 412 and the insulator 406c interposed therebetween; an insulator 418 over the insulator 410, the conductor 404, the insulator 412, and the insulator 406c; the insulator 408 over the insulator 418; an insulator 428 over the insulator 408; a first opening that reaches the conductor 310b through the insulator 428, the insulator 408, the insulator 418, the insulator 410, the insulator 402, the insulator 303, and the insulator 302; a second opening that reaches the conductor 416a1 through the insulator 428, the insulator 408, the insulator 418, and the insulator 410; a third opening that reaches the conductor 416a2 through the insulator 428, the insulator 408, the insulator 418, and the insulator 410; and a fourth opening that reaches the conductor 404 through the insulator 428, the insulator 408, and the insulator 418. The conductor 433 is embedded in the first opening, the conductor 431 is embedded in the second opening, the conductor 429 is embedded in the third opening, and the conductor 437 is embedded in the fourth opening. Moreover, the conductor 434 having a region in contact with the conductor 433 is provided over the insulator 428. The conductor 432 having a region in contact with the conductor 431 is provided over the insulator 428. The conductor 430 having a region in contact with the conductor 429 is provided over the insulator 428. The conductor 438 having a region in contact with the conductor 437 is provided over the insulator 428.

Note that the semiconductor 406b includes the region 407 in which the top surface of the semiconductor 406b is in contact with the conductors 416a1 and 416a2.

In the transistor, the conductor 404 functions as a first gate electrode. Furthermore, the conductor 404 can have a stacked structure including a conductor that has a function of inhibiting penetration of oxygen. For example, when the conductor that has a function of inhibiting penetration of oxygen is formed as a lower layer, an increase in the electric resistance value due to oxidation of the conductor 404 can be prevented. The insulator 412 serves as a gate insulator.

The conductors 416a1 and 416a2 function as source and drain electrodes of the transistor. The conductors 416a1 and 416a2 can each have a stacked structure including a conductor having a function of inhibiting penetration of oxygen. For example, when the conductor having a function of inhibiting penetration of oxygen is formed as an upper layer, an increase in the electric resistance value due to oxidation of the conductors 416a1 and 416a2 can be prevented.

The resistance of the semiconductor 406b can be controlled by a potential applied to the conductor 404. That is, conduction or non-conduction between the conductor 416a1 and the conductor 416a2 can be controlled by the potential applied to the conductor 404.

In the transistor, the region serving as a gate electrode is formed in a self-aligned manner by filling the openings formed in the insulator 410 and the like; thus, the transistor may be called trench gate self-aligned (TGSA) s-channel FET.

In FIG. 5B, the length of the region of the bottom surface of the conductor 404 functioning as a first gate electrode facing the top surface of the semiconductor 406b with the insulator 412 and the insulator 406c positioned therebetween is defined as a gate line width. The gate line width can be smaller than the width of the opening reaching the semiconductor 406b in the insulator 410 and the like. That is, the gate line width can be smaller than the minimum feature size. Specifically, the gate line width can be greater than or equal to 5 nm and less than or equal to 60 nm, preferably greater than or equal to 5 nm and less than or equal to 30 nm.

When an electric field of the first gate electrode is blocked by other conductors, switching characteristics of the transistor are degraded in some cases. In the transistor, the positional relationship between the conductor 404 and the conductors 416a1 and 416a2 is changed by the thicknesses of the insulators 406c and 412. That is, the relationship between the thicknesses of the conductors 416a1 and 416a2 functioning as the source electrode and the drain electrode and the thickness of the insulator 412 functioning as the gate insulating film affects the electrical characteristics of the transistor.

When the thickness of the insulator 412 in a region between the conductor 416a1 and the conductor 416a2 is smaller than that of the conductor 416a1 or 416a2 in FIG. 5B, an electric field from the gate electrode is applied to the entire channel formation region, making the operation of the transistor favorable. The thickness of the insulator 412 in the region between the conductor 416a1 and the conductor 416a2 is less than or equal to 30 nm, preferably less than or equal to 10 nm.

The transistor can have a structure in which the conductor 416a1 or 416a2 has a small thickness. An end portion of the conductor 416a1 has a region facing the conductor 404 with the insulator 406c, the insulator 412, and the insulator 424a1 positioned therebetween. The end portion of the conductor 416a2 has a region facing the conductor 404 with the insulator 406c, the insulator 412, and the insulator 424a2 positioned therebetween. The areas of such regions can be small. Furthermore, the insulator 424a1 and the insulator 424a2 are arranged, whereby the insulators in such regions can have a large thickness. Thus, parasitic capacitance of these regions in the transistor is reduced.

In the structure of the transistor, the insulator 424a1 is provided in the region that is on the side surface of the conductor 416a1 and in contact with the insulator 406c, as described above. The insulator 424a2 is provided in the region that is on the side surface of the conductor 416a2 and in contact with the insulator 406c, as described above. In other words, between the conductor 404 functioning as the first gate electrode and the conductor 416a1 or 416a2 functioning as a source or drain electrode, the insulator 424a1 or the insulator 424a2 is added to the insulator 412 and the insulator 406c. Accordingly, the electric field between the conductor 404 functioning as the first gate electrode and the conductor 416a1 or 416a2 functioning as a source or drain electrode can be relaxed, whereby the short channel effect of the transistor is hardly affected.

The conductor 310a functions as a second gate electrode. The conductor 310a can be a multilayer film including a conductive film that has a function of inhibiting penetration of oxygen. The use of the multilayer film including a conductive film that has a function of inhibiting penetration of oxygen can prevent a decrease in conductivity due to oxidation of the conductor 310a. The insulators 302, 303, and 402 serve as a gate insulating film. The threshold voltage of the transistor can be controlled by a potential applied to the conductor 310a. In addition, the threshold voltage of the transistor can be controlled by applying potentials to the conductor 310c so that electrons are injected to the insulator 303. The first gate electrode and the second gate electrode are electrically connected to each other, whereby a high on-state current can be obtained. Note that the function of the first gate electrode and that of the second gate electrode may be interchanged.

Figure 6B:
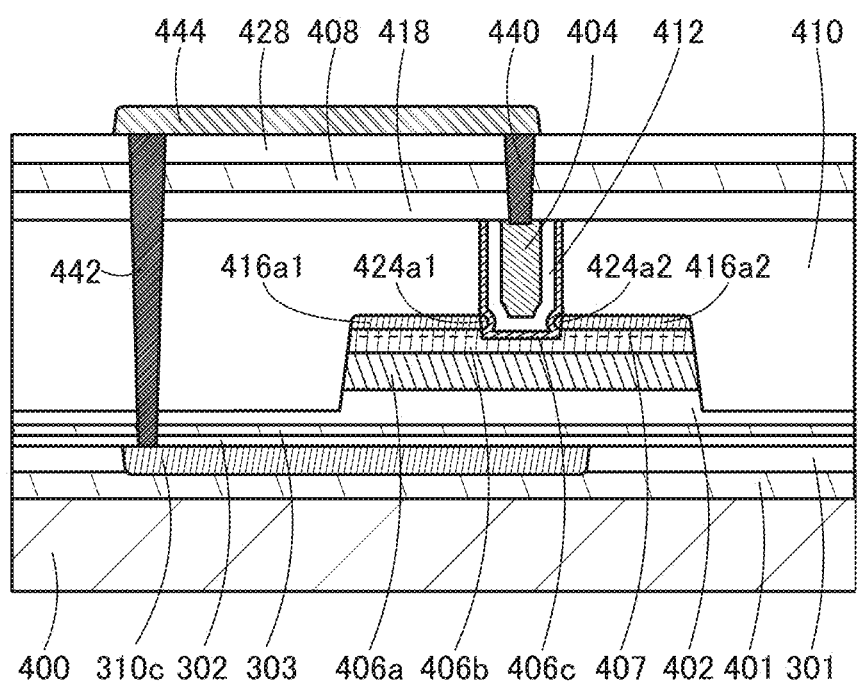

FIG. 6B illustrates an example in which the first gate electrode and the second gate electrode are electrically connected. In an opening reaching the conductor 404 through the insulators 428, 408, and 418, the conductor 440 is embedded, and the top surface of the conductor 440 is electrically connected to the conductor 444 formed over the insulator 428. In an opening reaching the conductor 310c through the insulators 428, 408, 418, 410, 402, and 303, 302, the conductor 442 is embedded, and the top surface of the conductor 442 is electrically connected to the conductor 444. That is, the conductor 404 functioning as the first gate electrode is electrically connected to the conductor 310c functioning as the second gate electrode through the conductors 440, 444, and 442.

The insulators 418 and 428 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 418 and 428 preferably contain silicon oxide or silicon oxynitride. For the other components, refer to the above description.

Embodiment 3

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 7A:
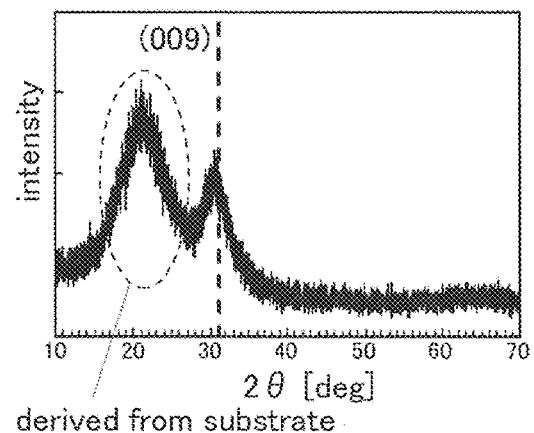
FIGS. 7A to 7E show structural analysis results of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 7A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

Figure 7B:
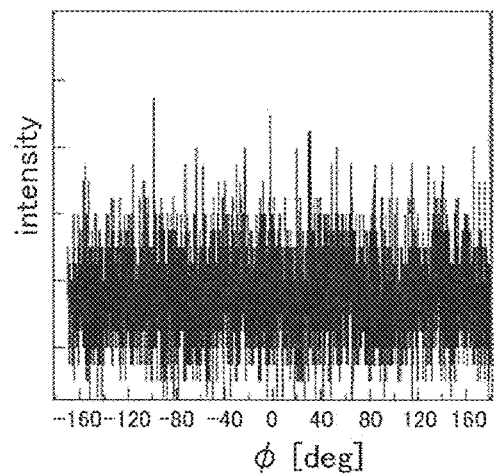
Figure 7C:
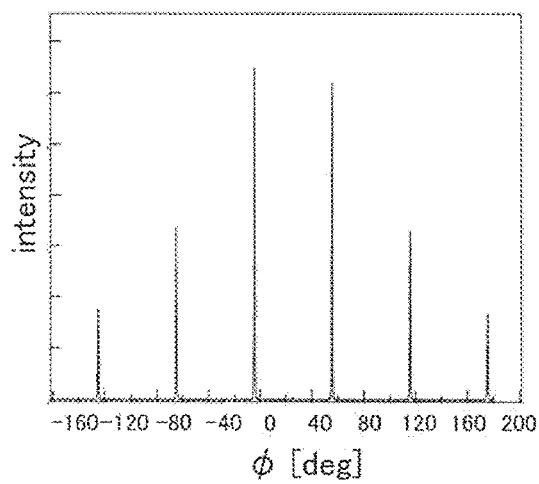

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 7B, a peak is not clearly observed. In contrast, in the case where single crystal $InGaZnO_4$ is subjected to φ scan with 2θ fixed at around 56°, as shown in FIG. 7C, six peaks which are derived from crystal planes equivalent to the (110) plane are observed. Accordingly, the structural analysis using XRD shows that the directions of a-axes and b-axes are irregularly oriented in the CAAC-OS.

Figure 7D:
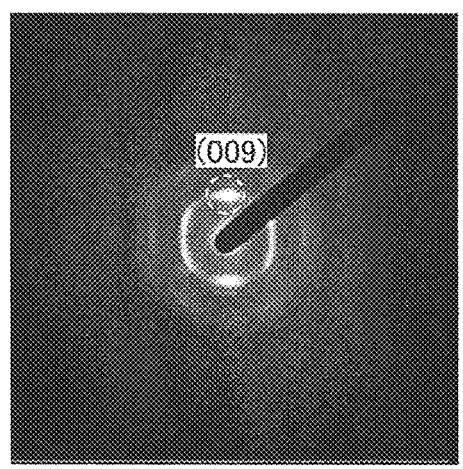
Figure 7E:
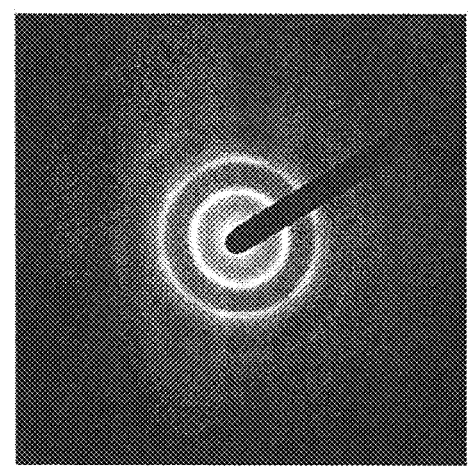

Next, a CAAC-OS analyzed by electron diffraction will be described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 7D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 7E shows a diffraction pattern obtained in such a manner that an electron beam with a probe diameter of 300 nm is incident on the same sample in the direction perpendicular to the sample surface. As shown in FIG. 7E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 7E is considered to be derived from the (010) plane, the (100) plane, and the like of the $InGaZnO_4$ crystal. The second ring in FIG. 7E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 8A:
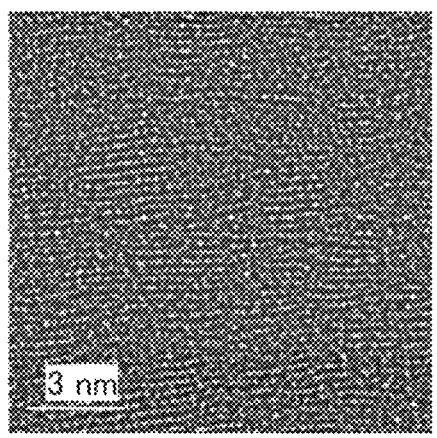
FIGS. 8A to 8E show a cross-sectional TEM image and plan-view TEM images of a CAAC-OS and images obtained through analysis thereof.

FIG. 8A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 8A shows pellets in which metal atoms are arranged in a layered manner, and proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 8B:
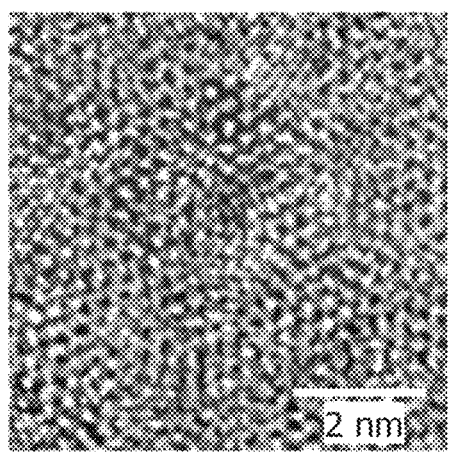
Figure 8C:
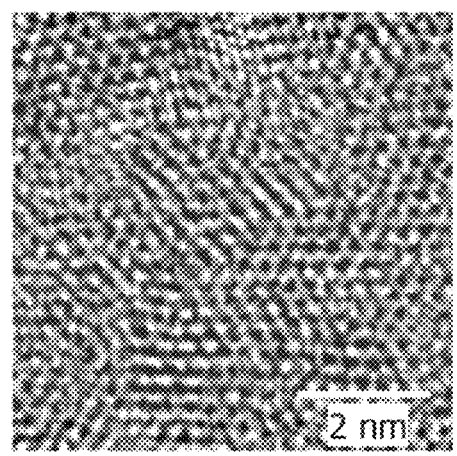
Figure 8D:
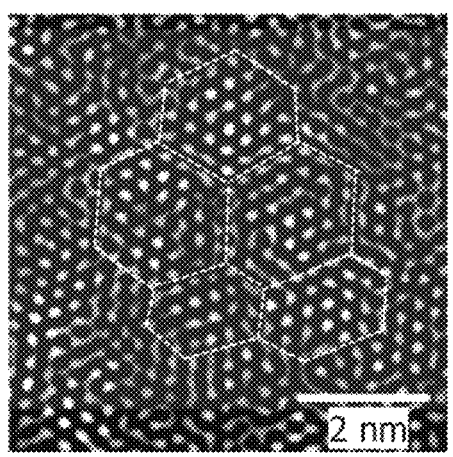
Figure 8E:
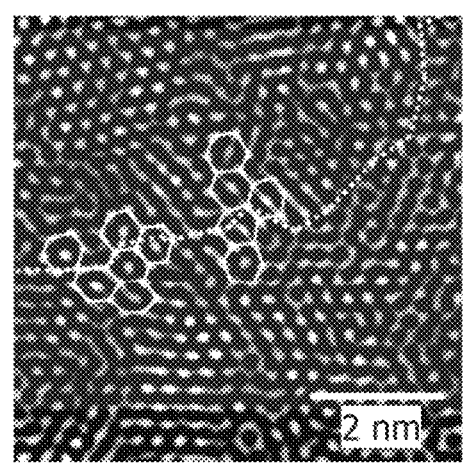

FIGS. 8B and 8C show Cs-corrected high-resolution TEM images of a plane of the CAAC-OS observed from a direction substantially perpendicular to the sample surface. FIGS. 8D and 8E are images obtained through image processing of FIGS. 8B and 8C. The method of image processing is as follows. The image in FIG. 8B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 8D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 8E, a dotted line denotes a boundary between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. For example, oxygen vacancy in the oxide semiconductor might serve as a carrier trap or serve as a carrier generation source when hydrogen is captured therein.

The CAAC-OS having small amounts of impurities and oxygen vacancies is an oxide semiconductor with a low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 9A:
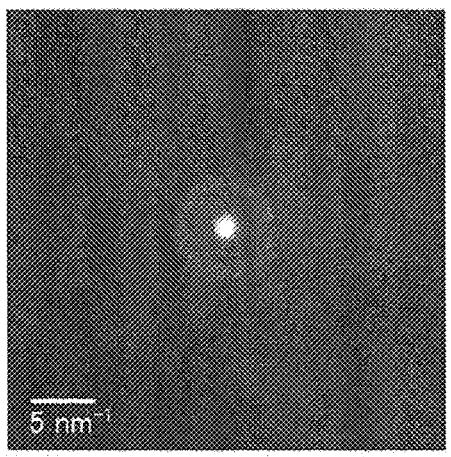
FIGS. 9A to 9D show electron diffraction patterns and a cross-sectional TEM image of an nc-OS.
Figure 9B:
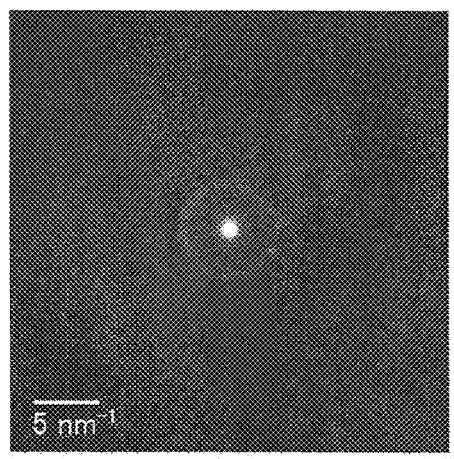

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 9A is observed. FIG. 9B shows a diffraction pattern obtained when an electron beam with a probe diameter of 1 nm is incident on the same sample. As shown in FIG. 9B, a plurality of spots are observed in a ring-like region. In other words, ordering in an nc-OS is not observed with an electron beam with a probe diameter of 50 nm but is observed with an electron beam with a probe diameter of 1 nm.

Figure 9C:
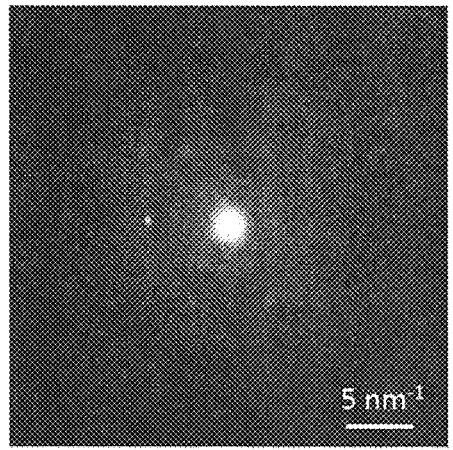

Furthermore, an electron diffraction pattern in which spots are arranged in an approximately regular hexagonal shape is observed in some cases as shown in FIG. 9C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 9D:
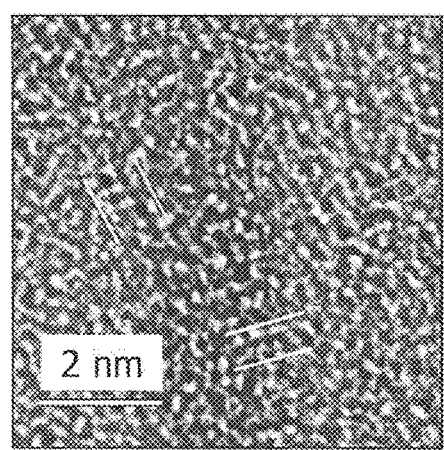

FIG. 9D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 10A:
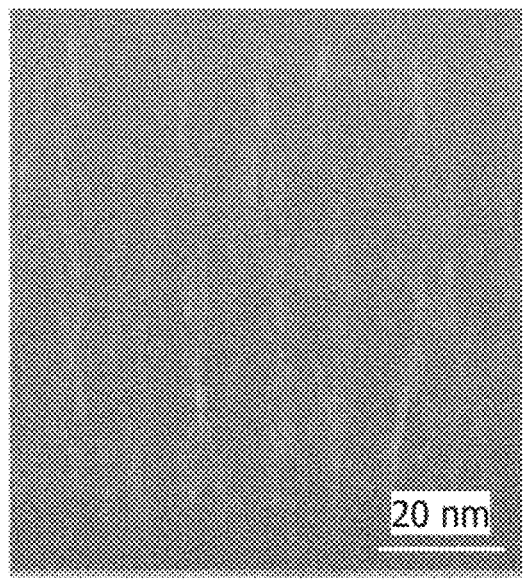
FIGS. 10A and 10B show cross-sectional TEM images of an a-like OS.
Figure 10B:
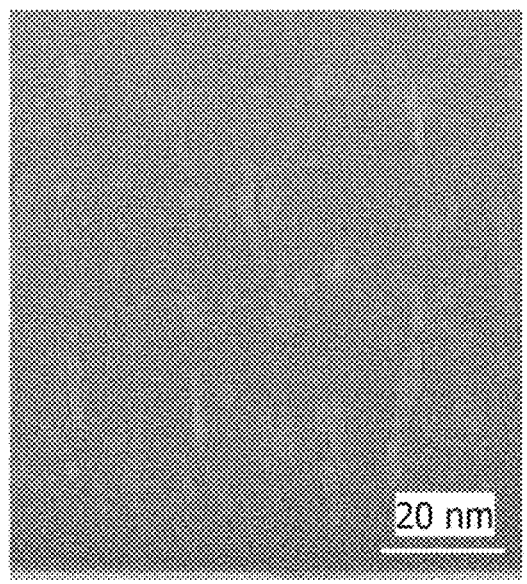

FIGS. 10A and 10B are high-resolution cross-sectional TEM images of an a-like OS. FIG. 10A is the high-resolution cross-sectional TEM image of the a-like OS at the start of the electron irradiation. FIG. 10B is the high-resolution cross-sectional TEM image of a-like OS after the electron (e) irradiation at $4.3 \times 10^8$ e$^-$/nm$^2$. FIGS. 10A and 10B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value has been calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 11:
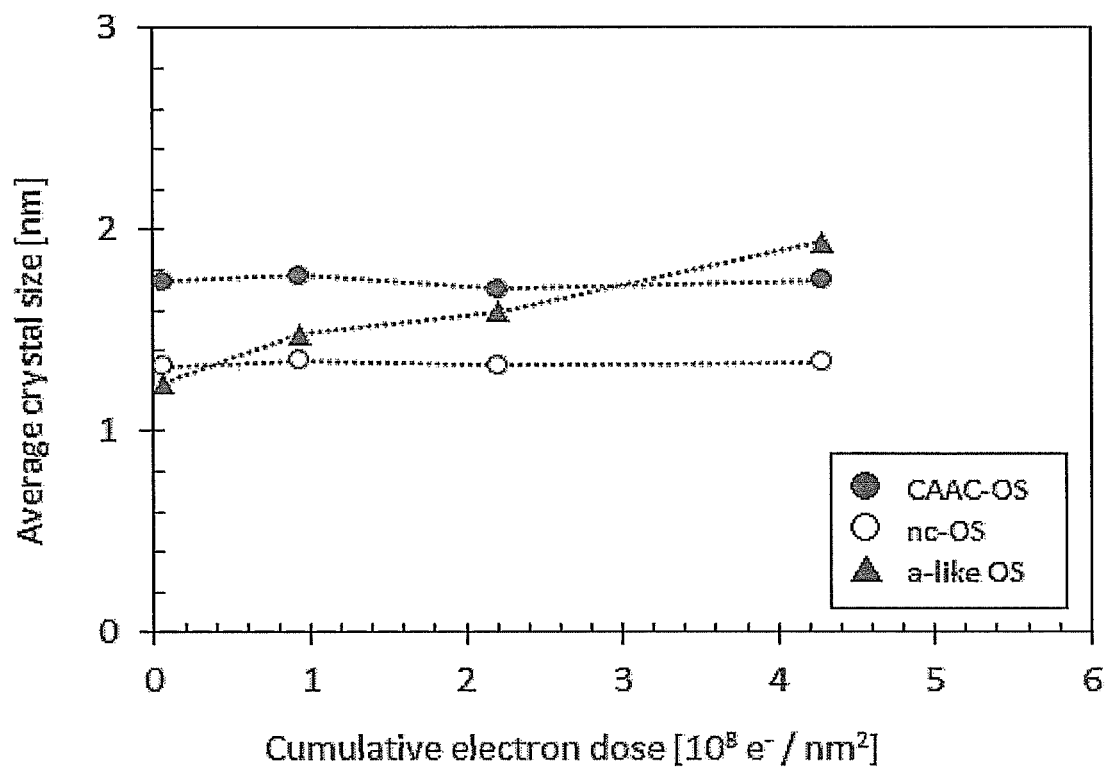
FIG. 11 shows a change in crystal part of an In—Ga—Zn oxide induced by electron irradiation.

FIG. 11 shows a change in the average size of crystal parts (at 22 to 30 points) in each sample. Note that the crystal part size corresponds to the length of a lattice fringe. FIG. 11 indicates that the crystal part size in the a-like OS increases with an increase in the cumulative electron dose in obtaining TEM images, for example. As shown in FIG. 11, a crystal part of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. As shown in FIG. 11, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2$·s); and the diameter of the irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition.

Note that it is difficult to deposit an oxide semiconductor having a density lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

An oxide which can be used as the insulator 406a, the semiconductor 406b, the insulator 406c, or the like is described below.

An oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide film contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide semiconductor according to the present invention are described with reference to FIGS. 12A to 12C. Note that the proportion of oxygen atoms is not shown in FIGS. 12A to 12C. Terms of the atomic ratio of indium to the element M and zinc in the oxide semiconductor are denoted by [In], [M], and [Zn].

Figure 12A:
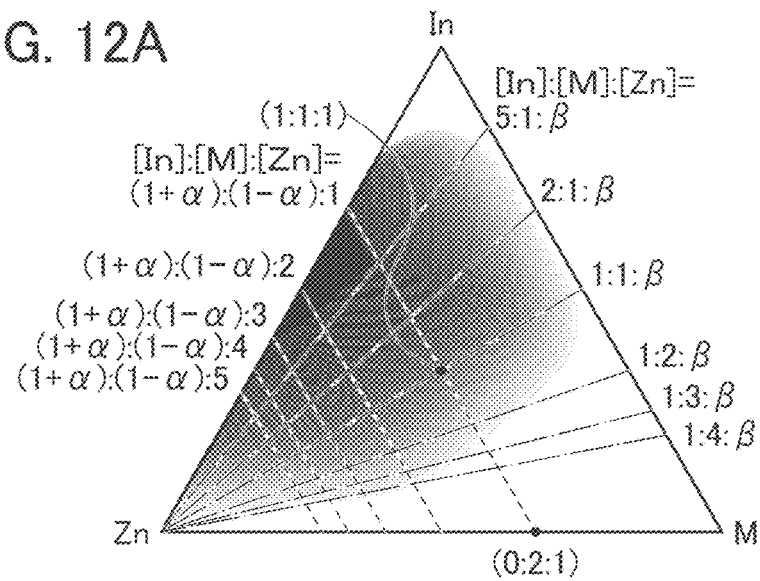
FIGS. 12A to 12C each illustrate an atomic ratio of an oxide of one embodiment of the present invention.
Figure 12B:
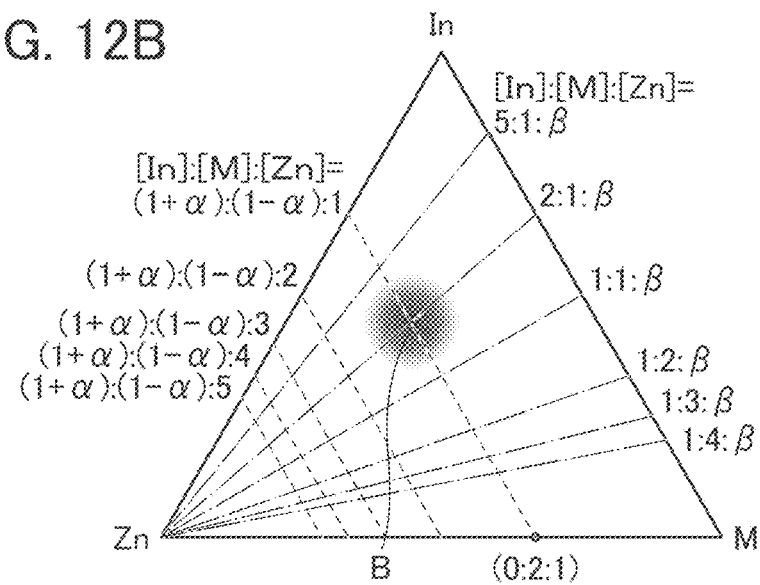
Figure 12C:
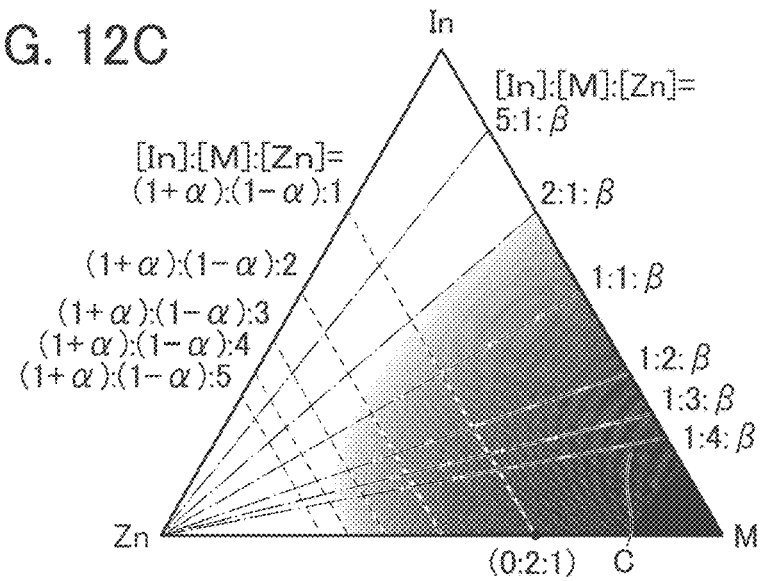

In FIGS. 12A to 12C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is 1:2:β, a line where the atomic ratio [In]:[M]:[Zn] is 1:3:β, a line where the atomic ratio [In]:[M]:[Zn] is 1:4:β, a line where the atomic ratio [In]:[M]:[Zn] is 2:1: β, and a line where the atomic ratio [In]:[M]:[Zn] is 5:1:β.

An oxide with an atomic ratio [In]:[M]:[Zn] that is equal to or close to 0:2:1 in FIGS. 12A to 12C is likely to have a spinel crystal structure.

FIGS. 12A and 12B show examples of the preferred ranges of the atomic ratio of indium, the element M, and zinc contained in an oxide in one embodiment of the present invention.

Figure 13:
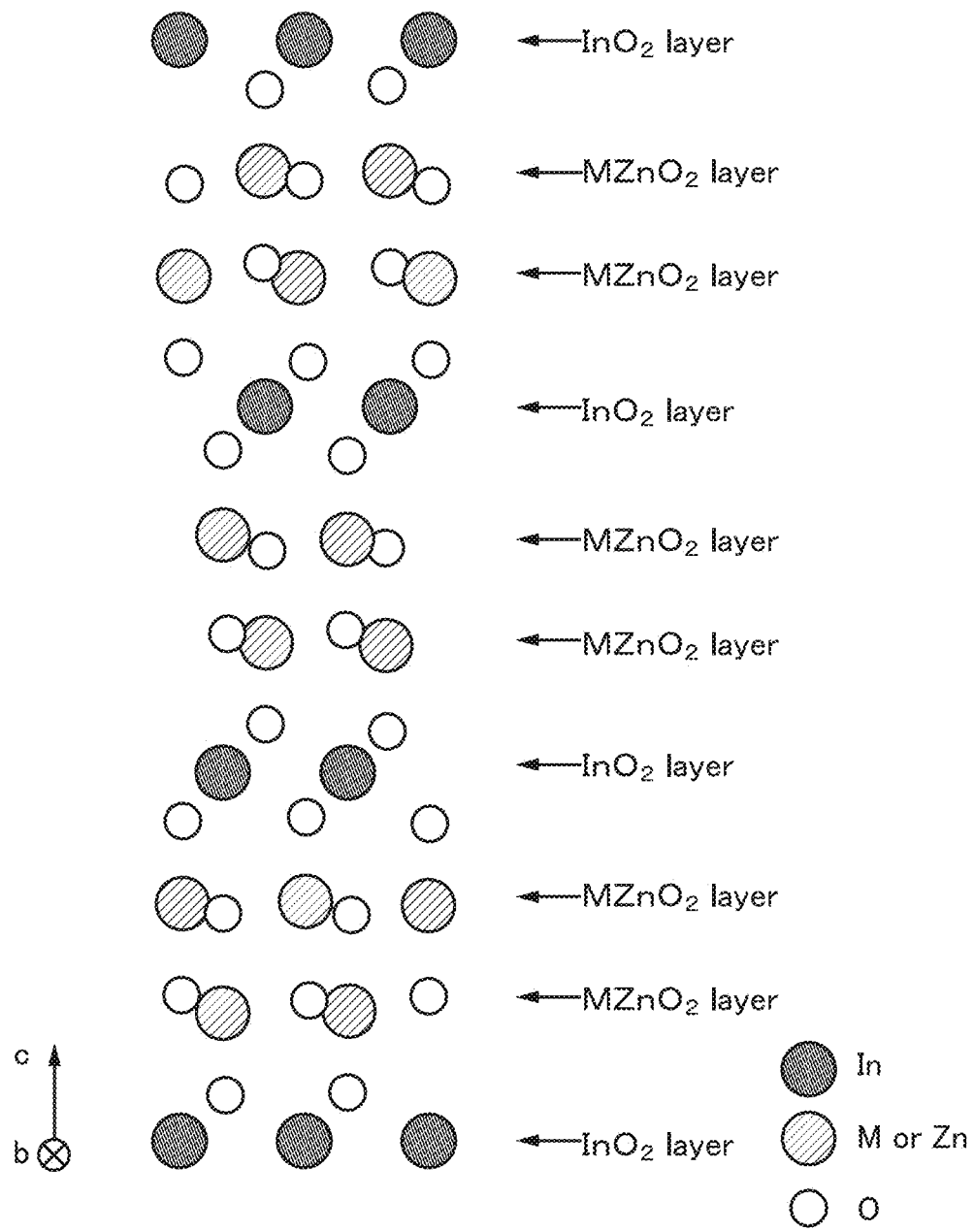
FIG. 13 illustrates a crystal structure of $InMZnO_4$.

FIG. 13 shows an example of the crystal structure of $InMZnO_4$ whose atomic ratio [In]:[M]:[Zn] is 1:1:1. The crystal structure shown in FIG. 13 is $InMZnO_4$ observed from a direction parallel to a b-axis. Note that the metal elements in each $MZnO_2$ layer in FIG. 13 indicates an element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and include two $MZnO_2$ layers containing the element M and zinc for every $InO_2$ layer containing indium and, as shown in FIG. 13.

Indium and the element M can be replaced with each other. Therefore, when the element M in the (M,Zn) layer is replaced with indium, the layer can also be referred to as an (In,M,Zn) layer. In that case, a layered structure that contains two (In,M,Zn) layers for every In layer is obtained.

An oxide whose atomic ratio [In]:[M]:[Zn] is 1:1:2 has a layered structure that contains three (M,Zn) layers for every In layer. In other words, if [Zn] is higher than [In] and [M], the proportion of the (M,Zn) layer to the In layer becomes higher when the oxide is crystallized.

Note that in the case where the number of (M,Zn) layers for every In layer is not an integer in the oxide, the oxide might have plural kinds of layered structures where the number of (M,Zn) layers for every In layer is an integer. For example, in the case of [In]: [M]: [Zn]=1:1:1.5, the oxide might have the following layered structures: a layered structure of two (M,Zn) layers for every In layer and a layered structure of and three (M,Zn) layers for every In layer.

For example, in the case where the oxide is deposited with a sputtering apparatus, a film having an atomic ratio deviated from the atomic ratio of a target is formed. In particular, [Zn] in the film might be lower than [Zn] in the target depending on the substrate temperature in deposition.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have high carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has higher carrier mobility than an oxide having a low content of indium.

In contrast, when the indium content and the zinc content in an oxide become lower, carrier mobility becomes lower. Thus, with an atomic ratio of [In]:[M]:[Zn]=0:1:0 and the vicinity thereof (e.g., a region C in FIG. 12C), insulation performance becomes better.

Accordingly, an oxide in one embodiment of the present invention preferably has an atomic ratio represented by a region A in FIG. 12A. With the atomic ratio, a layered structure with high carrier mobility and a few grain boundaries is easily obtained.

A region B in FIG. 12B represents an atomic ratio of [In]:[M]:[Zn]=4:2:3 or 4:2:4.1 and the vicinity thereof. The vicinity includes an atomic ratio of [In]:[M]:[Zn]=5:3:4. An oxide with an atomic ratio represented by the region B is an excellent oxide semiconductor that has particularly high crystallinity and high carrier mobility.

Note that conditions where a layered structure of an oxide is formed are not uniquely determined by the atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with low carrier density is preferably used for the transistor. For example, an oxide film whose carrier density is lower than $8 \times 10^{11}/cm^3$, preferably lower than $1 \times 10^{11}/cm^3$, or further preferably lower than $1 \times 10^{10}/cm^3$, and higher than or equal to $1 \times 10^{-9}/cm^3$ is used.

A highly purified intrinsic or substantially highly purified intrinsic oxide film has few carrier generation sources, and thus can have a low carrier density. A highly purified intrinsic or substantially highly purified intrinsic oxide has a low density of defect states and accordingly has a low density of trap states in some cases.

Additionally, a charge trapped by the trap states in the oxide requires a long time to disappear. The trapped charge may behave like a fixed charge. Thus, the transistor whose channel region is formed in the oxide film having a high density of trap states has unstable electrical characteristics in some cases.

In order to obtain stable electrical characteristics of the transistor, it is effective to reduce the concentration of impurities in the oxide. In order to reduce the concentration of impurities in the oxide, the concentration of impurities in a film adjacent to the oxide is preferably reduced. As examples of the impurities, hydrogen, nitrogen, alkali metal, alkaline earth metal, iron, nickel, silicon, and the like are given.

Here, the influence of impurities in the oxide is described.

When silicon or carbon that is one of Group 14 elements is contained in the oxide, defect states are formed. Thus, the oxide is formed to have a region where the concentration of silicon or carbon (measured by secondary ion mass spectrometry (SIMS)) is controlled to be lower than or equal to $2 \times 10^{18}$ atoms/$cm^3$, preferably lower than or equal to $2 \times 10^{17}$ atoms/$cm^3$ in the oxide or around an interface with the oxide.

When the oxide contains alkali metal or alkaline earth metal, defect states are formed and carriers are generated, in some cases. Thus, a transistor including an oxide film which contains alkali metal or alkaline earth metal is likely to be normally on. Therefore, it is preferable to reduce the concentration of alkali metal or alkaline earth metal in the oxide. Specifically, the concentration of alkali metal or alkaline earth metal of the oxide film, which is measured by SIMS, is lower than or equal to $1\times10^{18}$ atoms/cm$^3$, preferably lower than or equal to $2\times10^{16}$ atoms/cm$^3$.

When the oxide contains nitrogen, the oxide easily becomes n-type by generation of electrons serving as carriers and an increase of carrier density. Thus, when an oxide contains nitrogen, a transistor in which the oxide is used for a semiconductor is likely to be normally on. For this reason, nitrogen in the oxide is preferably reduced as much as possible; the oxide is formed to have a region where the concentration of nitrogen measured by SIMS is, for example, controlled to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, when an oxide contains hydrogen, a transistor including the oxide is likely to be normally on. Accordingly, it is preferable that hydrogen in the oxide be reduced as much as possible. Specifically, the hydrogen concentration of the oxide film, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide with sufficiently reduced impurity concentration is used for a channel formation region in a transistor, the transistor can have stable electrical characteristics.

Next, the case where the oxide has a two-layer structure or a three-layer structure is described. A band diagram of insulators that are in contact with a stacked structure of an insulator S1, a semiconductor S2, and an insulator S3 and a band diagram of insulators that are in contact with a stacked structure of the semiconductor S2 and the insulator S3 are described with reference to FIGS. 14A and 14B.

Figure 14A:
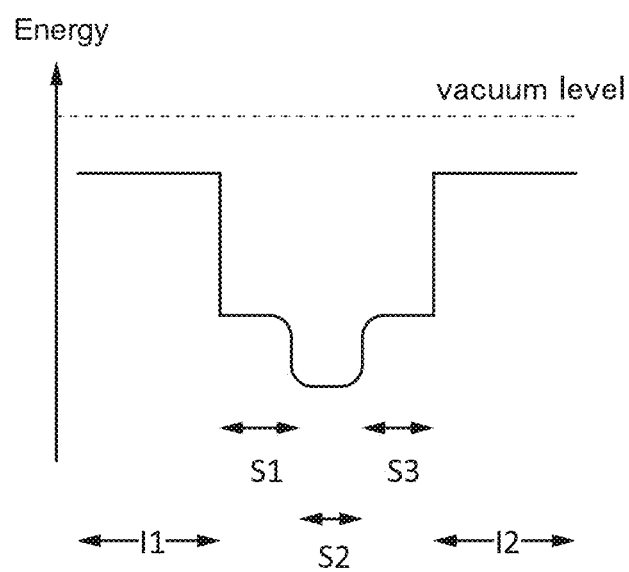
FIGS. 14A and 14B are each a band diagram of a stacked structure in the oxide.
Figure 14B:
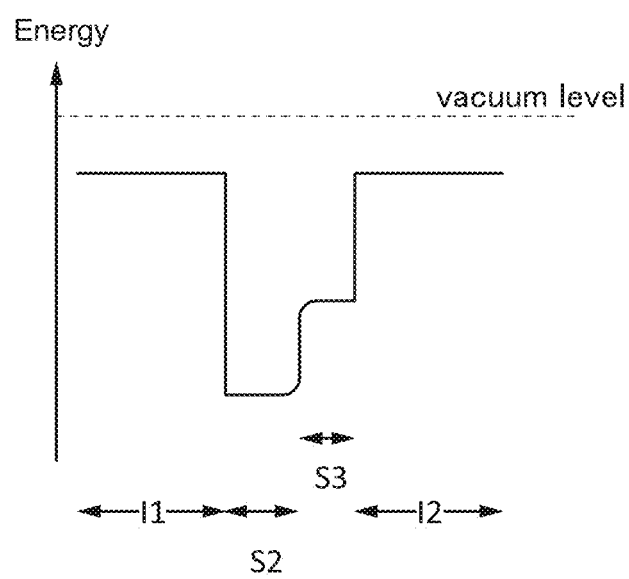

FIG. 14A is an example of a band diagram of a stacked structure including an insulator I1, the insulator S1, the semiconductor S2, the insulator S3, and an insulator I2 in a film thickness direction. FIG. 14B is an example of a band diagram of a stacked structure including the insulator I1, the ox S2, the insulator S3, and the insulator I2 in a film thickness direction. Note that for easy understanding, the band diagrams show the energy level of the conduction band minimum (Ec) of each of the insulator I1, the insulator S1, the semiconductor S2, the insulator S3, and the insulator I2.

The energy level of the conduction band minimum of each of the insulators S1 and S3 is closer to the vacuum level than that of the semiconductor S2. Typically, a difference in energy level between the conduction band minimum of the semiconductor S2 and the conduction band minimum of each of the insulators S1 and S3 is preferably greater than or equal to 0.15 eV or greater than or equal to 0.5 eV, and less than or equal to 2 eV or less than or equal to 1 eV. That is, the electron affinity of the semiconductor S2 is higher than the electron affinity of each of the insulators S1 and S3, and the difference between the electron affinity of each of the insulators S1 and S3 and the electron affinity of the semiconductor S2 is greater than or equal to 0.15 eV or greater than or equal to 0.5 eV, and less than or equal to 2 eV or less than or equal to 1 eV.

As shown in FIGS. 14A and 14B, the energy level of the conduction band minimum of each of the insulator S1, the semiconductor S2, and the insulator S3 is gradually varied. In other words, the energy level of the conduction band minimum is continuously varied or continuously connected. In order to obtain such a band diagram, the density of defect states in a mixed layer formed at an interface between the insulator S1 and the semiconductors S2 or an interface between the semiconductor S2 and the insulator S3 is preferably made low.

Specifically, when the insulator S1 and the semiconductor S2 or the semiconductor S2 and the insulator S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the insulators S1 and S3.

At this time, the semiconductor S2 serves as a main carrier path. Since the density of defect states at the interface between the insulator S1 and the semiconductor S2 and the interface between the semiconductor S2 and the insulator S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The insulators S1 and S3 can make the trap state apart from the semiconductor S2. This structure can prevent the positive shift of the threshold voltage of the transistor.

A material whose conductivity is sufficiently lower than that of the semiconductor S2 is used for the insulators S1 and S3. In that case, the semiconductor S2, the interface between the semiconductor S1 and the insulator S2, and the interface between the semiconductor S2 and the insulator S3 mainly function as a channel region. For example, an oxide with high insulation performance and the atomic ratio represented by the region C in FIG. 12C may be used for each of the insulators S1 and S3. Note that the region C in FIG. 12C represents an atomic ratio of [In]:[M]:[Zn]=0:1:0 and the vicinity thereof.

In the case where an oxide with the atomic ratio represented by the region A is used as the semiconductor S2, it is particularly preferable to use an oxide with an atomic ratio where [M]/[In] is greater than or equal to 1, preferably greater than or equal to 2 as each of the insulators S1 and S3. In addition, it is suitable to use an oxide with sufficiently high insulation performance and an atomic ratio where [M]/([Zn]+[In]) is greater than or equal to 1 as the insulator S3.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

At least part of this embodiment can be implemented in combination with any of the other embodiments and the other examples described in this specification as appropriate.

Embodiment 4

<Method 1 for Manufacturing Transistor>

A method for manufacturing the transistor of the present invention in FIGS. 4A to 4C will be described below with reference to FIGS. 15A to 15C, FIGS. 16A to 16C, FIGS. 17A to 17C, FIGS. 18A to 18C, FIGS. 19A to 19C, FIGS. 20A to 20C, and FIGS. 21A to 21C.

First, the substrate 400 is prepared.

Next, the insulator 401 is formed, and then, an insulator to be the insulator 301 is formed over the insulator 401. Then, a groove is formed in the insulator to be the insulator 301 so as to reach the insulator 401; thus, the insulator 301 is formed. Examples of the groove include a hole and an opening. In forming the groove, wet etching may be employed; however, dry etching is preferably employed in terms of microfabrication. The insulator 401 is preferably an insulator that serves as an etching stopper film used in forming the groove by etching the insulator to be the insulator 301. For example, in the case where a silicon oxide film is used as the insulator to be the insulator 301 in which the groove is to be formed, the insulator 401 is preferably formed using a silicon nitride film, an aluminum oxide film, or a hafnium oxide film.

After the formation of the groove, a conductor to be the conductors 310a and 310b is formed. The conductor to be the conductors 310a and 310b desirably contains a conductor that has a function of inhibiting penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used.

Next, CMP is performed to remove the conductor to be the conductors 310a and 310b that are located over the insulator 301. Consequently, the conductors 310a and 310b remain only in the groove, whereby a wiring layer with a flat top surface can be formed.

Alternatively, the conductor to be the conductors 310a and 310b may be formed over the insulator 301 and processed by a lithography method or the like to form the conductors 310a and 310b.

Next, the insulator 302 is formed over the insulator 301 and the conductors 310a and 310b. The insulator 303 is formed over the insulator 302. It is preferable that the insulator 303 have a function of inhibiting penetration of impurities such as hydrogen and oxygen. It is preferable to use, for example, a silicon nitride film, an aluminum oxide film, or a hafnium oxide film. The insulator 303 can be deposited by a sputtering method, a CVD method, an MBE method, a PLD method, an ALD method, or the like.

Next, the insulator 402 is formed over the insulator 303. Next, treatment to add oxygen to the insulator 402 may be performed. An ion implantation method, a plasma treatment method, or the like can be used for the treatment to add oxygen. Alternatively, heat treatment using an oxidation gas may be used. Note that oxygen added to the insulator 402 is excess oxygen.

Then, an insulator 306a is deposited over the insulator 402. Then, treatment to add oxygen to the insulator 306a may be performed. An ion implantation method, a plasma treatment method, or the like can be used for the treatment to add oxygen. Note that oxygen added to the insulator 306a is excess oxygen. Then, a semiconductor 306b is formed over the insulator 306a.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor can be increased and impurities such as hydrogen and moisture can be removed, for example. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a plasma power source for applying a radio frequency (RF) to a substrate side may be provided. The use of high-density plasma enables high-density oxygen radicals to be produced, and the application of the RF voltage to the substrate side allows oxygen radicals generated by the high-density plasma to be efficiently introduced into the semiconductor 306$b$. Alternatively, after plasma treatment using an inert gas with the apparatus, plasma treatment using oxygen in order to compensate released oxygen may be performed.

Figure 15A:
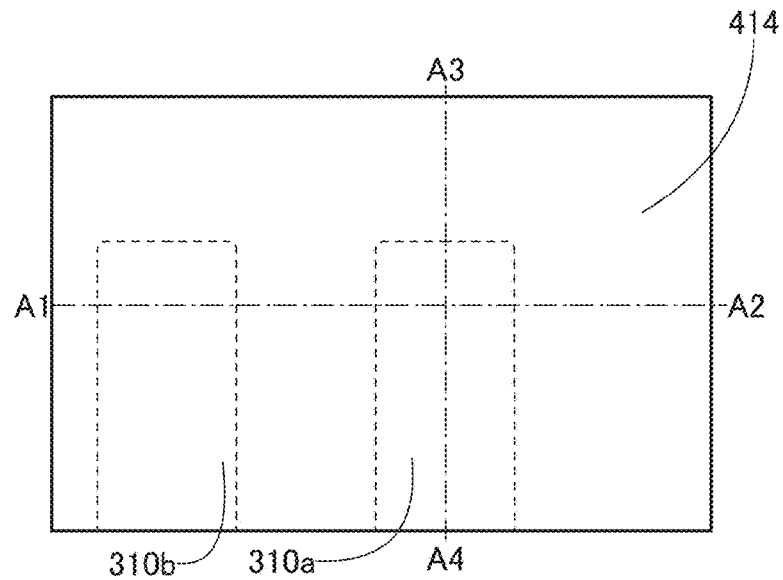
FIGS. 15A to 15C are a top view and cross-sectional views illustrating a method for manufacturing a transistor of one embodiment of the present invention.
Figure 15B:
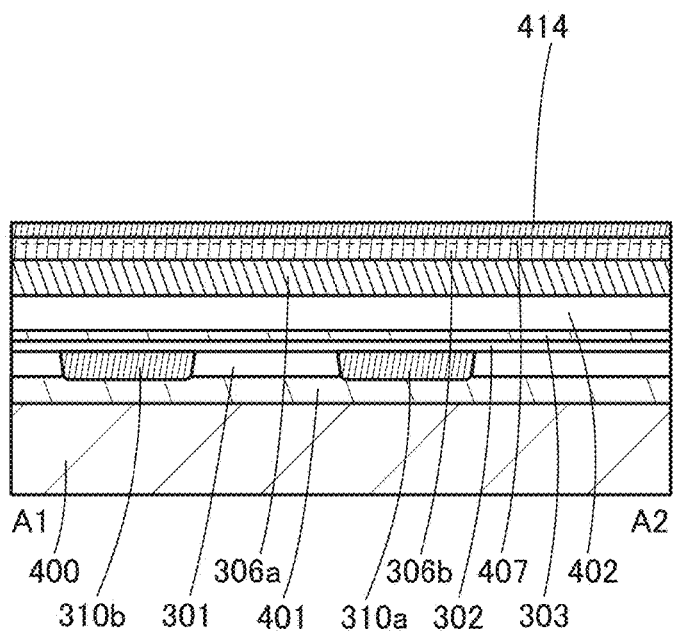
Figure 15C:
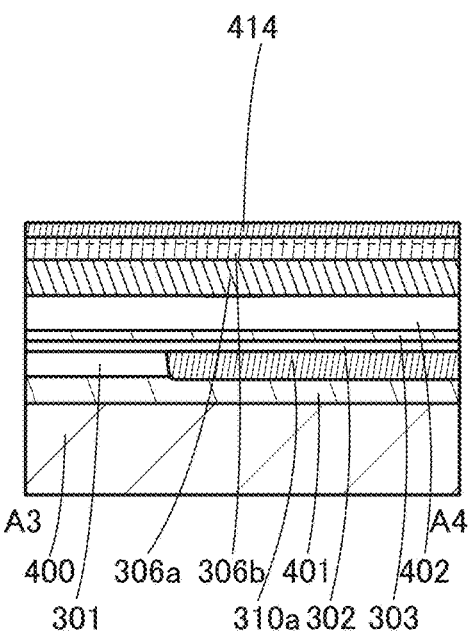

Then, a conductor 414 is formed over the semiconductor 306$b$ (see FIGS. 15A to 15C).

Figure 16A:
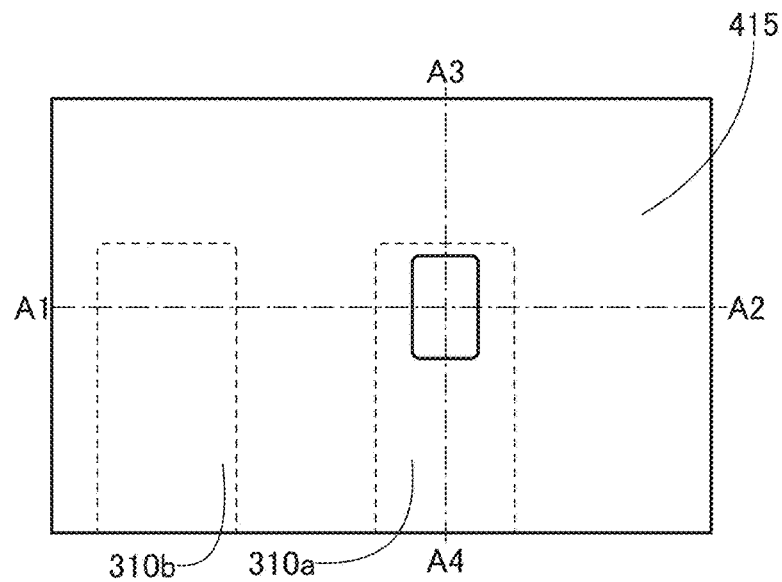
FIGS. 16A to 16C are a top view and cross-sectional views illustrating a method for manufacturing a transistor of one embodiment of the present invention.
Figure 16B:
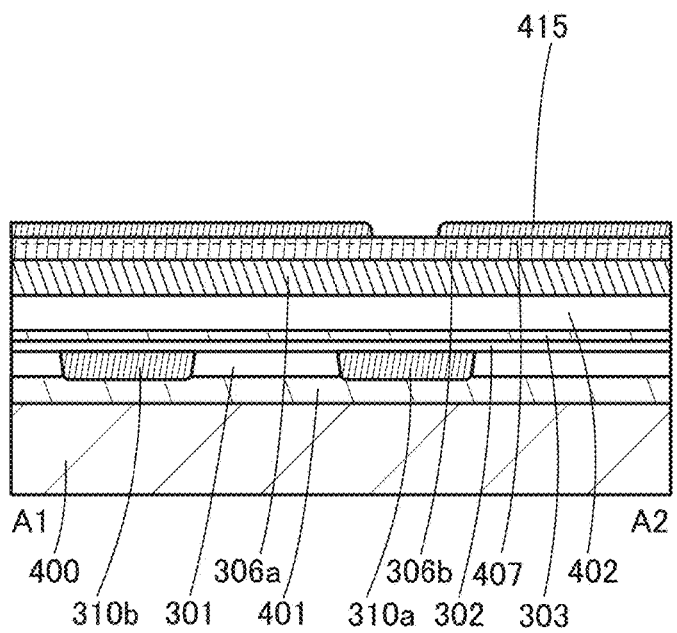
Figure 16C:
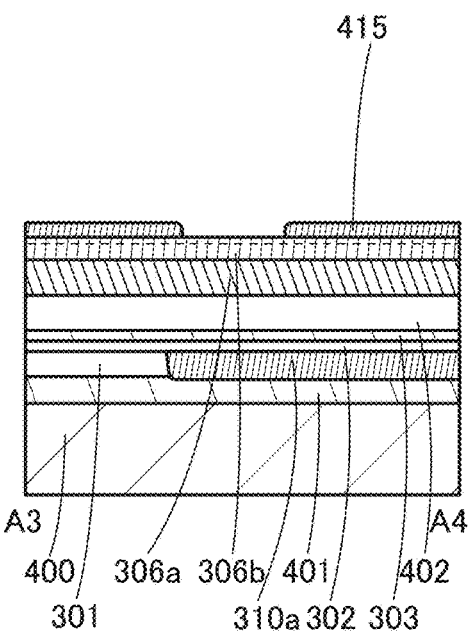

Next, the conductor 414 is processed by a lithography method or the like to form a conductor 415 (see FIGS. 16A to 16C).

Then, the insulator 306$a$, the semiconductor 306$b$, and the conductor 415 are processed by a lithography method or the like to form a multilayer film including the insulator 406$a$, the semiconductor 406$b$, and the conductors 416$a$1 and 416$a$2. Here, a top surface of the insulator 306$b$ is damaged when the conductor 414 is formed, whereby the region 407 is formed. Since the region 407 includes a region where the resistance of the semiconductor 306$b$ is reduced, the contact resistance between the conductor 415 and the semiconductor 306$b$ is reduced. Note that when the multilayer film is formed, the insulator 402 is also subjected to etching to have a thinned region in some cases. That is, the insulator 402 may have a projecting portion in a region in contact with the multilayer film (see FIGS. 17A to 17C).

Next, treatment using plasma containing oxygen is performed. By the plasma treatment containing oxygen, the side surface and top surface of the conductor 416$a$1 are oxidized, so that the insulator 424$a$1 is formed. In addition, the side surface and top surface of the conductor 416$a$2 are oxidized, so that the insulator 424$a$2 is formed. For example, in the case where a conductor including tungsten and silicon is used as the conductor 416$a$1 and the conductor 416$a$2, the insulator 424$a$1 and the insulator 424$a$2 become silicon oxide by performing the plasma treatment containing oxygen.

For the plasma treatment containing oxygen, high-density plasma may be used. By the high-density plasma treatment containing oxygen, the side surface and top surface of the conductor 416$a$1 and the side surface and top surface of the conductor 416$a$2 are efficiently oxidized.

By performing the plasma treatment containing oxygen, oxygen radicals are generated, and excess oxygen can be taken into regions where the top surface and side surface of the semiconductor 406$b$ and the side surface of the insulator 406$a$ are exposed, i.e., a region including a channel formation region, so that oxygen vacancies on the channel formation region can be reduced (see FIGS. 18A to 18C).

Next, the insulator 406$c$ is formed. Then, the insulator 412 is formed over the insulator 406$c$.

Next, a conductor to be the conductor 404 is formed. Then, the conductor to be the conductor 404 is processed by a lithography method or the like to form the conductor 404 (see FIGS. 19A to 19C).

Though an example where the insulator 412 and the insulator 406$c$ are not processed is shown here, the transistor of one embodiment of the present invention is not limited thereto. For example, the insulator 412 and the insulator 406$c$ may be etched in processing the conductor 404. Alternatively, the conductor to be the conductor 404 and the insulators 412 and 406$c$ may be processed in different lithography steps. Processing in different lithography steps may facilitate formation of films with different shapes.

Next, the insulator 410 is formed over the insulator 412 and the conductor 404. The insulator 410 may be formed to have a flat top surface. For example, the top surface of the insulator 410 may have flatness immediately after the film formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. However, the top surface of the insulator 410 is not necessarily flat. Note that the insulator 410 may have a multilayer structure. For example, an aluminum oxide film may be deposited using plasma containing oxygen and stacked. In the case where plasma containing oxygen is used to form an aluminum oxide film, oxygen in the plasma can be added to the side surface of the insulator 412, the side surface of the insulator 406$c$, the side surface of the semiconductor 406$b$, the side surface of the insulator 406$a$, and the like as excess oxygen.

Next, the insulator 408 is deposited over the insulator 410. When the insulator 408 is formed using aluminum oxide using plasma containing oxygen, whereby oxygen in the plasma can be added to the insulator 410 and the like as excess oxygen (see FIGS. 20A to 20C).

Note that the insulator 408 may have a multilayer structure. For example, an aluminum oxide may be deposited by a sputtering method as a first layer, and an aluminum oxide film may be deposited by an ALD method as a second layer. When the first layer is an oxide aluminum deposited by a sputtering method, excess oxygen can be added to the insulator 410. When the second layer is an aluminum oxide deposited by an ALD method, the excess oxygen added to the insulator 410 can be prevented from diffusion above.

Furthermore, second heat treatment may be performed at any time after the formation of the insulator 408. By the second heat treatment, the excess oxygen contained in the insulator 410 and the like moves to the semiconductor 406$b$ through the insulator 412, the insulator 406$c$, and the insulator 406$a$. Thus, defects (oxygen vacancies) in the semiconductor 406$b$ can be reduced.

Note that the second heat treatment may be performed at a temperature such that excess oxygen (oxygen) in the insulator 410 and the like is diffused to the semiconductor 406$b$. For example, the description of the first heat treatment may be referred to for the second heat treatment. The second heat treatment is preferably performed at a temperature lower than that of the first heat treatment. The second heat treatment is performed at a temperature lower than that of the first heat treatment by higher than or equal to 0° C. and lower than or equal to 150° C., preferably higher than or equal to 40° C. and lower than or equal to 100° C. Accordingly, superfluous release of excess oxygen (oxygen) from the insulator 402 can be inhibited. Note that the second heat treatment is not necessarily performed when heating during formation of the films can work as heat treatment comparable to the second heat treatment.

Next, with use of a lithography method, openings are formed: an opening reaching the conductor 310b through the insulator 408, the insulator 410, the insulator 412, the insulator 406c, the insulator 402, the insulator 303, and the insulator 302; an opening reaching the conductor 416a1 and the conductor 416a2 through the insulator 408, the insulator 410, the insulator 412, the insulator 406c, and the insulator 424a1 or 424a2; and an opening reaching the conductor 404 through the insulator 408 and the insulator 410.

As another method for formation of the opening, the following steps may be employed. A conductor is formed over the insulator 408; an insulator is formed over the conductor; and the conductor and the insulator are processed with a lithography method, so that a hard mask including the conductor and the insulator; and etching is performed with use of the hard mask as an etching mask, whereby an opening is formed. When the hard mask is used as the etching mask, the opening can be prevented from extending laterally or deformation. Note that the hard mask may be a single layer of the insulator or the conductor.

The openings can be formed at once by performance of a lithograph step. Alternatively, the openings may be formed separately by performance of lithography steps a plurality of times.

Next, the conductor 433, the conductor 431, the conductor 429, and the conductor 437 are embedded separately in the openings (see FIGS. 21A to 21C).

Next, a conductor is formed over the insulator 408 and the conductors 433, 431, 429, and 437 and processed by a lithography method or the like, so that the conductors 434, 432, 430, and 438 are formed. Through the above steps, the transistor in FIGS. 4A to 4C can be formed (see FIGS. 4A to 4C).

<Method 2 for Manufacturing Transistor>

Figure 22A:
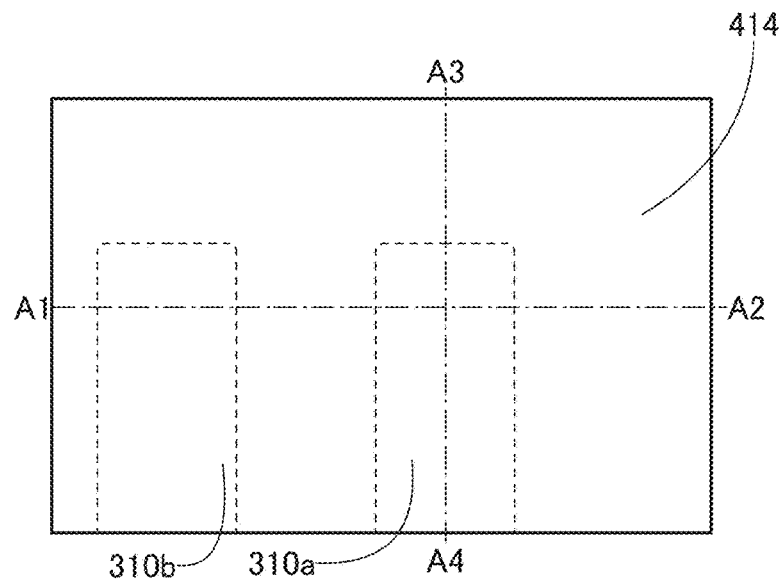
FIGS. 22A to 22C are a top view and cross-sectional views illustrating a method for manufacturing a transistor of one embodiment of the present invention.
Figure 22B:
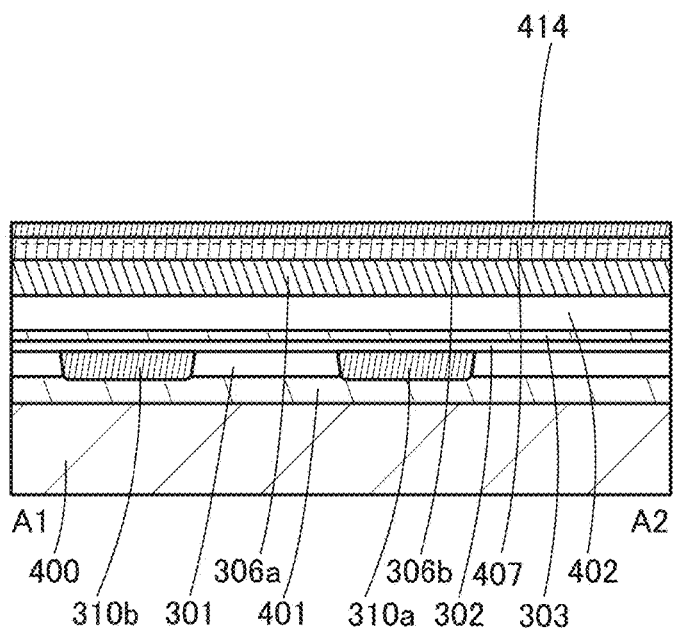
Figure 22C:
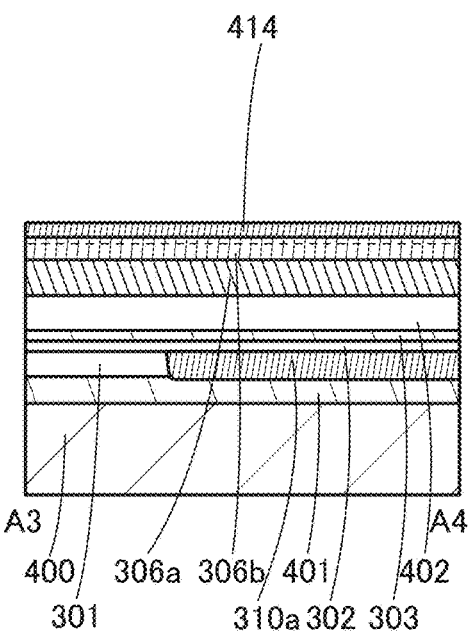
Figure 23A:
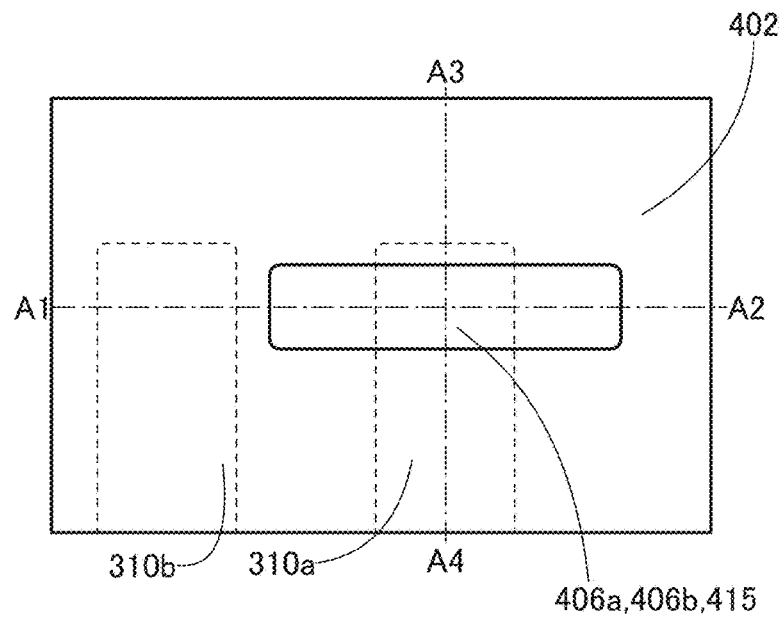
FIGS. 23A to 23C are a top view and cross-sectional views illustrating a method for manufacturing a transistor of one embodiment of the present invention.
Figure 23B:
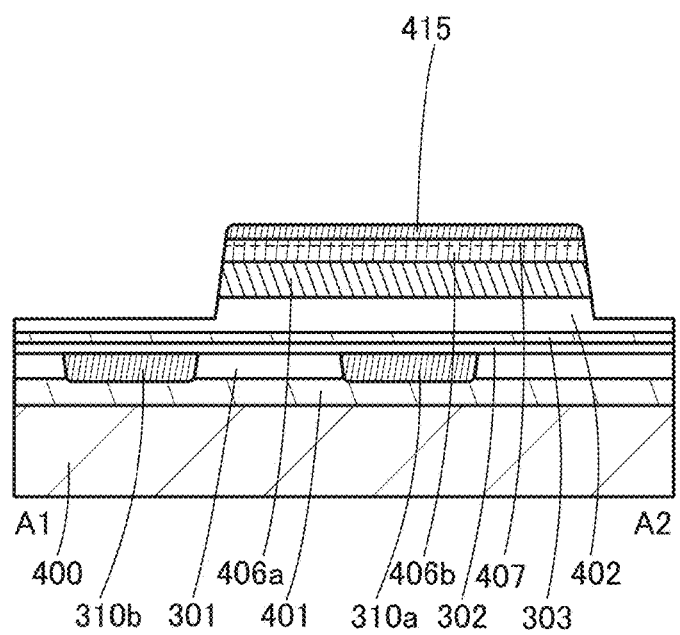
Figure 23C:
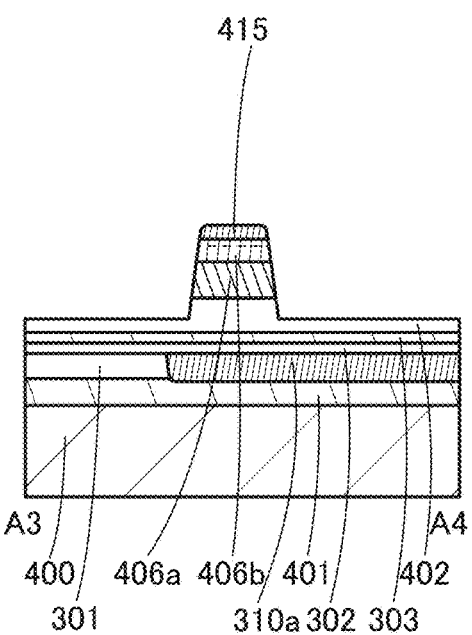

A method for manufacturing the transistor of the present invention in FIGS. 5A to 5C will be described below with reference to FIGS. 22A to 22C, FIGS. 23A to 23C, FIGS. 24A to 24C, FIGS. 25A to 25C, FIGS. 26A to 26C, FIGS. 27A to 27C, FIGS. 28A to 28C, FIGS. 29A to 29C, FIGS. 30A to 30C, FIGS. 31A to 31C, and FIGS. 32A to 32C. Note that the process up to the formation of the conductor 414 is similar to that in Method 1 for manufacturing a transistor (see FIGS. 22A to 22C).

Next, the insulator 306a, the insulator 306b, and the conductor 414 are processed by a lithography method or the like, whereby the multilayer film including the insulator 406a, the semiconductor 406b, and the conductor 415 is formed. Here, a top surface of the insulator 306b is damaged when the conductor 414 is formed, whereby the region 407 is formed. Since the region 407 includes a region where the resistance of the semiconductor 406b is reduced, the contact resistance between the conductor 415 and the semiconductor 406b is reduced. Note that when the multilayer film is formed, the insulator 402 is also subjected to etching to have a thinned region in some cases. That is, the insulator 402 may have a projecting portion in a region in contact with the multilayer film (see FIGS. 23A to 23C).

Then, an insulator 446 is formed, and a conductor 426 is formed over the insulator 446. The conductor 426 is formed so as to fill a step portion of a top surface of the insulator 446. Therefore, a CVD method (an MCVD method, in particular) is preferred. A multilayer film of a conductor deposited by an ALD method or the like and a conductor deposited by a MCVD method is preferred as the conductor 426 in some cases to increase adhesion between the insulator 446 and the conductor 426 deposited by an MCVD method. For example, a titanium nitride film may be deposited by an ALD method, and then a tungsten film may be deposited by a MCVD method.

Figure 24A:
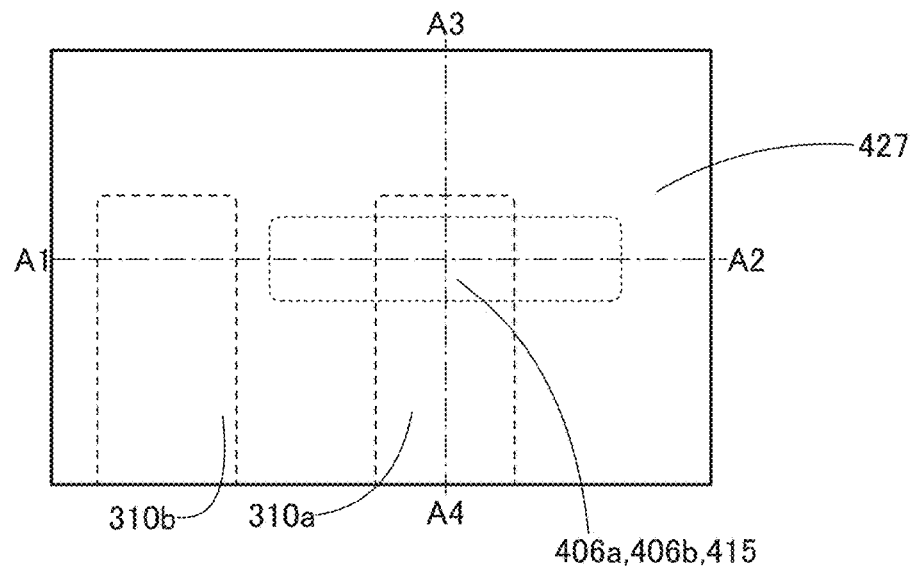
FIGS. 24A to 24C are a top view and cross-sectional views illustrating a method for manufacturing a transistor of one embodiment of the present invention.
Figure 24B:
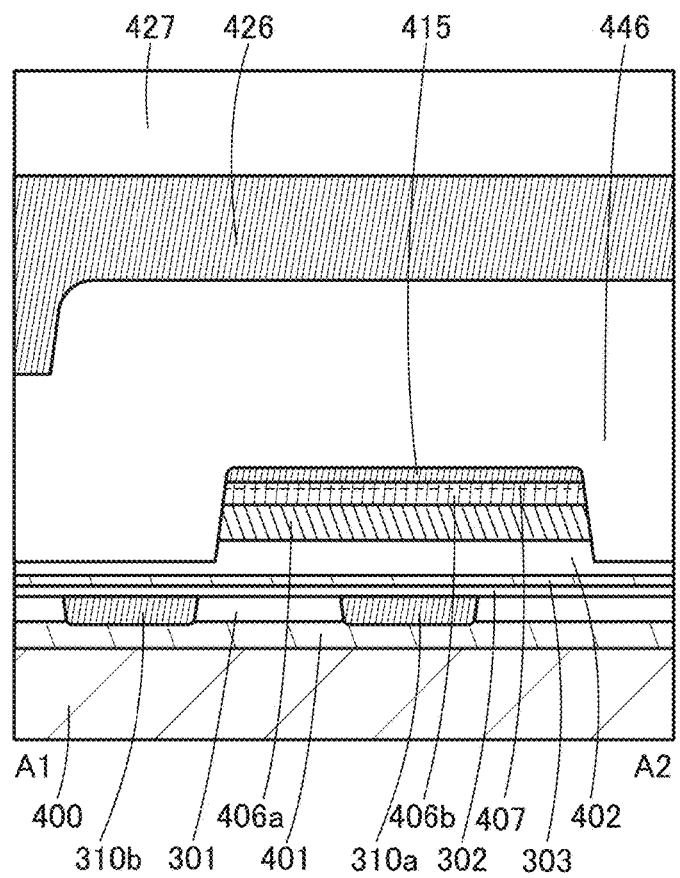
Figure 24C:
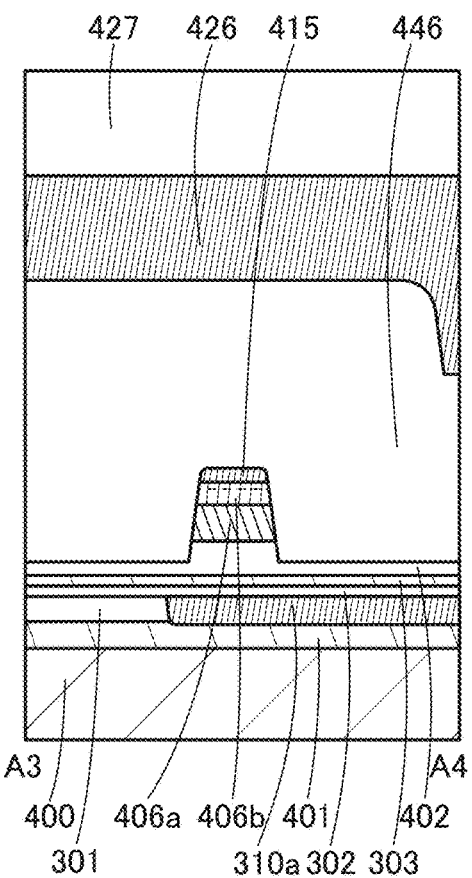
Figure 27A:
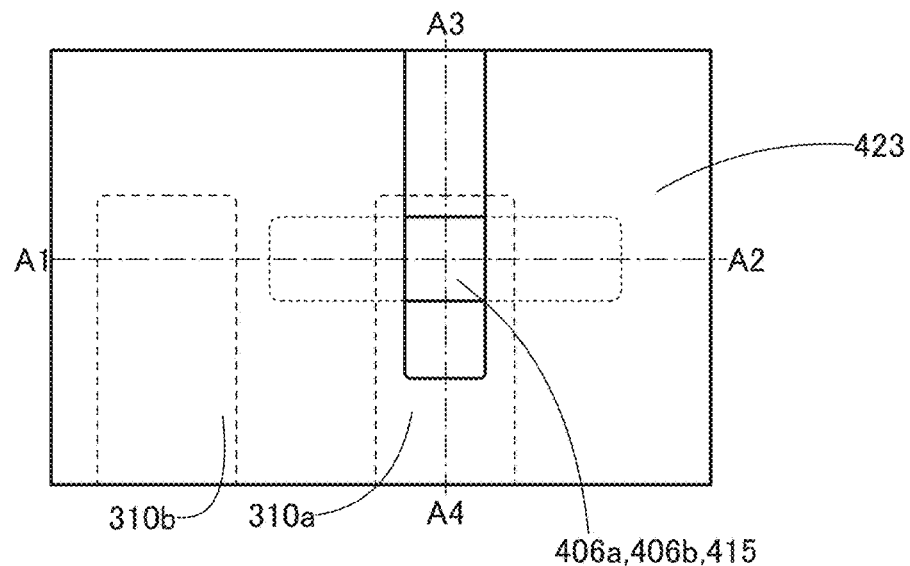
FIGS. 27A to 27C are a top view and cross-sectional views illustrating a method for manufacturing a transistor of one embodiment of the present invention.
Figure 27B:
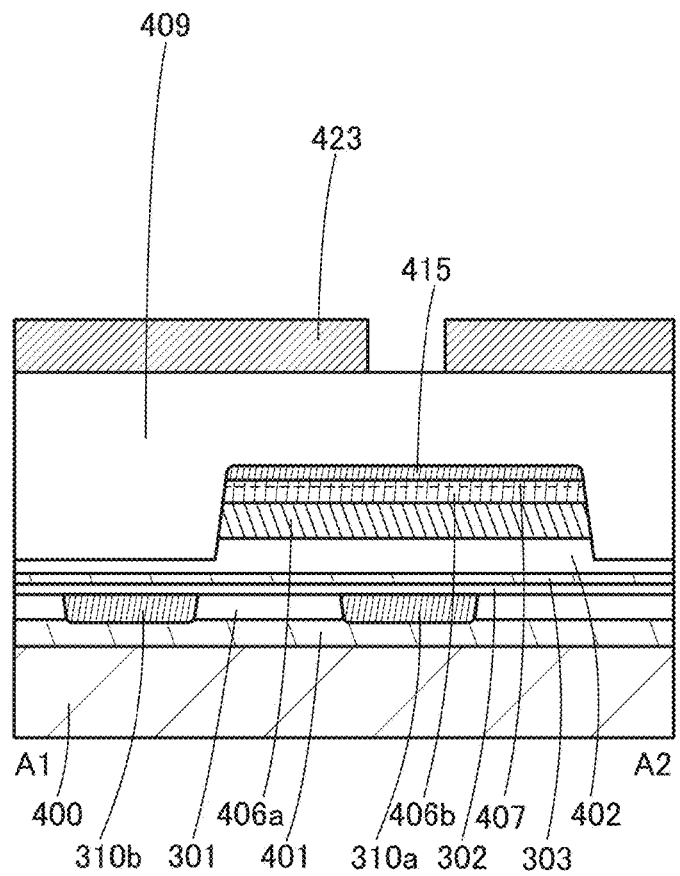
Figure 27C:
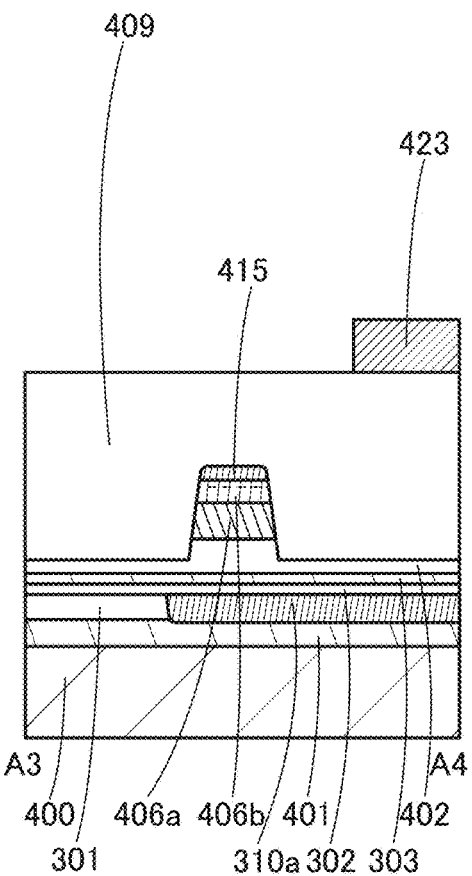
Figure 30A:
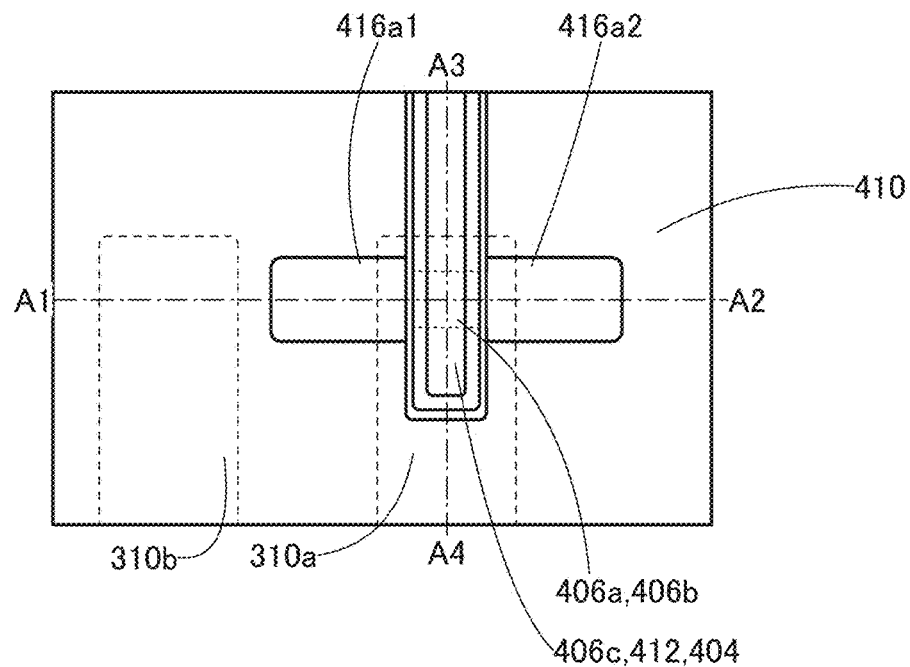
FIGS. 30A to 30C are a top view and cross-sectional views illustrating a method for manufacturing a transistor of one embodiment of the present invention.
Figure 30B:
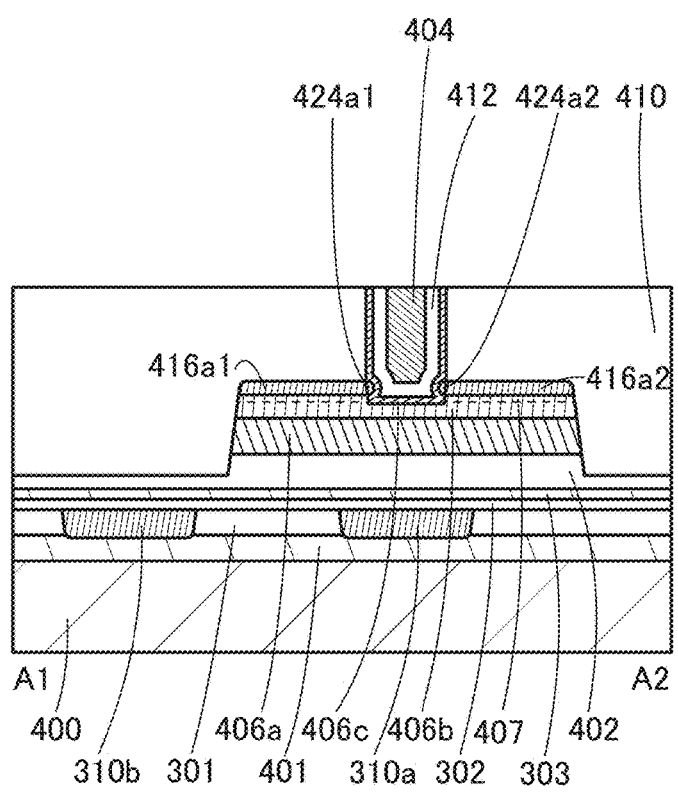
Figure 30C:
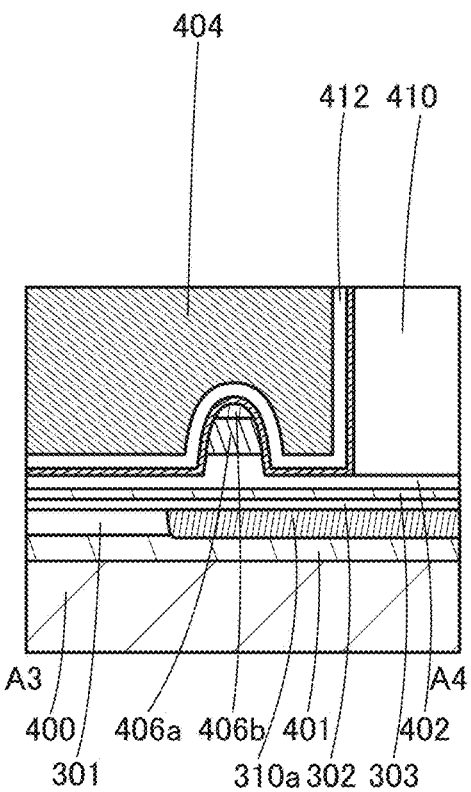
Figure 31A:
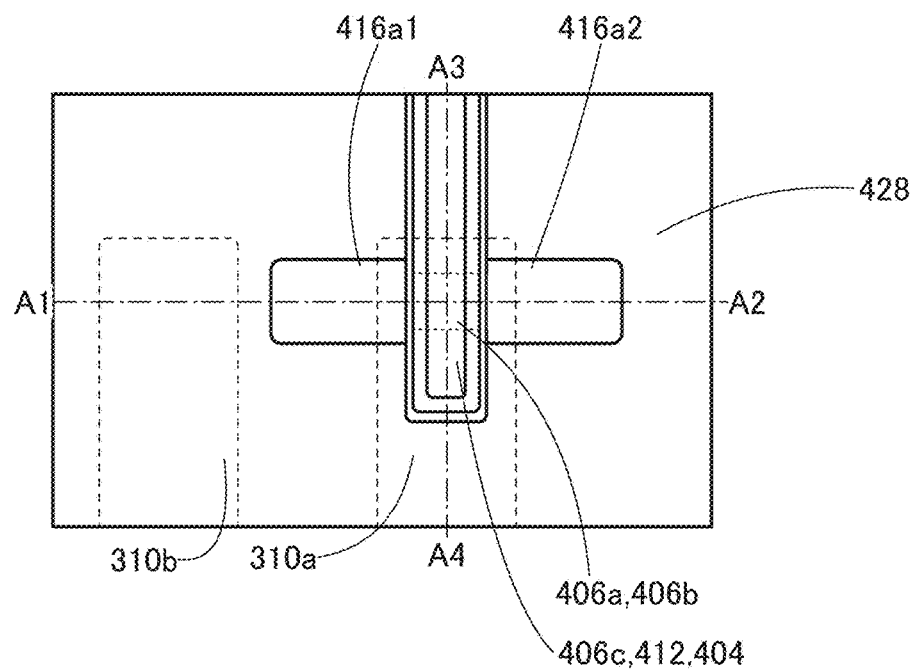
FIGS. 31A to 31C are a top view and cross-sectional views illustrating a method for manufacturing a transistor of one embodiment of the present invention.
Figure 31B:
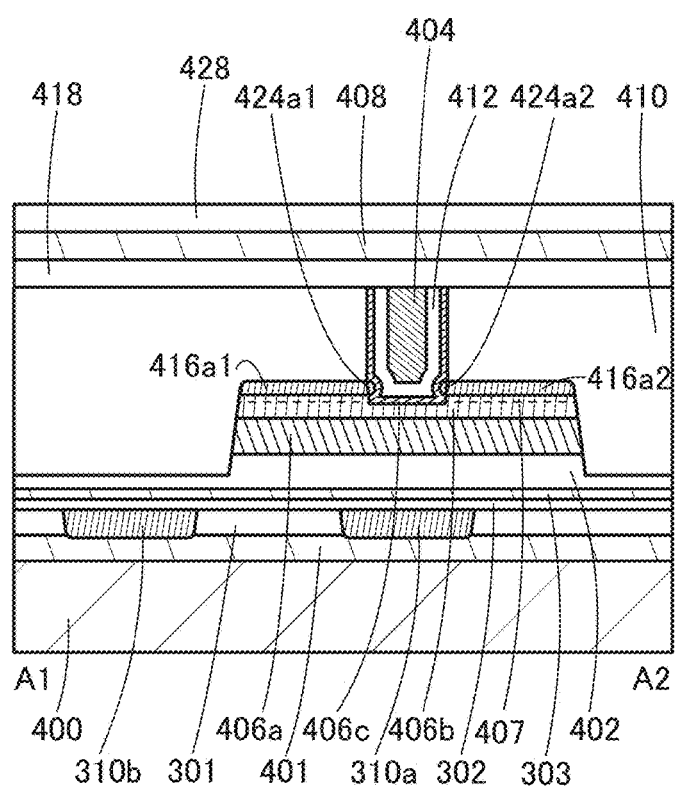
Figure 31C:
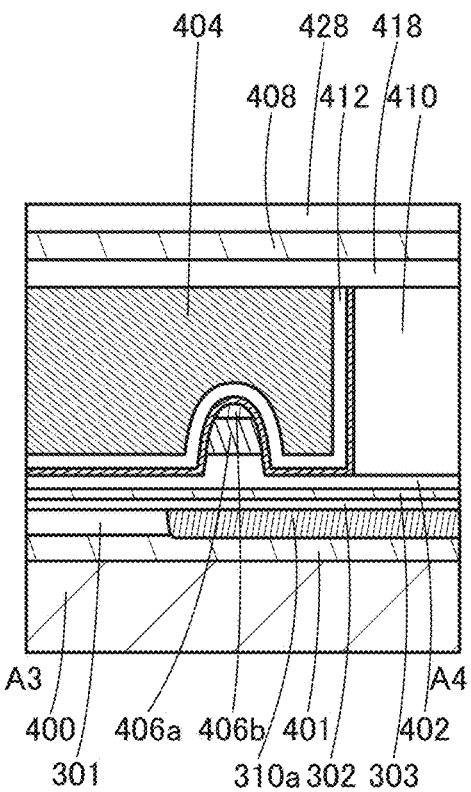

Next, an insulator 427 is formed over the conductor 426 (see FIGS. 24A to 24C)

Next, first CMP treatment is performed on the insulator 427 and the conductor 426 until the thickness of the conductor 426 is reduced to about half. Slurry (a chemical solution containing abrasive grains) used in the first CMP treatment is desirably suitable for processing of the insulator (see FIGS. 25A to 25C).

Next, second CMP treatment is performed on the remaining conductor 426 and the insulator 446 until the insulator 446 is exposed and the surface of the insulator 446 is flattened, whereby an insulator 409 is formed. In the second CMP treatment, it is desirable to use slurry prepared so that polishing rate of the insulator 446 is as low as possible as compared with that of the conductor 426. Using the slurry, the insulator 446 may have a further flattened surface, which is preferable. It is further preferable that a CMP treatment apparatus have an endpoint detecting function which notifies that the insulator 446 is exposed in the second CMP treatment. By the endpoint detecting function, controllability of the thickness of the insulator 446 after the second CMP treatment may be improved, which is preferable (see FIGS. 26A to 26C).

Alternatively, without forming the conductor over the insulator 446 and the insulator over the conductor, the insulator 409 may be formed such that the top surface thereof is flattened by CMP treatment or the like performed on the conductor 446. For example, the top surface of the insulator 446 may have flatness immediately after the film formation. However, the top surface of the insulator 446 is not necessarily flat.

Next, a resist mask 423 is formed over the insulator 409 by a lithography method or the like. Here, in order to improve the adhesion between the top surface of the insulator 409 and the resist mask, for example, an organic film may be provided between the top surface of the insulator 409 and the resist mask 423. Alternatively, a single layer of a conductor or a stacked-layer film of a conductor and an insulator may be formed over the insulator 409 to form a hard mask by a lithography method (see FIGS. 27A to 27C).

Next, the insulator 409 is processed by a dry etching method until part of the insulator 402 is exposed, so that the insulator 410 is formed. At that time, etching of the insulator 402 is performed until a top surface of the insulator 303 is exposed in some cases.

Next, the conductor 415 is subjected to the processing using dry etching or the like so as to be separated into the conductor 416a1 and the conductor 416a2.

At this time, the semiconductor 406b has an exposed region. Here, the exposed region of the semiconductor 406b, which is the region 407, is removed by the above etching step of the conductor 415 in some cases (see FIGS. 28A to 28C).

When the above processing is performed by dry etching, an impurity such as the residual components of the etching gas is attached to the exposed region of the semiconductor 406b in some cases. For example, when a chlorine-based gas is used as an etching gas, chlorine and the like are attached in some cases. Furthermore, when a hydrocarbon-based gas is used as an etching gas, carbon, hydrogen, and the like are attached in some cases. When the substrate is exposed to air after the dry etching, the exposed region of the semiconductor 406b, and the like corrode in some cases. Thus, plasma treatment using an oxygen gas that is successively performed after the dry etching is preferably performed because the impurity can be removed and corrosion of the exposed region of the semiconductor 406b and the like can be prevented.

Alternatively, the impurity may be reduced by cleaning treatment using diluted hydrofluoric acid or the like or cleaning treatment using ozone or the like, for example. Note that different types of cleaning treatment may be combined. In such a manner, the exposed region of the semiconductor 406b, i.e., a channel formation region has high resistance.

Meanwhile, in the region 407 where the conductors 416a1 and 416a2 and the top surface of the semiconductor 406b overlap with each other, a value of contact resistance between the conductors 416a1 and 416a2 and the semiconductor 406b is preferably decreased; thus, favorable transistor characteristics can be obtained.

Next, treatment using plasma containing oxygen is performed. By performing the plasma treatment containing oxygen, the side surface of the conductor 416a1 is oxidized, so that the insulator 424a1 is formed. In addition, the side surface of the conductor 416a2 is oxidized, so that the insulator 424a2 is formed. For example, when a conductor including tungsten and silicon is used for each of the conductor 416a1 and the conductor 416a2, the insulator 424a1 and the insulator 424a2 are each a silicon oxide by performance of the plasma treatment containing oxygen.

For the plasma treatment containing oxygen, high-density plasma may be used. By performance of the high-density plasma treatment containing oxygen, the side surface of the conductor 416a1 and the side surface of the conductor 416a2 can be efficiently oxidized.

By performing the plasma treatment containing oxygen, oxygen radicals are generated, and excess oxygen can be taken into a region where the top surface and side surface of the semiconductor 406b and the side surface of the insulator 406a are exposed, i.e., a region including a channel formation region, so that oxygen vacancies in the channel formation region can be reduced (see FIGS. 29A to 29C).

Next, an insulator to be the insulator 406c is formed, and an insulator to be the insulator 412 is formed over the insulator to be the insulator 406c. The insulator to be the insulator 406c and the insulator to be the insulator 412 are formed to have a uniform thickness along bottom and side surfaces of an opening formed in the insulator 410 and the conductors 416a1 and 416a2. Therefore, an ALD method is preferably used.

Next, a conductor to be the conductor 404 is formed. The conductor to be the conductor 404 can be formed by a sputtering method, a CVD method, an MBE method, a PLD method, an ALD method, or the like. The conductor to be the conductor 404 is formed so as to fill the opening formed in the insulator 410 and the like. Therefore, a CVD method (an MCVD method, in particular) is preferred. A multilayer film of a conductor deposited by an ALD method or the like and a conductor deposited by a CVD method is preferred in some cases to increase adhesion between the insulator 410 and the like and the conductor to be the conductor 404 formed by a MCVD method. For example, a titanium nitride film or a tantalum nitride film may be deposited by an ALD method, and then a tungsten film may be deposited by a MCVD method.

Next, the conductor to be the conductor 404, the insulator to be the insulator 412, and the insulator to be the insulator 406c are polished and flattened by CMP or the like from the top surface of the conductor to be the conductor 404 until the top surface of the insulator 410 is exposed, so that the conductor 404, the insulator 412, and the insulator 406c are formed. Accordingly, the conductor 404 functioning as the gate electrode can be formed in a self-aligned manner without using a lithography method. The conductor 404 functioning as the gate electrode can be formed without considering alignment accuracy of the conductor 404 functioning as the gate electrode and the conductors 416a1 and 416a2 functioning as the source and drain electrodes; as a result, the area of the semiconductor device can be reduced. Furthermore, a lithography step is not necessary, and accordingly an improvement of productivity due to simplification of the process is expected (see FIGS. 30A to 30C).

Next, the insulator 418 is formed over the insulator 410, the insulator 412, and the insulator 406c, and the insulator 408 is formed over the insulator 418. An aluminum oxide film is preferably formed as the insulator 408 using plasma containing oxygen, so that oxygen in the plasma can be added to the top surface of the insulator 418 as excess oxygen.

Second heat treatment may be performed at any time after the formation of the insulator to be the insulator 408. By the second heat treatment, the excess oxygen contained in the insulator 418 is moved to the semiconductor 406b through the insulators 410, 402, and 406a. Furthermore, the excess oxygen contained in the insulator 418 is moved to the semiconductor 406b through the insulator 412. Furthermore, the excess oxygen contained in the insulator 418 is moved to the semiconductor 406b through the insulator 406c. Since excess oxygen is moved to the semiconductor 406b by passing three paths as described above, defects (oxygen vacancies) in the semiconductor 406b can be reduced.

Note that the second heat treatment may be performed at a temperature such that excess oxygen (oxygen) in the insulator 418 is diffused to the semiconductor 406b. For example, the description of the first heat treatment may be referred to for the second heat treatment. The second heat treatment is preferably performed at a temperature lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulator 402 can be inhibited. Note that the second heat treatment is not necessarily performed when heating during formation of the films can work as heat treatment comparable to the second heat treatment.

Next, the insulator 428 is formed over the insulator 408. The insulator 428 can be formed by a sputtering method, a CVD method, an MBE method, a PLD method, an ALD method, or the like (see FIGS. 31A to 31C).

Next, the opening reaching the conductor 310b through the insulators 428, 408, 418, 410, 402, 303, and 302; the openings reaching the conductor 416a1 and the conductor 416a2 through the insulators 428, 408, 418, and 410; and the opening reaching the conductor 404 through the insulators 428, 408, and 418 are formed by a lithography method or the like.

As another method of forming the opening, the following steps may be employed. A conductor is formed over the insulator 428, an insulator is formed over the conductor, and the conductor and the insulator are processed by a lithography method, so that a hard mask including the conductor and the insulator is formed. With use of the hard mask as the etching mask, the etching step is performed, so that the opening is formed. When the hard mask is used as the etching mask, the opening can be prevented from extending laterally or deformation. Note that the hard mask can have a single-layer structure of the insulator or the conductor.

The openings can be formed at once by performance of a lithography step. Alternatively, the openings may be formed separately by performance of lithography steps a plurality of times.

Figure 32A:
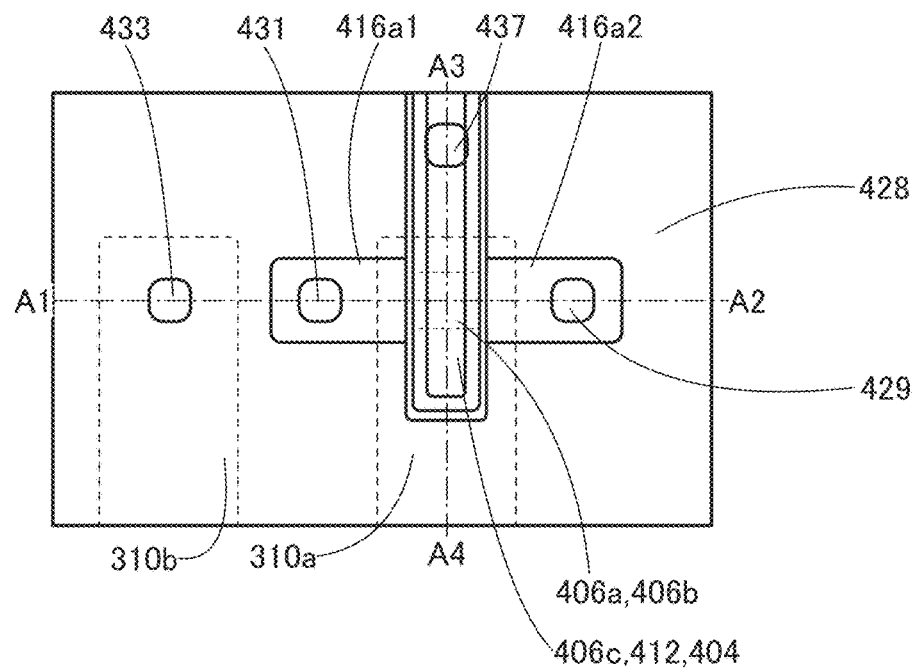
FIGS. 32A to 32C are a top view and cross-sectional views illustrating a method for manufacturing a transistor of one embodiment of the present invention.
Figure 32B:
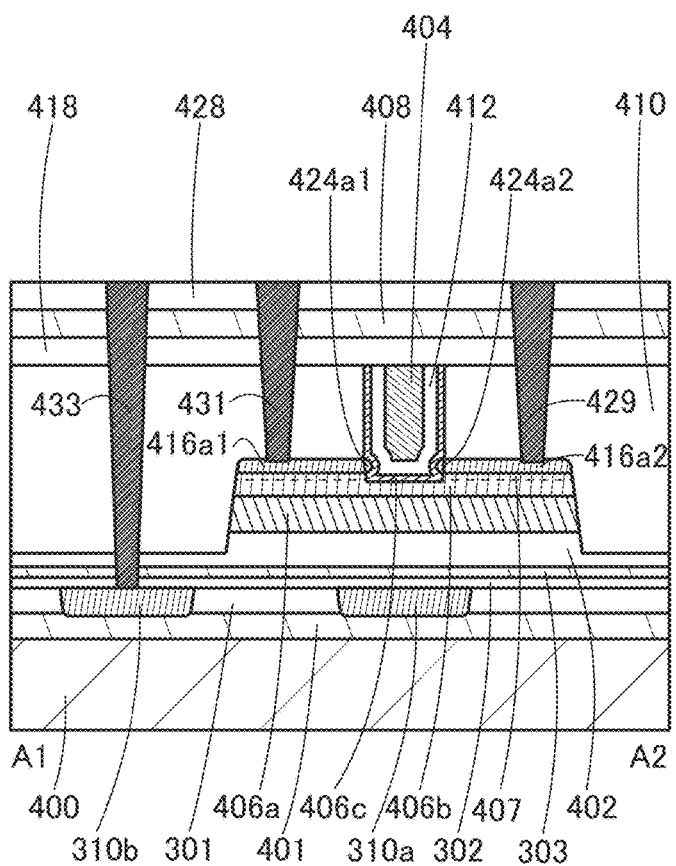
Figure 32C:
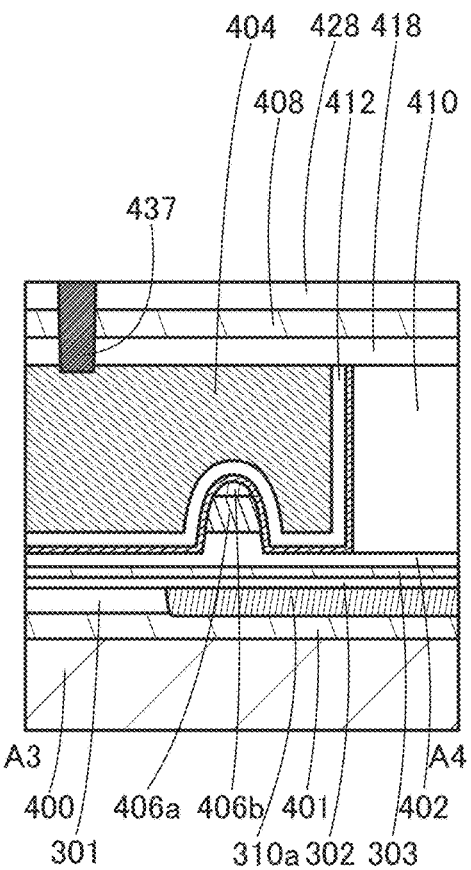

Next, the conductor 433, the conductor 431, the conductor 429, and the conductor 437 are embedded separately in the openings (see FIGS. 32A to 32C).

Next, a conductor is formed over the insulator 428 and the conductors 433, 431, 429, and 437 and processed by a lithography method or the like, so that the conductors 434, 432, 430, and 438 are formed. Through the above steps, the transistor in FIGS. 5A to 5C can be formed (see FIGS. 5A to 5C).

At least part of this embodiment can be implemented in combination with any of the other embodiments and the other examples described in this specification as appropriate.

Embodiment 5

<Memory Device 1>

Figure 33A:
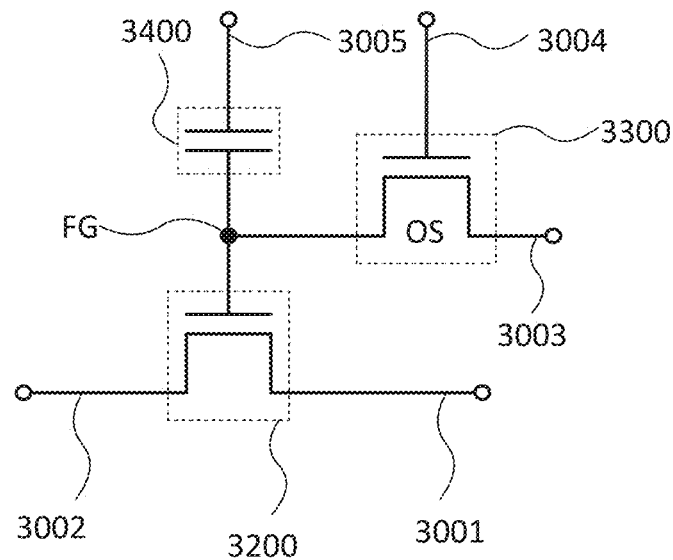
FIGS. 33A and 33B are circuit diagrams of memory devices of one embodiment of the present invention.
Figure 33B:
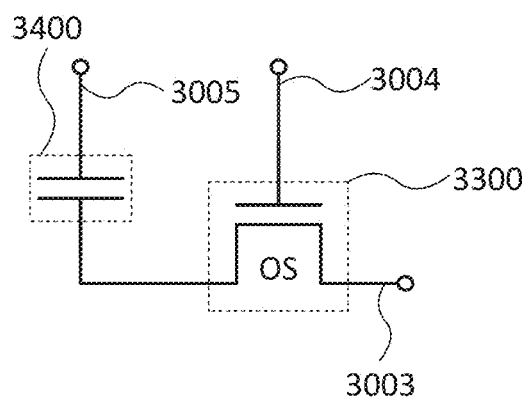

An example of a semiconductor device (memory device) which includes the transistor of one embodiment of the present invention, which can retain stored data even when not powered, and which has an unlimited number of write cycles is shown in FIGS. 33A and 33B.

The semiconductor device illustrated in FIG. 33A includes a transistor 3200 using a first semiconductor, a transistor 3300 using a second semiconductor, and a capacitor 3400. Note that any of the above-described transistors can be used as the transistor 3300.

The transistor 3300 is preferably a transistor with low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 33A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. A gate of the transistor 3200 and the other of the source and drain of the transistor 3300 are electrically connected to one electrode of the capacitor 3400. A fifth wiring 3005 is electrically connected to the other electrode of the capacitor 3400.

The semiconductor device in FIG. 33A has a feature that the potential of the gate of the transistor 3200 can be retained, and thus enables writing, retaining, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is off, so that the transistor 3300 is turned off. Thus, the charge is held at the node FG (retaining).

Since the off-state current of the transistor 3300 is extremely low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to make the transistor 3200 be in "on state". Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG in writing, even when the potential of the fifth wiring 3005 is $V_0$ ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell is read in read operation. For example, the fifth wiring 3005 of memory cells from which data is not read may be supplied with a potential at which the transistor 3200 is brought into "an off state" regardless of the potential supplied to the node FG, that is, a potential lower than $V_{th\_H}$, whereby only data of a desired memory cell can be read. Alternatively, a configuration in which only data of a desired memory cell can be read by supplying a potential at which the transistor 3200 is brought into a "conduction state" regardless of the potential supplied to the node FG, that is, a potential higher than $V_{th\_L}$ to the fifth wiring 3005 of memory cells from which data is not read may be employed.

<Structure 1 of Semiconductor Device>

Figure 34:
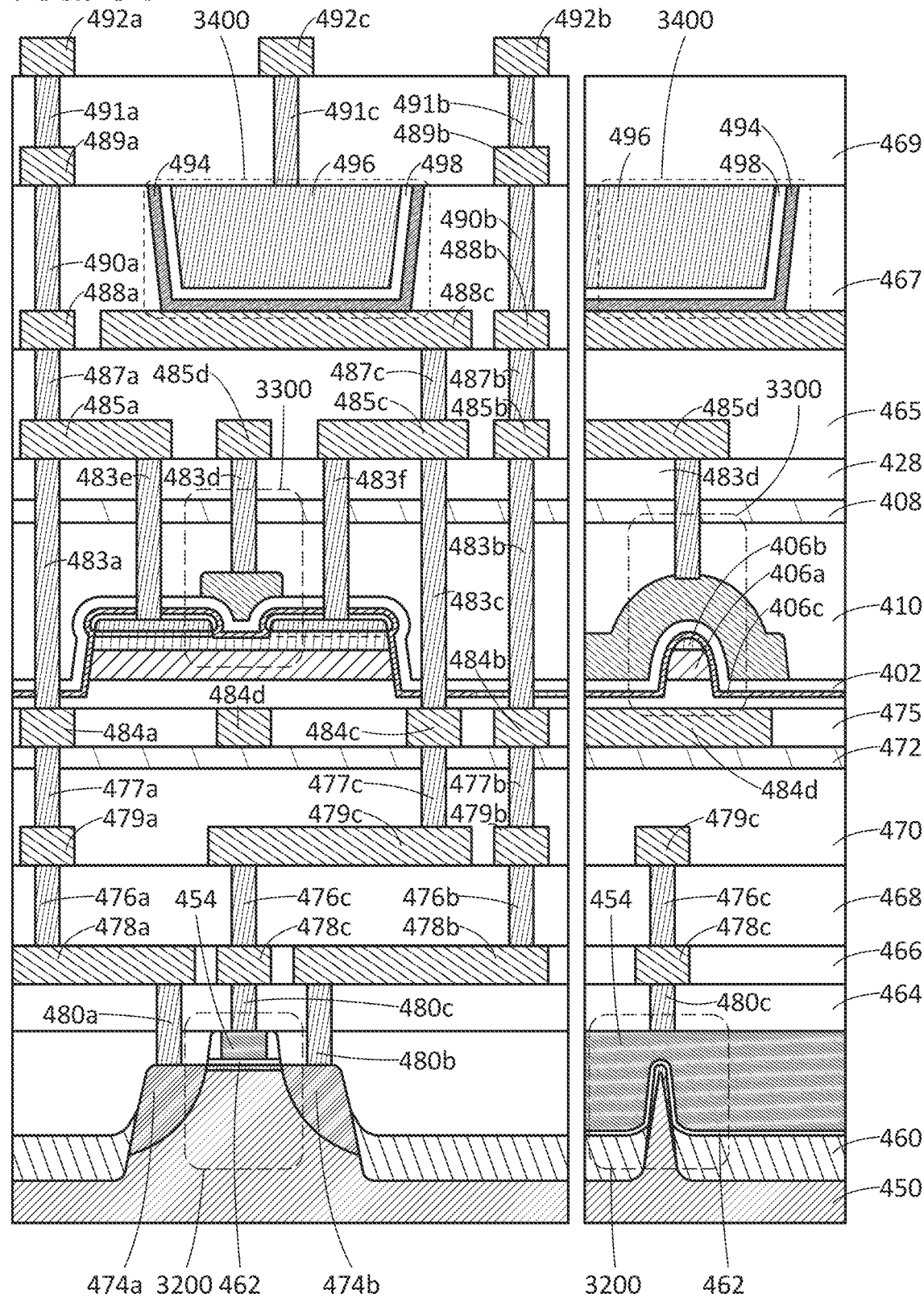
FIG. 34 is a cross-sectional view illustrating a semiconductor device of one embodiment of the present invention.

FIG. 34 is a cross-sectional view of the semiconductor device of FIG. 33A. The semiconductor device shown in FIG. 34 includes the transistor 3200, the transistor 3300, and the capacitor 3400. The transistor 3300 and the capacitor 3400 are provided over the transistor 3200. Note that as the transistor 3300, the transistor illustrated in FIGS. 4A and 4B is used, and as the capacitor 3400, the capacitor illustrated in FIG. 1 is used; however, the semiconductor device of this embodiment of the present invention is not limited to the above. The descriptions of the above transistor and the capacitor are referred to as appropriate.

Specifically, in the semiconductor device in FIG. 34, the transistor 3200 is a fin-type transistor. The effective channel width is increased in the fin-type transistor 3200, whereby the on-state characteristics of the transistor 3200 can be improved. In addition, since contribution of the electric field of the gate electrode can be increased, the off-state characteristics of the transistor 3200 can be improved. The transistor 3200 is a transistor using a semiconductor substrate 450. The transistor 3200 includes a region 474a in the semiconductor substrate 450, a region 474b in the semiconductor substrate 450, an insulator 462, and a conductor 454.

In the transistor 3200, the regions 474a and 474b have a function as a source region and a drain region. The insulator 462 has a function of a gate insulator. The conductor 454 has a function of a gate electrode. Therefore, the resistance of a channel formation region can be controlled by a potential applied to the conductor 454. In other words, conduction or non-conduction between the region 474a and the region 474b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity is provided in a region where the transistor 3200 is formed. Alternatively, the semiconductor substrate 450 may be an i-type semiconductor substrate.

A top surface of the semiconductor substrate 450 preferably has a (110) plane. Then, on-state characteristics of the transistor 3200 can be improved.

The regions 474a and 474b are regions including impurities imparting the p-type conductivity. Accordingly, the transistor 3200 has a structure of a p-channel transistor.

Note that although the transistor 3200 is illustrated as a p-channel transistor, the transistor 3200 may be an n-channel transistor.

Note that the transistor 3200 is separated from an adjacent transistor by a region 460 and the like. The region 460 is an insulating region.

The semiconductor illustrated in FIG. 34 includes an insulator 464, an insulator 466, an insulator 468, an insulator 470, an insulator 472, an insulator 475, the insulator 402, the insulator 410, the insulator 408, the insulator 428, an insulator 465, an insulator 467, an insulator 469, an insulator 498, a conductor 480a, a conductor 480b, a conductor 480c, a conductor 478a, a conductor 478b, a conductor 478c, a conductor 476a, a conductor 476b, a conductor 476c, a conductor 479a, a conductor 479b, a conductor 479c, a conductor 477a, a conductor 477b, a conductor 477c, a conductor 484a, a conductor 484b, a conductor 484c, a conductor 484d, a conductor 483a, a conductor 483b, a conductor 483c, a conductor 483d, a conductor 483e, a conductor 483f, a conductor 485a, a conductor 485b, a conductor 485c, a conductor 485d, a conductor 487a, a conductor 487b, a conductor 487c, a conductor 488a, a conductor 488b, a conductor 488c, a conductor 490a, a conductor 490b, a conductor 489a, a conductor 489b, a conductor 491a, a conductor 491b, a conductor 491c, a conductor 492a, a conductor 492b, a conductor 492c, a conductor 494, a conductor 496, an insulator 406a, a semiconductor 406b, and an insulator 406c.

The insulator 464 is provided over the transistor 3200. The insulator 466 is placed over the insulator 464. The insulator 468 is placed over the insulator 466. The insulator 470 is over the insulator 468. The insulator 472 is over the insulator 470. The insulator 475 is over the insulator 472. The transistor 3300 is over the insulator 475. The insulator 408 is over the transistor 3300. The insulator 428 is over the insulator 408. The insulator 465 is over the insulator 428. The capacitor 3400 is over the insulator 465. The insulator 469 is over the capacitor 3400.

The insulator 464 includes an opening reaching the region 474a, an opening reaching the region 474b, and an opening reaching the conductor 454. In the corresponding openings, the conductor 480a, the conductor 480b, and the conductor 480c are embedded.

In addition, the insulator 466 includes an opening reaching the conductor 480a, an opening reaching the conductor 480b, and an opening reaching the conductor 480c. In the corresponding openings, the conductor 478a, the conductor 478b, and the conductor 478c are embedded.

The insulator 468 includes an opening reaching the conductor 478a, an opening reaching the conductor 478b, and an opening reaching the conductor 478c. In the corresponding openings, the conductor 476a, the conductor 476b, and the conductor 476c are embedded.

The conductor 479a in contact with the conductor 476a, the conductor 479b in contact with the conductor 476b, and the conductor 479c in contact with the conductor 476c are over the insulator 468. The insulator 472 includes an opening reaching the conductor 479a through the insulator 470, an opening reaching the conductor 479b through the insulator 470 and an opening reaching the conductor 479c through the insulator 470. In the corresponding openings, the conductor 477a, the conductor 477b, and the conductor 477c are embedded.

Furthermore, the insulator 475 includes an opening overlapping with the channel formation region of the transistor 3300, an opening reaching the conductor 477a, an opening reaching the conductor 477b, and an opening reaching the conductor 477c. In the corresponding openings, the conductor 484d, the conductor 484a, the conductor 484b, and the conductor 484c are embedded.

The conductor 484d may have a function as a bottom-gate electrode of the transistor 3300. Alternatively, for example, electrical characteristics such as the threshold voltage of the transistor 3300 may be controlled by application of a constant potential to the conductor 484d. Further alternatively, for example, the conductor 484d and the top gate electrode of the transistor 3300 may be electrically connected to each other. Thus, the on-state current of the transistor 3300 can be increased. A punch-through phenomenon can be suppressed; thus, stable electrical characteristics in the saturation region of the transistor 3300 can be obtained.

In addition, the insulator 402 includes an opening reaching the conductor 484a, an opening reaching the conductor 484c, and an opening reaching the conductor 484b.

The insulator 428 includes three openings reaching the conductor 484a, the conductor 484b, and the conductor 484c through the insulator 408, the insulator 410, and the insulator 402, two openings reaching a conductor of one of the source and drain electrodes of the transistor 3300 through the insulator 408 and the insulator 410, and an opening reaching a conductor of the gate electrode of the transistor 3300 through the insulator 408 and the insulator 410. In the corresponding openings, the conductors 483a, 483b, 483c, 483e, 483f, and 483d are embedded.

The conductor 485*a* in contact with the conductors 483*a* and 483*e*, the conductor 485*b* in contact with the conductor 483*b*, the conductor 485*c* in contact with the conductor 483*c* and the conductor 483*f*, and the conductor 485*d* in contact with the conductor 483*d* are over the insulator 428. The insulator 465 has an opening reaching the conductor 485*a*, an opening reaching the conductor 485*b*, and an opening reaching the conductor 485*c*. In the corresponding openings, the conductor 487*a*, the conductor 487*b*, and the conductor 487*c* are embedded.

The conductor 488*a* in contact with the conductor 487*a*, the conductor 488*b* in contact with the conductor 487*b*, and the conductor 488*c* in contact with the conductor 487*c* are over the insulator 465. In addition, the insulator 467 includes an opening reaching the conductor 488*a* and an opening reaching the conductor 488*b*. In the corresponding openings, the conductor 490*a* and the conductor 490*b* are embedded. The conductor 488*c* is in contact with the conductor 494 which is one of the electrodes of the capacitor 3400.

The conductor 489*a* in contact with the conductor 490*a* and the conductor 489*b* in contact with the conductor 490*b* are over the insulator 467. The insulator 469 includes an opening reaching the conductor 489*a*, an opening reaching the conductor 489*b*, an opening reaching the conductor 496 which is the other electrode of the capacitor 3400. In the respective openings, the conductor 491*a*, the conductor 491*b*, and the conductor 491*c* are embedded.

The conductor 492*a* in contact with the conductor 491*a*, the conductor 492*b* in contact with the conductor 491*b*, and the conductor 492*c* in contact with the conductor 491*c* are over the insulator 469.

The insulators 464, 466, 468, 470, 472, 475, 402, 410, 408, 428, 465, 467, 469, and 498 may each be formed to have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. In particular, as the insulator 498, for example, an insulator formed by oxidizing the conductor 494 may be used. Furthermore, for example, the insulator may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon oxide; silicon nitride oxide; or silicon nitride.

The insulator that has a function of blocking oxygen and impurities such as hydrogen is preferably included in at least one of the insulators 464, 466, 468, 470, 472, 475, 402, 410, 408, 428, 465, 467, 469, and 498. When an insulator that has a function of blocking oxygen and impurities such as hydrogen is placed near the transistor 3300, the electrical characteristics of the transistor 3300 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductors 480*a*, 480*b*, 480*c*, 478*a*, 478*b*, 478*c*, 476*a*, 476*b*, 476*c*, 479*a*, 479*b*, 479*c*, 477*a*, 477*b*, 477*c*, 484*a*, 484*b*, 484*c*, 484*d*, 483*a*, 483*b*, 483*c*, 483*d*, 483*e*, 483*f*, 485*a*, 485*b*, 485*c*, 485*d*, 487*a*, 487*b*, 487*c*, 488*a*, 488*b*, 488*c*, 490*a*, 490*b*, 489*a*, 489*b*, 491*a*, 491*b*, 491*c*, 492*a*, 492*b*, 492*c*, 494, and 496 may have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of stainless steel and the like may be used, for example, and a conductor containing aluminum, a conductor containing copper and titanium, a conductor containing copper and manganese, a conductor containing indium, tin, and oxygen, a conductor containing titanium and nitrogen, or the like may be used.

An oxide semiconductor is preferably used as the semiconductor 406*b*. However, silicon (including strained silicon), germanium, silicon germanium, silicon carbide, gallium arsenide, aluminum gallium arsenide, indium phosphide, gallium nitride, an organic semiconductor, or the like can be used in some cases.

As the insulator 406*a* and the insulator 406*c*, oxides containing one or more elements other than oxygen included in the semiconductor 406*b* are preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

The source or drain of the transistor 3200 is electrically connected to the conductor that is one of the source and drain electrodes of the transistor 3300 through the conductors 480*a*, 478*a*, 476*a*, 479*a*, 477*a*, 484*a*, 483*a*, 485*a*, and 483*e*. The conductor 454 that is the gate electrode of the transistor 3200 is electrically connected to the conductor that is the other of the source and drain electrodes of the transistor 3300 through the conductors 480*c*, 478*c*, 476*c*, 479*c*, 477*c*, 484*c*, 483*c*, 485*c*, and 483*f*.

The capacitor 3400 includes the conductor 494 which is one of the electrodes of the capacitor 3400 and electrically connected to one of the source electrode and the drain electrode of the transistor 3300 through the conductor 483*f*, the conductor 485*c*, the conductor 487*c*, and the conductor 488*c*, the insulator 498, the conductor 496 which is the other electrode of the capacitor 3400. The capacitor 3400 is preferably formed above or below the transistor 3300 because the semiconductor can be reduced in size.

Figure 35:
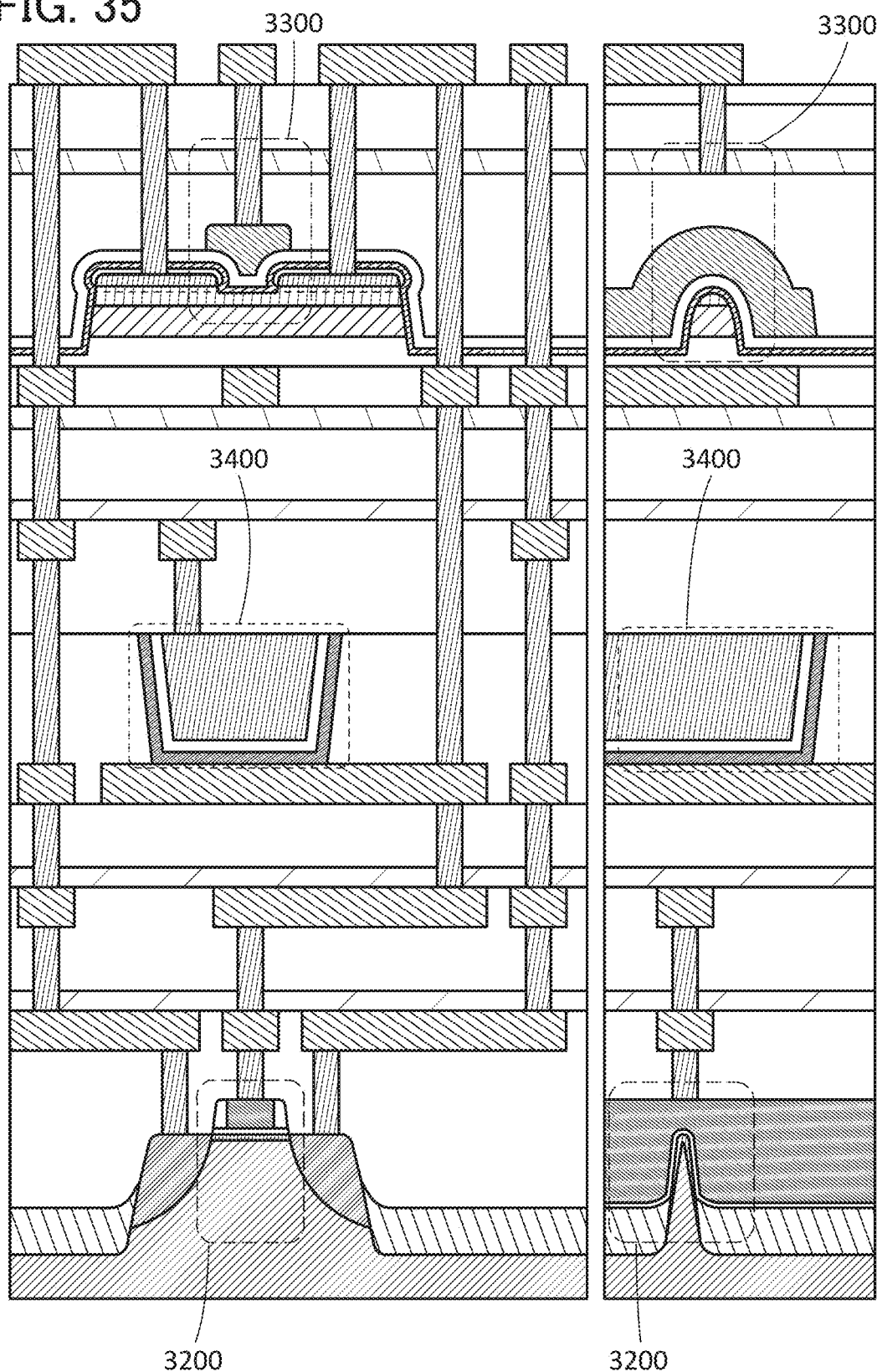
FIG. 35 is a cross-sectional view illustrating a semiconductor device of one embodiment of the present invention.

Although an example in which the transistor 3300 is over the transistor 3200 and the capacitor 3400 is over the transistor 3300 is shown in this embodiment, one or more transistors including a semiconductor similar to that included in the transistor 3300 may be provided over the transistor 3200. The capacitor 3400 may be provided over the transistor 3200, and the transistor 3300 may be provided over the capacitor 3400. With such a structure, the degree of integration of the semiconductor device can be further increased (see FIG. 35).

For the structures of other components, the description of FIGS. 4A to 4C and the like can be referred to as appropriate.

<Memory Device 2>

The semiconductor device in FIG. 33B is different from the semiconductor device in FIG. 33A in that the transistor 3200 is not provided. Also in this case, data can be written and retained in a manner similar to that of the semiconductor device in FIG. 33A.

Reading of data in the semiconductor device in FIG. 33B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one of the electrodes of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one of the electrodes of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one of the electrodes of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved. At least part of this embodiment can be implemented in combination with any of the other embodiments and the other examples described in this specification as appropriate.

Embodiment 6

<Structure 2 of Semiconductor Device>

In this embodiment, an example of a circuit including the transistor of one embodiment of the present invention will be described with reference to drawings.

<Cross-Sectional Structure>

FIGS. 36A and 36B are cross-sectional views of a semiconductor device of one embodiment of the present invention. In FIG. 36A, X1-X2 direction represents a channel length direction, and in FIG. 36B, Y1-Y2 direction represents a channel width direction. The semiconductor device illustrated in FIGS. 36A and 36B includes a transistor 2200 containing a first semiconductor material in a lower portion and a transistor 2100 containing a second semiconductor material in an upper portion. In FIGS. 36A and 36B, an example is illustrated in which the transistor illustrated in FIGS. 4A to 4C is used as the transistor 2100 containing the second semiconductor material.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor using an oxide semiconductor and described in the above embodiment as an example can have excellent subthreshold characteristics and a minute structure. Furthermore, the transistor can operate at a high speed because of its high switching speed and has low leakage current because of its low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which includes an oxide semiconductor.

FIGS. 36A and 36B illustrate a structure in which the transistor 2100 is provided over the transistor 2200 with an insulator 2201, an insulator 2207, and an insulator 2208 provided therebetween. A plurality of wirings 2202 are provided between the transistor 2200 and the transistor 2100. Furthermore, wirings and electrodes provided over and under the insulators are electrically connected to each other through a plurality of plugs 2203 embedded in the insulators. An insulator 2204 covering the transistor 2100 and a wiring 2205 over the insulator 2204 are provided.

Since the two kinds of transistors are stacked, the area occupied by the circuit can be reduced, allowing a plurality of circuits to be highly integrated.

Here, in the case where a silicon-based semiconductor material is used for the transistor 2200 provided in a lower portion, hydrogen in an insulator provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulator provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, providing the insulator 2207 having a function of preventing diffusion of hydrogen between the transistors 2100 and 2200 is particularly effective. The insulator 2207 makes hydrogen remain in the lower portion, thereby improving the reliability of the transistor 2200. In addition, since the insulator 2207 suppresses diffusion of hydrogen from the lower portion to the upper portion, the reliability of the transistor 2100 can also be improved.

The insulator 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing diffusion of hydrogen is preferably formed over the transistor 2100 to cover the transistor 2100 including an oxide semiconductor film. For the blocking film, a material that is similar to that of the insulator 2207 can be used, and in particular, an aluminum oxide film is preferably used. With the aluminum oxide film, excess oxygen can be added to the insulator under the aluminum oxide film in the deposition, and the excess oxygen moves to the oxide semiconductor layer of the transistor 2100 by heat treatment, which has an effect of repairing a defect in the oxide semiconductor layer. The aluminum oxide film has a high shielding (blocking) effect of preventing transmission of both oxygen and impurities such as hydrogen and moisture. Thus, by using the aluminum oxide film as the blocking film covering the transistor 2100, release of oxygen from the oxide semiconductor film included in the transistor 2100 can be prevented and entry of water and hydrogen into the oxide semiconductor film can be prevented. Note that as the block film, the insulator 2204 having a stacked-layer structure may be used, or the block film may be provided under the insulator 2204.

Note that the transistor 2200 can be a transistor of various types without being limited to a planar type transistor. For example, the transistor 2200 can be a fin-type transistor, a tri-gate transistor, or the like. An example of a cross-sectional view in this case is shown in FIGS. 36E and 36F. An insulator 2212 is provided over a semiconductor substrate 2211. The semiconductor substrate 2211 includes a projecting portion with a thin tip (also referred to as a fin). Note that an insulator may be provided over the projecting portion. The insulator functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulator 2214 is provided over the projecting portion of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 has the projecting portion; however, the semiconductor device of one embodiment of the present invention is not limited thereto. For example, a semiconductor region having a projecting portion may be formed by processing an SOI substrate.

At least part of this embodiment can be implemented in combination with any of the other embodiments and the other examples described in this specification as appropriate.

Embodiment 7

[CMOS Circuit]

A circuit diagram in FIG. 36C shows a configuration of a so-called CMOS circuit in which a p-channel transistor 2200 and an n-channel transistor 2100 are connected to each other in series and in which gates of them are connected to each other.

[Analog Switch]

A circuit diagram in FIG. 36D shows a configuration in which sources of the transistors 2100 and 2200 are connected to each other and drains of the transistors 2100 and 2200 are connected to each other. With such a configuration, the transistors can function as what is called an analog switch. At least part of this embodiment can be implemented in combination with any of the other embodiments and the other examples described in this specification as appropriate.

Embodiment 8

<CPU>

A CPU including a semiconductor device such as any of the above-described transistors or the above-described memory device is described below.

Figure 37:
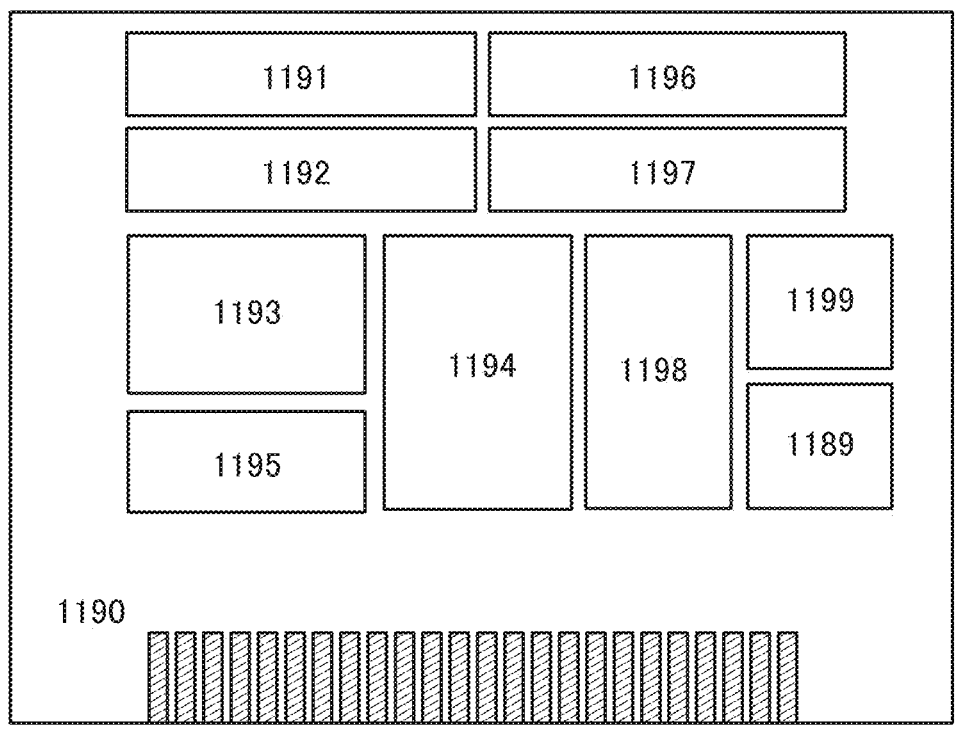
FIG. 37 is a block diagram illustrating a CPU of one embodiment of the present invention.

FIG. 37 is a block diagram illustrating a configuration example of a CPU including any of the above-described transistors as a component.

The CPU illustrated in FIG. 37 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 37 is just an example in which the configuration is simplified, and an actual CPU may have a variety of configurations depending on the application. For example, the CPU may have the following configuration: a structure including the CPU illustrated in FIG. 37 or an arithmetic circuit is considered as one core; a plurality of such cores is included; and the cores operate in parallel with each other. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

In the CPU illustrated in FIG. 37, a memory cell is provided in the register 1196. For the memory cell of the register 1196, any of the above-described transistors, the above-described memory device, or the like can be used.

In the CPU illustrated in FIG. 37, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 38:
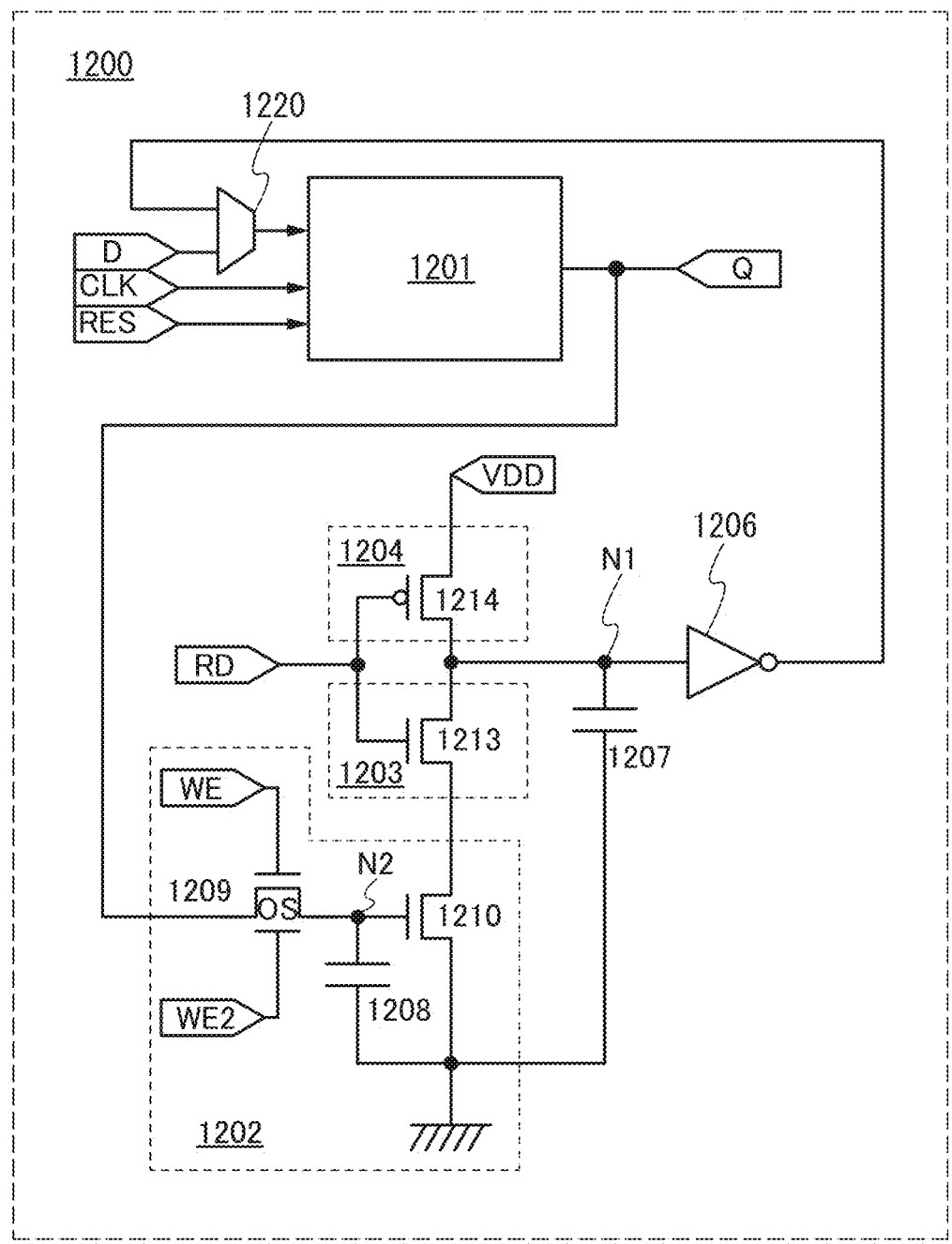
FIG. 38 is a circuit diagram of a memory element of one embodiment of the present invention.

FIG. 38 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node N2. One of a source and a drain of the transistor 1210 is electrically connected to a wiring which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node N1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 38 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 38, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 38, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a film using a semiconductor other than an oxide semiconductor or in the substrate 1190 can be used for the rest of the transistors.

As the circuit 1201 in FIG. 38, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the state of the transistor 1210 (on state or the off state) is determined depending on the signal retained by the capacitor 1208, and the signal can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the storage device can be returned to the same state as that before the power supply is stopped. Therefore, the power supply can be stopped even for a short time in the processor or one or more of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency (RF) tag.

At least part of this embodiment can be implemented in combination with any of the other embodiments and the other examples described in this specification as appropriate.

Embodiment 9

<Imaging Device>

Figure 39A:
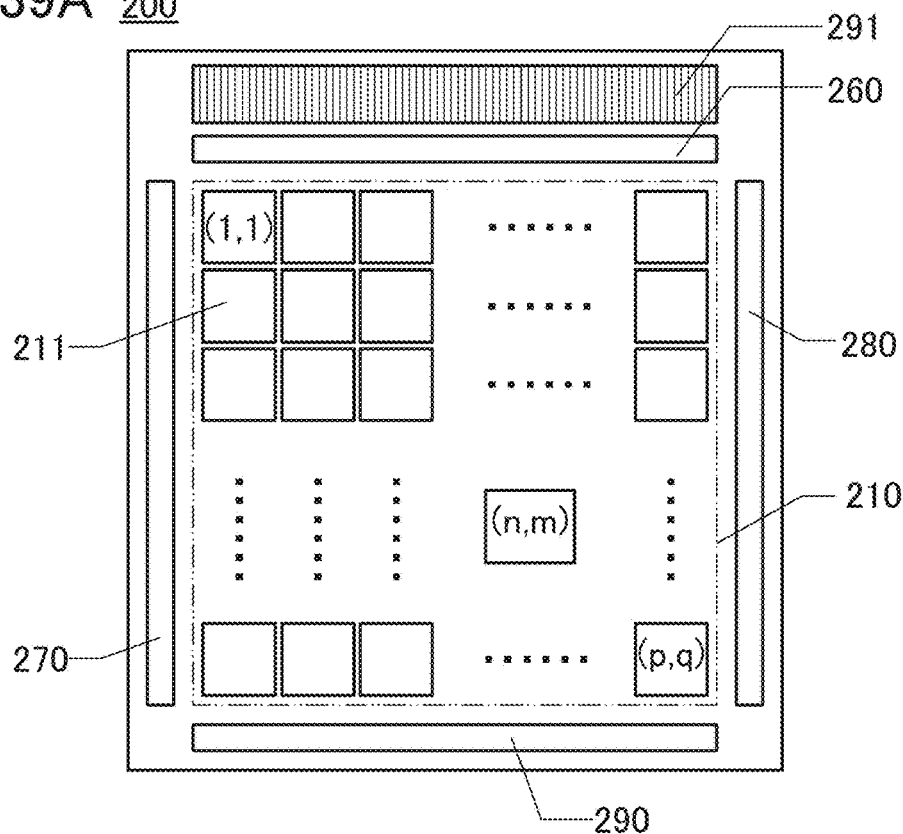
FIGS. 39A and 39B are plan views of an imaging device.

FIG. 39A is a top view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix of p rows and q columns (p and q are each an integer of 2 or more). The peripheral circuit 260, the peripheral circuit 270, the peripheral circuit 280, and the peripheral circuit 290 are each connected to a plurality of pixels 211 and each have a function of supplying a signal for driving the plurality of pixels 211. In this specification and the like, in some cases, "a peripheral circuit" or "a driver circuit" indicates all of the peripheral circuits 260, 270, 280, and 290. For example, the peripheral circuit 260 can be regarded as part of the peripheral circuit.

In addition, the imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Part or the whole of the peripheral circuit may be mounted using a semiconductor device such as an IC. Note that as the peripheral circuit, one or more of the peripheral circuits 260, 270, 280, and 290 may be omitted.

Figure 39B:
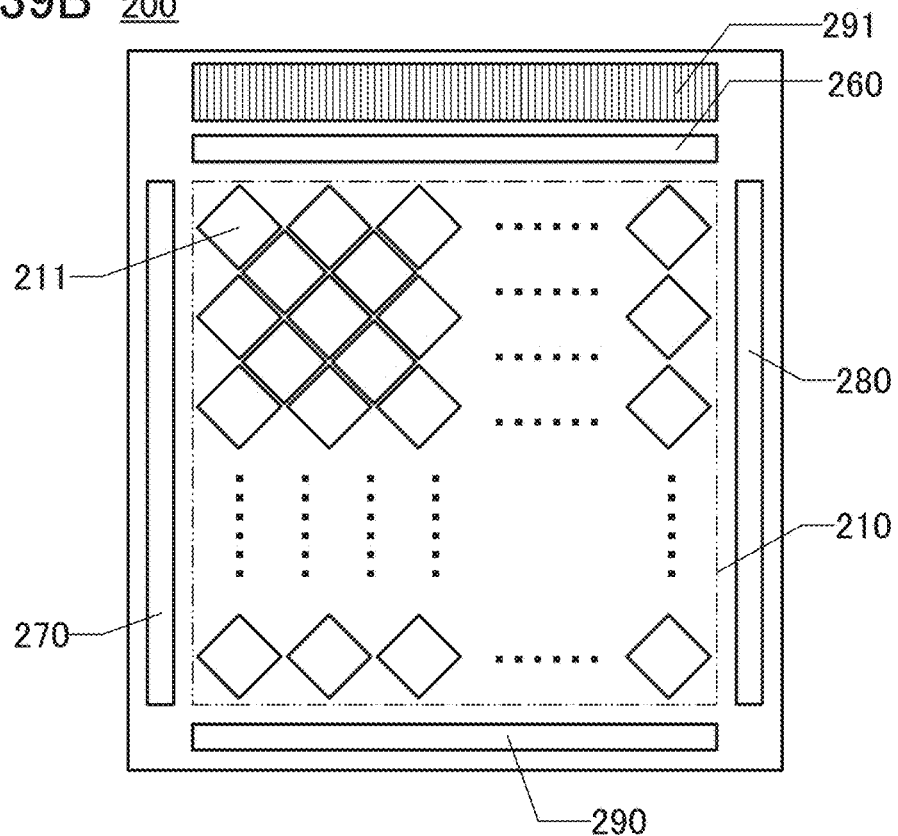

As illustrated in FIG. 39B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

Configuration Example 1 of Pixel

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 40A:
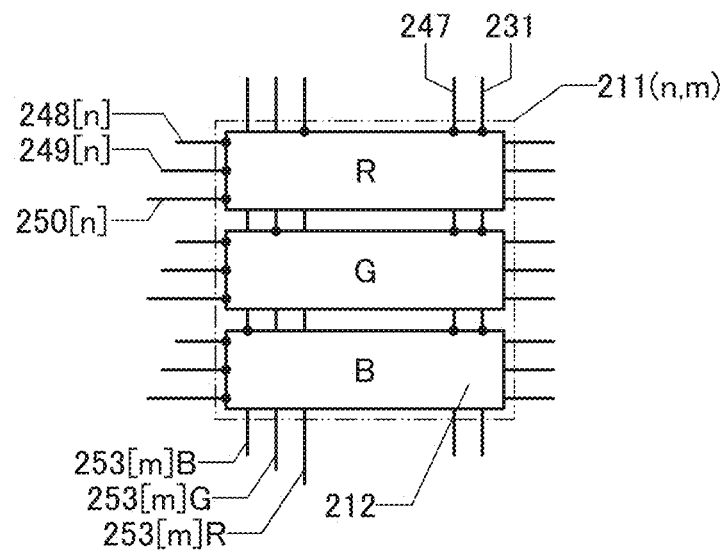
FIGS. 40A and 40B are plan views of pixels of an imaging device.

FIG. 40A is a top view showing an example of the pixel 211 with which a color image is obtained. The pixel 211 illustrated in FIG. 40A includes a subpixel 212 provided with a color filter that transmits light in a red (R) wavelength range (also referred to as a subpixel 212R), a subpixel 212 provided with a color filter that transmits light in a green (G) wavelength range (also referred to as a subpixel 212G), and a subpixel 212 provided with a color filter that transmits light in a blue (B) wavelength range (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248, the wiring 249, and the wiring 250 that are connected to the pixel 211 in the n-th row are referred to as a wiring 248[n], a wiring 249[n], and a wiring 250[n], respectively. For example, the wiring 253 connected to the pixel 211 in the m-th column is referred to as a wiring 253[m]. Note that in FIG. 40A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 40B:
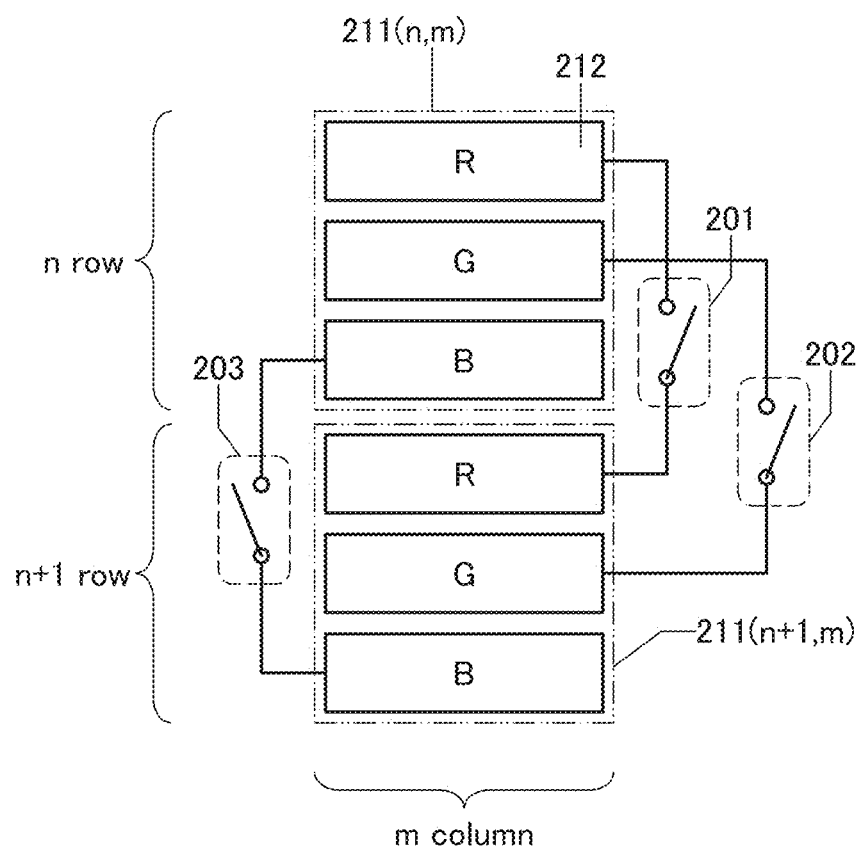

The imaging device 200 has a structure in which the subpixel 212 is electrically connected to the subpixel 212 in an adjacent pixel 211 which is provided with a color filter transmitting light in the same wavelength range as the subpixel 212, via a switch. FIG. 40B shows a connection example of the subpixels 212: the subpixel 212 in the pixel 211 arranged in the n-th (n is an integer greater than or equal to 1 and less than or equal to p) row and the m-th (m is an integer greater than or equal to 1 and less than or equal to q) column and the subpixel 212 in the adjacent pixel 211 arranged in an (n+1)-th row and the m-th column. In FIG. 40B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter that transmits yellow (Y) light may be provided, in addition to the subpixels 212 provided with the color filters that transmits red (R), green (G), and blue (B) light. The pixel 211 including the subpixel 212 provided with a color filter that transmits blue (B) light may be provided, in addition to the subpixels 212 provided with the color filters that transmits cyan (C), yellow (Y), and magenta (M) light. When the subpixels 212 that sense light with four different wavelength bands are provided in one pixel 211, the reproducibility of colors of an obtained image can be increased.

For example, in FIG. 40A, in regard to the subpixel 212 sensing light in a red wavelength band, the subpixel 212 sensing light in a green wavelength band, and the subpixel 212 sensing light in a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used as the filter, the imaging device 200 that senses infrared light can be provided.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 41A and 41B. With the lens 255, the photoelectric conversion element provided in the subpixel 212 can receive incident light efficiently. Specifically, as illustrated in FIG. 41A, light 256 enters a photoelectric conversion element 220 through the lens 255, the filter 254 (a filter 254R, a filter 254G, and a filter 254B), a pixel circuit 230, and the like which are provided in the pixel 211.

However, part of the light 256 indicated by arrows might be blocked by some wirings 257 as indicated by a region surrounded with dashed-dotted lines. Thus, a preferable structure is such that the lens 255 and the filter 254 are provided on the photoelectric conversion element 220 side as illustrated in FIG. 41B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 41A:
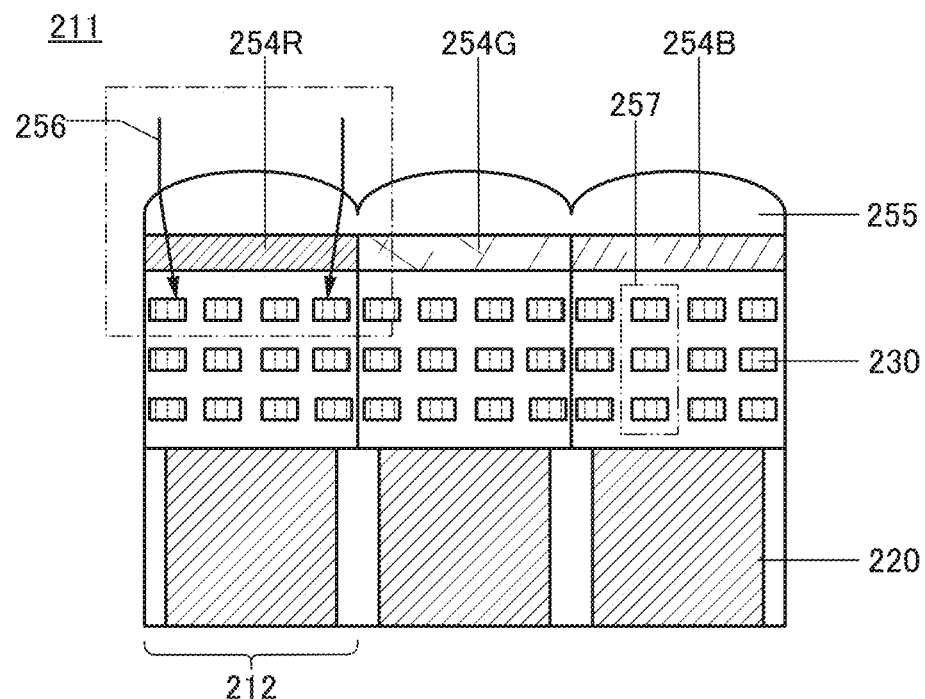
FIGS. 41A and 41B are cross-sectional views of an imaging device.
Figure 41B:
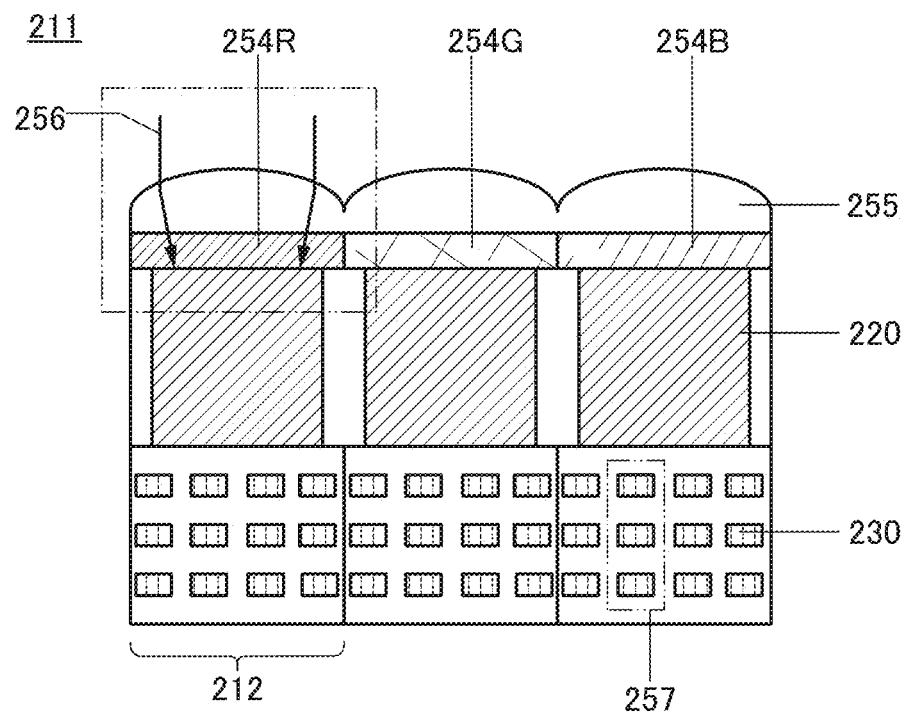

As the photoelectric conversion element 220 illustrated in FIGS. 41A and 41B, a photoelectric conversion element in which a p-n junction or a p-i-n junction is formed may be used.

The photoelectric conversion element 220 may be formed using a substance that has a function of absorbing a radiation and generating electric charge. Examples of the substance that has a function of absorbing a radiation and generating electric charge include selenium, lead iodide, mercury iodide, gallium arsenide, cadmium telluride, and a cadmium-zinc alloy.

For example, when selenium is used for the photoelectric conversion element 220, the photoelectric conversion element 220 can have an absorption coefficient of light in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 41A and 41B.

Configuration Example 2 of Pixel

An example of a pixel including a transistor using silicon and a transistor using an oxide semiconductor according to one embodiment of the present invention is described below.

Figure 42A:
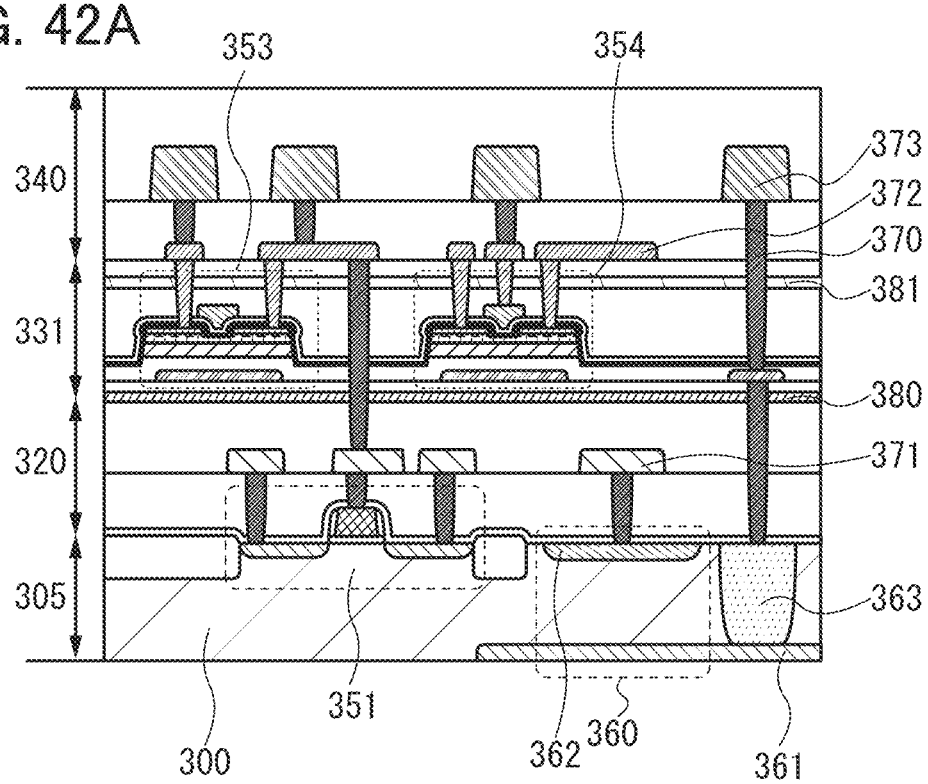
FIGS. 42A and 42B are cross-sectional views of an imaging device.
Figure 42B:
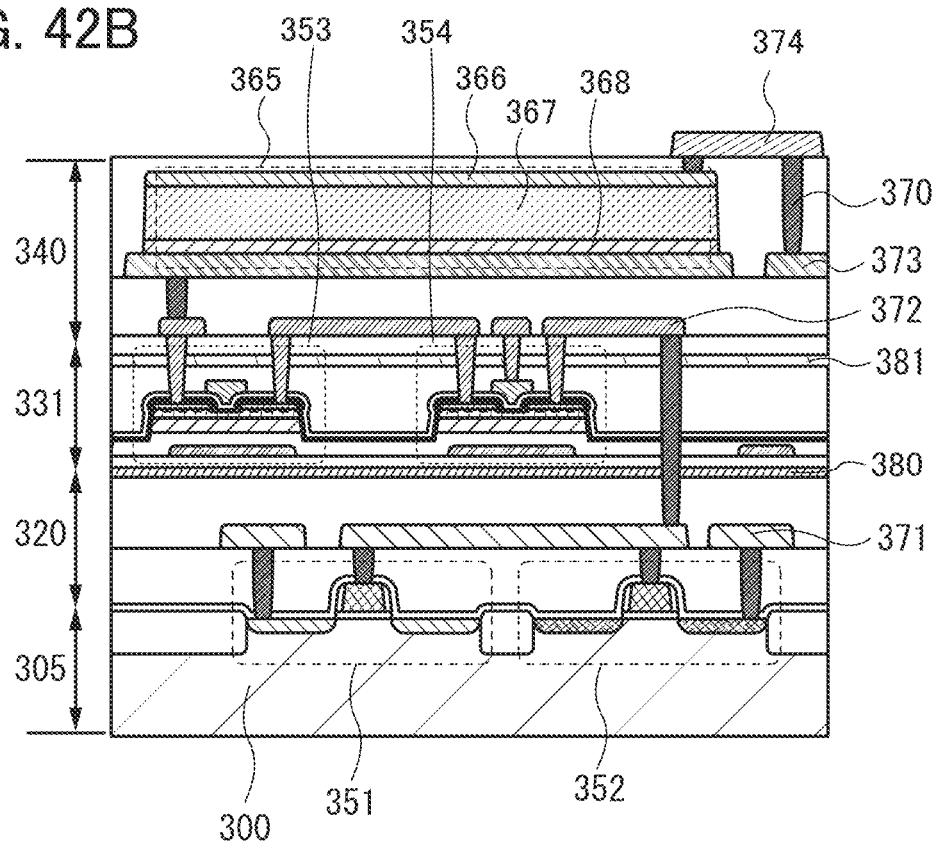

FIGS. 42A and 42B are each a cross-sectional view of an element included in an imaging device.

The imaging device illustrated in FIG. 42A includes a transistor 351 including silicon on a silicon substrate 300, transistors 353 and 354 which include an oxide semiconductor and are stacked over the transistor 351, and a photodiode 360 which includes an anode 361 and a cathode 362 and is provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 305 including the transistor 351 provided on the silicon substrate 300 and the photodiode 360 provided in the silicon substrate 300, a layer 320 which is in contact with the layer 305 and includes the wirings 371, a layer 331 which is in contact with the layer 320 and includes the transistors 353 and 354, and a layer 340 which is in contact with the layer 331 and includes a wiring 372 and a wiring 373.

In the example of cross-sectional view in FIG. 42A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

When the pixel includes transistors in which silicon is used for a channel formation region, the layer 305 preferably includes the transistor. Alternatively, the layer 305 may be omitted, and the pixel may include only transistors using an oxide semiconductor for a channel formation region.

In addition, in the cross-sectional view in FIG. 42A, the photodiode 360 in the layer 305 and the transistor in the layer 331 can be formed so as to overlap with each other. Thus, the degree of integration of pixels can be increased. In other words, the resolution of the imaging device can be increased.

An imaging device illustrated in FIG. 42B includes a photodiode 365 in the layer 340 and over the transistor. In FIG. 42B, the layer 305 includes the transistor 351 and a transistor 352 using silicon for a channel formation region, the layer 320 includes the wiring 371, the layer 331 includes the transistors 353 and 354 using an oxide semiconductor for a channel formation region, the layer 340 includes the photodiode 365. The photodiode 365 includes a semiconductor layer 366, a semiconductor layer 367, and a semiconductor layer 368, and is electrically connected to the wiring 373 and a wiring 374 through the plug 370.

The element structure shown in FIG. 42B can increase the aperture ratio.

Alternatively, a PIN diode element formed using an amorphous silicon film, a microcrystalline silicon film, or the like may be used as the photodiode 365. In the photodiode 365, an n-type semiconductor layer 368, an i-type semiconductor layer 367, and a p-type semiconductor layer 366 are stacked in this order. The i-type semiconductor layer 367 is preferably formed using amorphous silicon. The p-type semiconductor layer 366 and the n-type semiconductor layer 368 can each be formed using amorphous silicon, microcrystalline silicon, or the like which includes a dopant imparting the corresponding conductivity type. The photodiode 365 in which a photoelectric conversion layer is formed using amorphous silicon has high sensitivity in a visible light wavelength region, and therefore can easily sense weak visible light.

Here, an insulator 380 is provided between the layer 305 including the transistor 351 and the photodiode 360 and the layer 331 including the transistors 353 and 354. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistors 353 and 354 and the like becomes one of factors generating a carrier in the oxide semiconductor. Thus, the hydrogen may cause a reduction of the reliability of the transistor 354, the transistor 354, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistors 353 and 354 and the like can be increased. It is preferable to form the insulator 381 over the transistors 353 and 354 because oxygen diffusion can be prevented in the oxide semiconductor.

At least part of this embodiment can be implemented in combination with any of the other embodiments and the other examples described in this specification as appropriate.

Embodiment 10

<RF Tag>

In this embodiment, an RF tag that includes the transistor described in the above embodiments or the memory device described in the above embodiment is described with reference to FIG. 43.

The RF tag of this embodiment includes a memory circuit, stores necessary data in the memory circuit, and transmits and receives data to/from the outside with use of contactless means, for example, wireless communication. The RF tag with these features can be used for an individual authentication system in which an object or the like is recognized by reading the individual information, for example. In order that the RF tag is used for such application, extremely high reliability is needed.

A configuration of the RF tag is described with reference to FIG. 43. FIG. 43 is a block diagram illustrating a configuration example of an RF tag.

Figure 43:
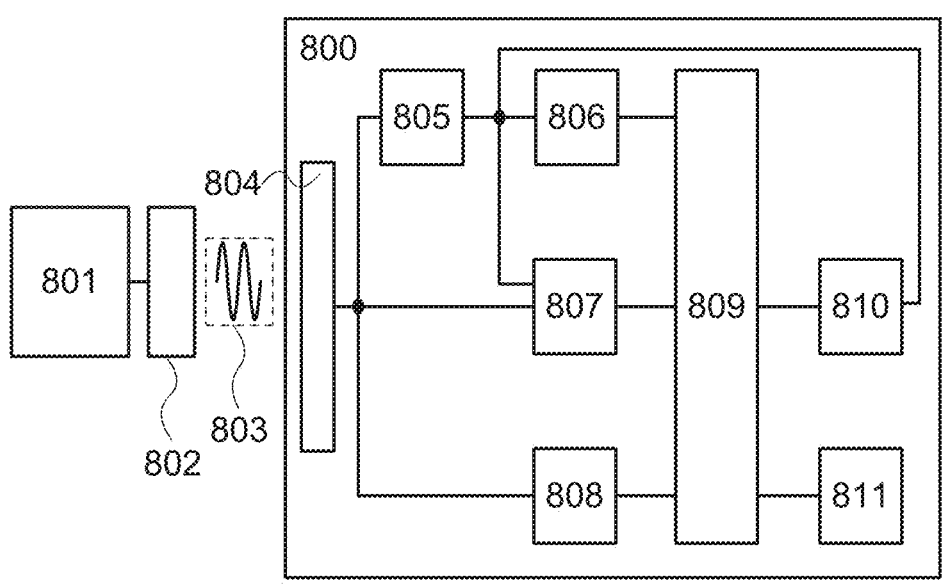
FIG. 43 illustrates a configuration example of an RF tag.

As shown in FIG. 43, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress reduction of a rectifying function due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the configuration of each circuit will be described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that whether each circuit described above is provided can be determined as appropriate as needed.

Here, the memory circuit described in the above embodiment can be used as the memory circuit 810. Since the memory circuit of one embodiment of the present invention can retain data even when not powered, the memory circuit can be favorably used for an RF tag. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, putting identification numbers only to good products to be shipped is possible. Thus, the identification numbers of the shipped products are in series and customer management corresponding to the shipped products is easily performed.

Note that this embodiment can be combined with any of the other embodiments and examples in this specification as appropriate.

Embodiment 11

<Display Device>

A display device of one embodiment of the present invention is described below with reference to FIGS. 44A to 44C and FIGS. 45A and 45B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) will be described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as a flexible printed circuit (FPC) or a tape carrier package (TCP); a module in which a printed wiring board is provided at the end of TCP; and a module in which an integrated circuit (IC) is mounted directly on a display element by a chip on glass (COG) method.

Figure 44A:
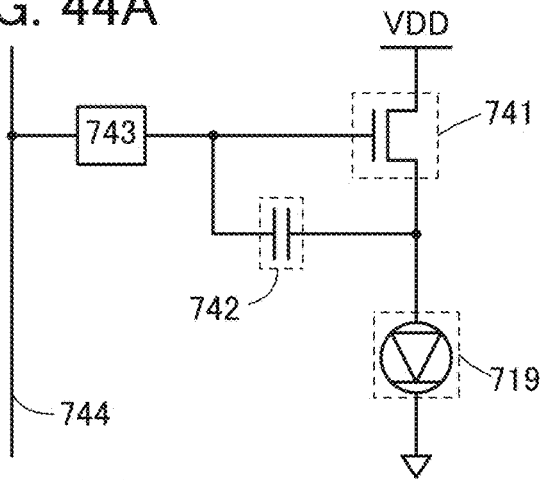
FIGS. 44A to 44C are a circuit diagram, a top view, and a cross-sectional view illustrating a semiconductor device of one embodiment of the present invention.
Figure 44B:
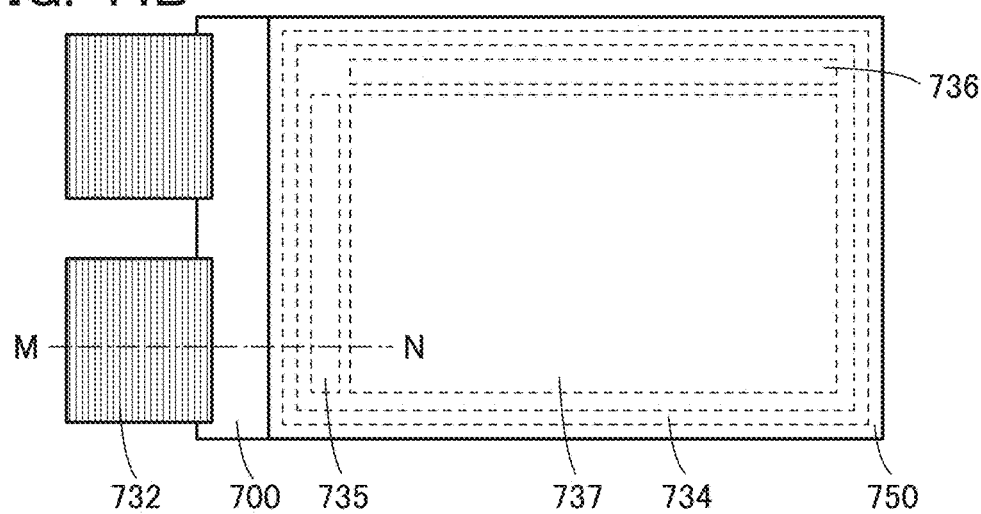
Figure 44C:
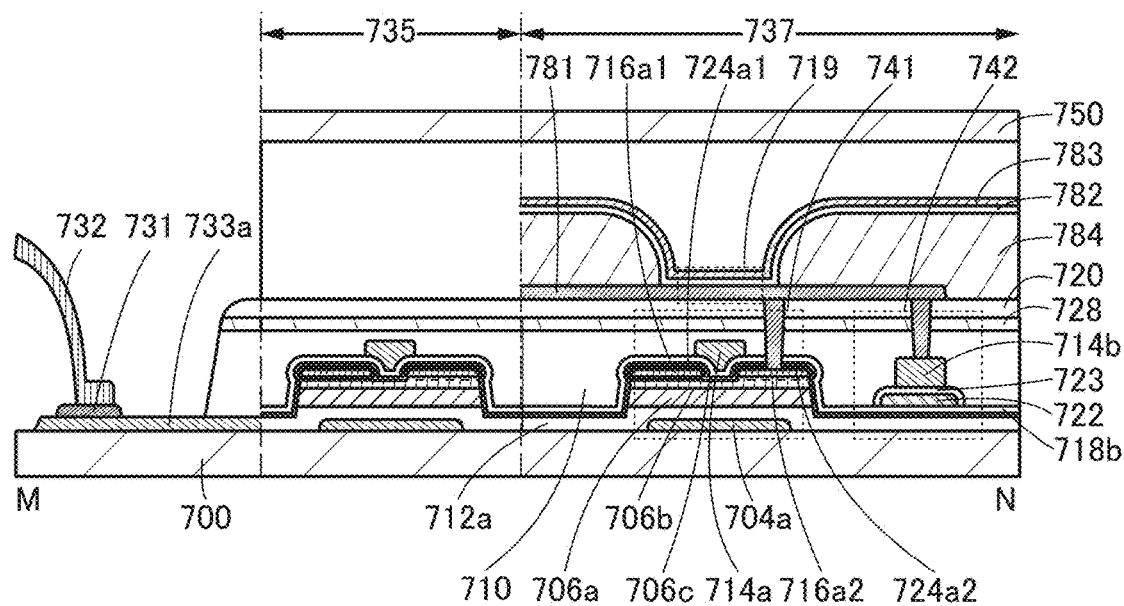

FIGS. 44A to 44C show an example of an EL display device according to one embodiment of the present invention. FIG. 44A is a circuit diagram of a pixel in an EL display device. FIG. 44B is a top view showing the whole of the EL display device. FIG. 44C is a cross-sectional view taken along part of dashed-dotted line M-N in FIG. 44B.

FIG. 44A illustrates an example of a circuit diagram of a pixel used in an EL display device.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention can be clear. Moreover, it can be determined that one embodiment of the invention in which a function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 44A includes a switching element 743, a transistor 741, a capacitor 742, and a light-emitting element 719.

Note that FIG. 44A and the like each illustrate an example of a circuit structure; therefore, a transistor can be provided additionally. In contrast, for each node in FIG. 44A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, the transistor illustrated in FIGS. 4A and 4B can be used, for example.

FIG. 44B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 44C is a cross-sectional view of the EL display device taken along part of dashed-dotted line M-N in FIG. 44B.

FIG. 44C shows a structure as a transistor 714, which includes the following components: an insulator 712a and a conductor 704a over a substrate 700; an insulator 706a that is over the insulator 712a and the conductor 704a and partly overlaps with the conductor 704a; a semiconductor 706b over the insulator 706a; a conductor 716a1 and a conductor 716a2 that are in contact with a top surface of the semiconductor 706b; an insulator 724a1 covering a top surface and a side surface of the conductor 716a1; insulator 724a2 covering a top surface and a side surface of the conductor 716a2; an insulator 706c that is over the insulator 712a and has regions in contact with a top surface of the insulator 724a1 and a top surface of the insulator 724a2; an insulator 718b over the insulator 706c; an insulator 710 over the insulator 718b; and a conductor 714a over the semiconductor 706b with the insulator 718b and the insulator 706c interposed therebetween. Note that the structure of the transistor 741 is just an example; the transistor 741 may have a structure different from that illustrated in FIG. 44C.

In the transistor 741 illustrated in FIG. 44C, the conductor 704a serves as a gate electrode, the insulator 712a serves as a gate insulator, the conductor 716a1 serves as a drain electrode, the conductor 716a2 serve as a source, the insulator 718b serves as a gate insulator, and the conductor 714a serves as a gate electrode. Note that in some cases, electrical characteristics of the insulator 706a, the semiconductor 706b, and the insulator 706c change if light enters the insulator 706a, the semiconductor 706b, and the insulator 706c. To prevent this, it is preferable that one or more of the conductors 704a, 716a1, 716a2, and 714a have a light-blocking property.

FIG. 44C shows a structure as the capacitor 742 including the insulator 712a over the substrate 700, the insulator 706c over the insulator 712a, an insulator 718 over the insulator 706c, a conductor 722 over the insulator 718, an insulator 723 provided to cover a surface of the conductor 722, and a conductor 714b overlapping with the conductor 722 with the insulator 723 interposed therebetween.

In the capacitor 742, the conductor 722 serves as one electrode and the conductor 714b serves as the other electrode.

Thus, the capacitor 742 can be formed using a film of the transistor 741. The conductor 714a and the conductor 714b are preferably formed using the same kind of conductor. In this case, the conductor 714a and the conductor 714b can be formed in the same step.

The capacitor 742 illustrated in FIG. 44C has a large capacitance per area occupied by the capacitor. Therefore, the EL display device illustrated in FIG. 44C has high display quality. Note that the structure of the capacitor 742 is just an example and may be different from that illustrated in FIG. 44C. For example, a structure described in Embodiment 1 can be used.

An insulator 728 is provided over the transistor 741 and the capacitor 742, and an insulator 720 is provided over the insulator 728. Here, the insulator 728 and the insulator 720 may have an opening reaching the conductor 716a2 that functions as the source electrode of the transistor 741. A conductor 781 is provided over the insulator 720. The conductor 781 may be electrically connected to the transistor 741 through the opening in the insulators 728 and 720. The conductor 781 may be electrically connected to one of electrodes of the capacitor 742 through the opening in the insulators 728 and 720.

A partition wall 784 having an opening reaching the conductor 781 is provided over the conductor 781. A light-emitting layer 782 in contact with the conductor 781 through the opening formed in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719. In FIG. 44C, the FPC 732 is connected to a wiring 733a via a terminal 731. Note that the wiring 733a may be formed using the same kind of conductor as the conductor of the transistor 741 or using the same kind of semiconductor as the semiconductor of the transistor 741.

So far, examples of the EL display device are described. Next, an example of a liquid crystal display device will be described.

Figure 45A:
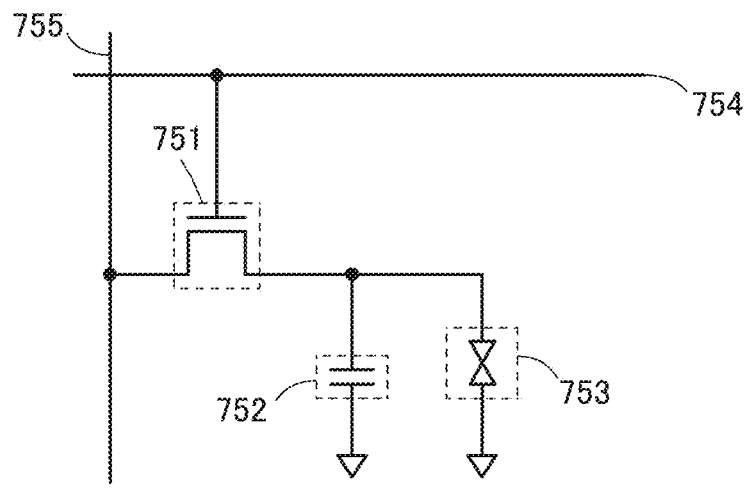
FIGS. 45A and 45B are a circuit diagram and a cross-sectional view illustrating a semiconductor device of one embodiment of the present invention.

FIG. 45A is a circuit diagram illustrating a configuration example of a pixel of a liquid crystal display device. A pixel shown in FIG. 45A includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 45B:
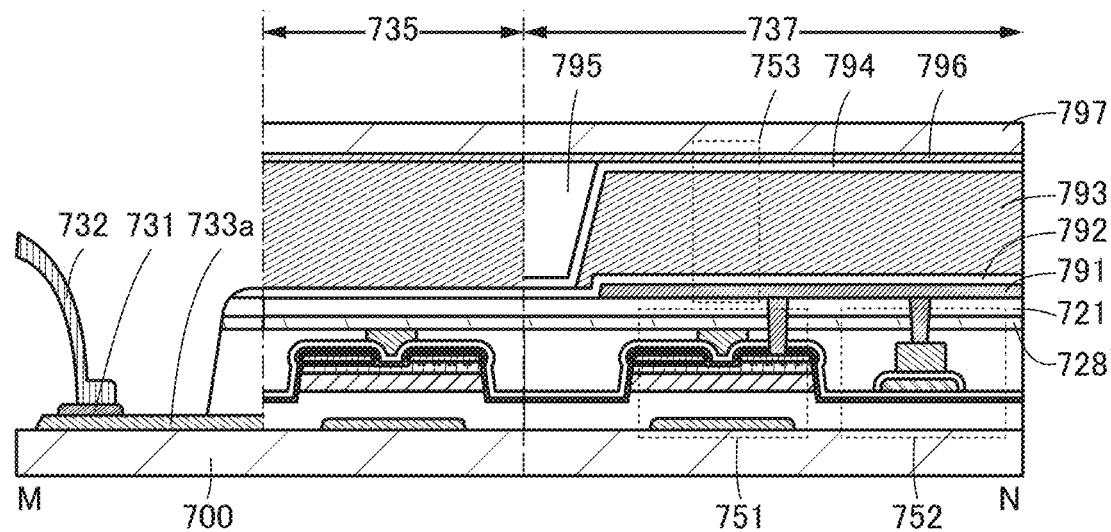

Note that the description of the liquid crystal display device is made on the assumption that the top plan view of the liquid crystal display device is similar to that of the EL display device. FIG. 45B is a cross-sectional view of the liquid crystal display device taken along dashed-dotted line M-N in FIG. 44B. In FIG. 45B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 45B corresponds to, but is not limited to, the structure of the capacitor 742 in FIG. 44C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 and the insulator 728 are provided over the transistor 751 and the capacitor 752. The insulator 721 and the insulator 728 have an opening reaching the transistor 751. A conductor 791 is provided over the insulator 721. The conductor 791 is electrically connected to the transistor 751 through the opening in the insulator 721 and the insulator 728. In addition, the conductor 791 is electrically connected to the one of the electrodes of the capacitor 752 through the insulator 721 and the insulator 728.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided. A high-resolution display device can be provided.

For example, in this specification and the like, a display element, a display device which is a device including a display element, a light-emitting element, and a light-emitting device which is a device including a light-emitting element can employ various modes or can include various elements. The display element, the display device, the light-emitting element, or the light-emitting device includes, for example, at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator (IMOD) element, a MEMS shutter display element, an optical-interference-type MEMS display element, an electrowetting element, a piezoelectric ceramic display, and a display element including a carbon nanotube. In addition to the above, a display medium whose contrast, luminance, reflectivity, transmittance, or the like changes by electrical or magnetic action may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductor included in the LED can also be formed by a sputtering method.

Note that this embodiment can be combined with any of the other embodiments and examples in this specification as appropriate.

Embodiment 12

<Single Power Supply Circuit>

In this embodiment, examples of semiconductor devices including a plurality of circuits including the transistors including oxide semiconductor (OS transistors) described in the above embodiment are described with reference to FIGS. 46A to 46E, FIGS. 47A and 47B, FIGS. 48A and 18B, FIGS. 49A to 49C, FIGS. 50A and 50B, FIGS. 51A to 51C, FIGS. 52A and 52B, FIG. 53, and FIGS. 54A and 54B.

Figure 46A:
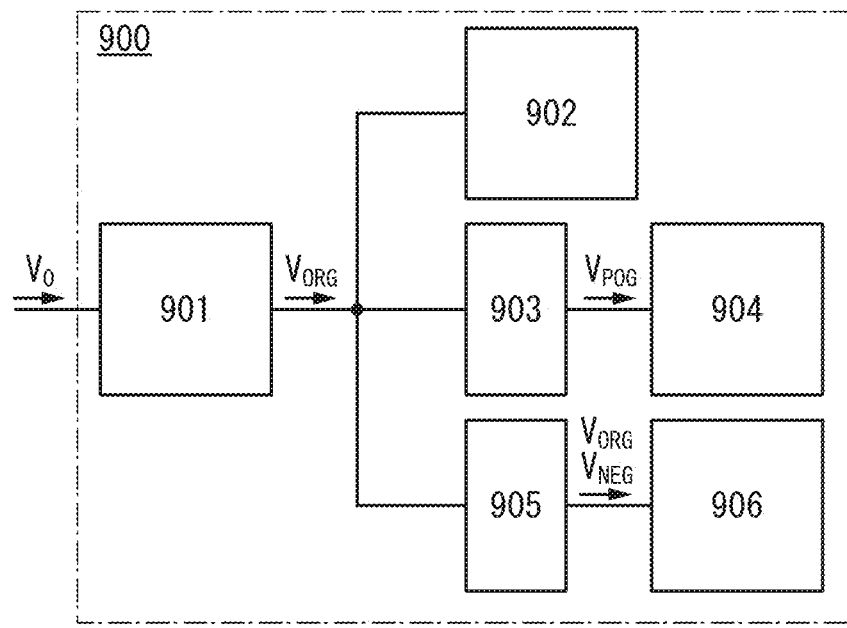
FIGS. 46A to 46E are a block diagram, circuit diagrams, and waveform diagrams illustrating one embodiment of the present invention.

FIG. 46A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Therefore, the semiconductor device 900 can operate without supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}$>$V_{SS}$). For example, the power supply voltage of the circuit 904 is a voltage applied on the basis of a voltage $V_{POG}$ and the voltage $V_{SS}$ ($V_{POG}$>$V_{ORG}$). For example, the power supply voltages of the circuit 906 are voltages applied on the basis of the voltage $V_{ORG}$, the voltage $V_{SS}$, and a voltage $V_{NEG}$ ($V_{ORG}$>$V_{SS}$>$V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Therefore, the semiconductor device 900 including the circuit 904 can operate with one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Therefore, the semiconductor device 900 including the circuit 906 can operate with one power supply voltage supplied from the outside.

Figure 46B:
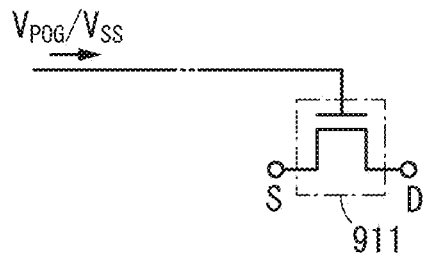
Figure 46C:
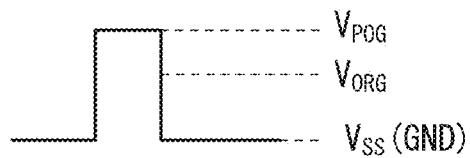

FIG. 46B illustrates an example of the circuit 904 that operates with the voltage $V_{POG}$ and FIG. 46C illustrates an example of a waveform of a signal for operating the circuit 904.

FIG. 46B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ at a time when the transistor 911 is turned on and on the basis of the voltage $V_{SS}$ at a time when the transistor 911 is turned off. As shown in FIG. 46C, the voltage $V_{POG}$ is higher than the voltage $V_{ORG}$. Thus, conduction state between a source (S) and a drain (D) of the transistor 911 can be obtained more surely. As a result, the frequency of malfunction of the circuit 904 can be reduced.

Figure 46D:
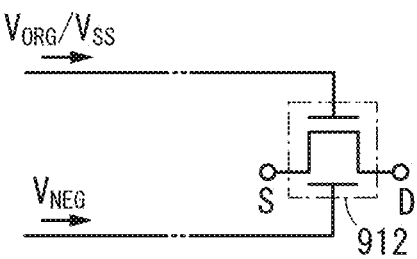
Figure 46E:
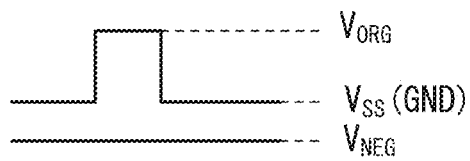

FIG. 46D illustrates an example of the circuit 906 that operates with the voltage $V_{NEG}$ and FIG. 46E illustrates an example of a waveform of a signal for operating the circuit 906.

FIG. 46D illustrates a transistor 912 having a back gate. A signal supplied to a gate of the transistor 912 is generated on the basis of, for example, the voltage $V_{ORG}$ and the voltage $V_{SS}$. The signal is generated on the basis of the voltage $V_{ORG}$ at a time when the transistor 912 is turned on and on the basis of the voltage $V_{SS}$ at a time when the transistor 912 is turned off. A signal supplied to the back gate of the transistor 912 is generated on the basis of the voltage $V_{NEG}$. As shown in FIG. 46E, the voltage $V_{NEG}$ is lower than the voltage $V_{SS}$ (GND). Therefore, the threshold voltage of the transistor 912 can be controlled to shift in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may be supplied to the back gate of the transistor 912.

Figure 47A:
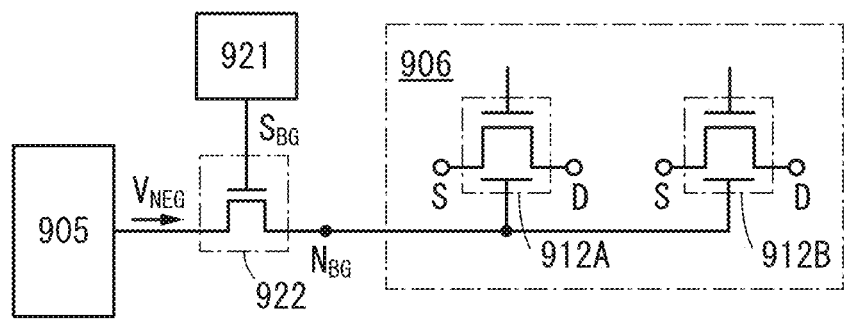
FIGS. 47A and 47B are a circuit diagram and a timing chart showing one embodiment of the present invention.
Figure 47B:
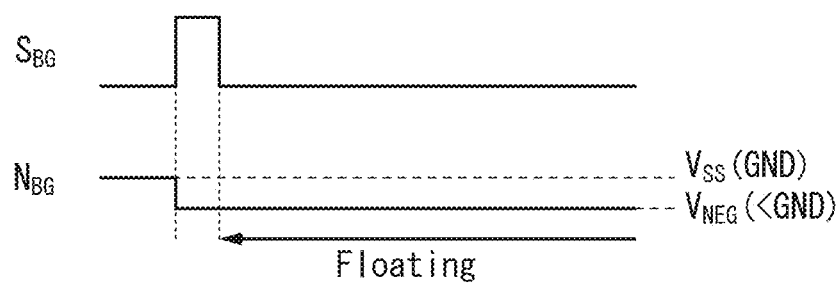

FIGS. 47A and 47B illustrate a modification example of FIGS. 46D and 46E.

In a circuit diagram illustrated in FIG. 47A, a transistor 922 whose conduction state can be controlled by a control circuit 921 is provided between the voltage generation circuit 905 and the circuit 906. The transistor 922 is an n-channel OS transistor. The control signal $S_{BG}$ output from the control circuit 921 is a signal for controlling conduction state of the transistor 922. Transistors 912A and 912B included in the circuit 906 are OS transistors like the transistor 922.

A timing chart in FIG. 47B shows changes in a potential of the control signal $S_{BG}$ and a potential of a node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is low. Accordingly, even when the node $N_{BG}$ is in an electrically floating state, the voltage $V_{NEG}$ which has been supplied can be held.

Figure 48A:
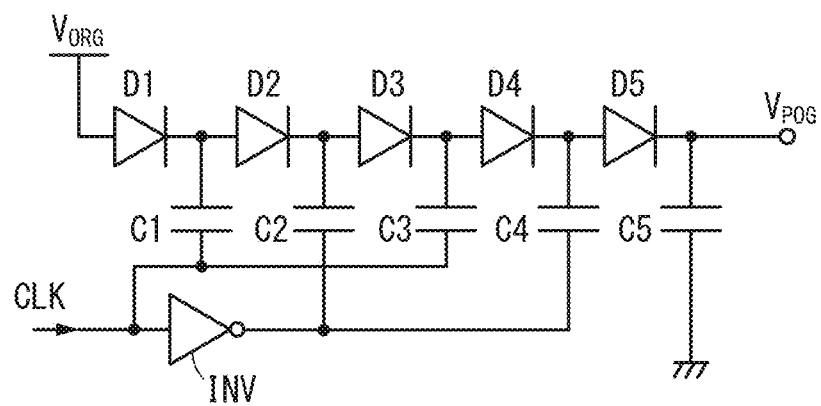
FIGS. 48A and 48B are circuit diagrams each illustrating one embodiment of the present invention.

FIG. 48A illustrates an example of a circuit structure applicable to the above-described voltage generation circuit 903. The voltage generation circuit 903 illustrated in FIG. 48A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$ can be obtained by increasing the voltage $V_{ORG}$ by a voltage five times a potential difference between the voltage $V_{ORG}$ and the voltage $V_{SS}$ with the application of the clock signal CLK. Note that a forward voltage of the diodes D1 to D5 is 0 V. A desired voltage $V_{POG}$ can be obtained when the number of stages of the charge pump is changed.

Figure 48B:
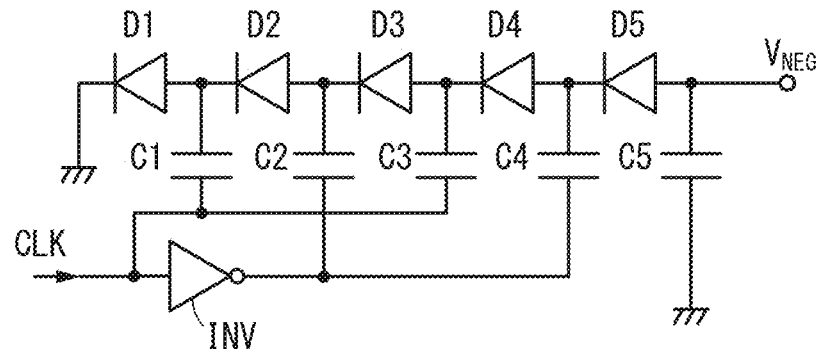

FIG. 48B illustrates an example of a circuit structure applicable to the above-described voltage generation circuit 905. The voltage generation circuit 905 illustrated in FIG. 48B is a four-stage charge pump including the diodes D1 to D5, the capacitors C1 to C5, and the inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$ can be obtained by decreasing the ground voltage, i.e., the voltage $V_{SS}$ by a voltage four times the potential difference between the voltage $V_{ORG}$ and the voltage $V_{SS}$ with the application of the clock signal CLK. Note that a forward voltage of the diodes D1 to D5 is 0 V. A desired voltage $V_{NEG}$ can be obtained when the number of stages of the charge pump is changed.

The circuit configuration of the voltage generation circuit 903 is not limited to the configuration of the circuit diagram illustrated in FIG. 48A. Modification examples of the voltage generation circuit 903 are shown in FIGS. 49A to 49C and FIGS. 50A and 50B.

Figure 49A:
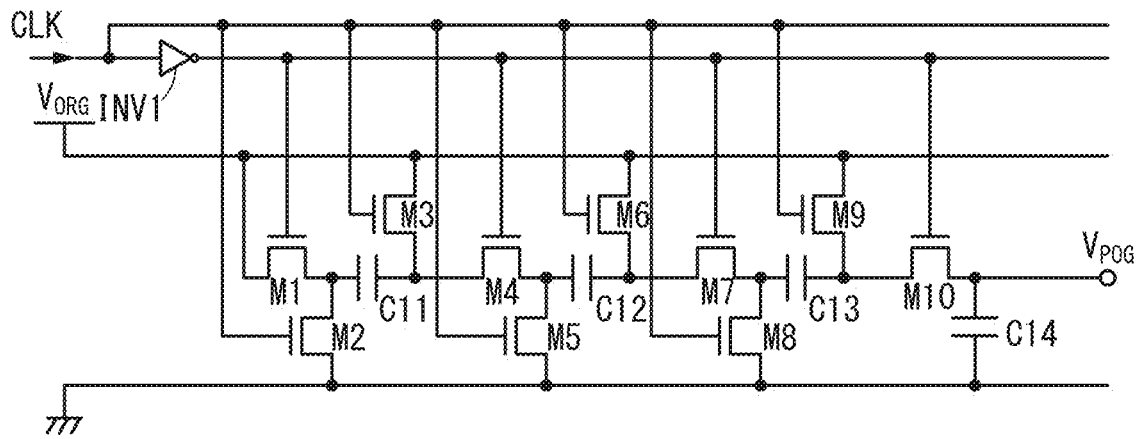
FIGS. 49A to 49C are circuit diagrams each illustrating one embodiment of the present invention.

A voltage generation circuit 903A illustrated in FIG. 49A includes transistors M1 to M10, capacitors C11 to C14, and an inverter INV1. The clock signal CLK is supplied to gates of the transistors M1 to M10 directly or through the inverter INV1. The voltage $V_{POG}$ can be obtained by increasing the voltage $V_{ORG}$ by a voltage four times the potential difference between the voltage $V_{ORG}$ and the voltage $V_{SS}$ with the application of the clock signal CLK. A desired voltage $V_{POG}$ can be obtained when the number of stages is changed. In the voltage generation circuit 903A in FIG. 49A, off-state current of each of the transistors M1 to M10 can be low when the transistors M1 to M10 are OS transistors, and leakage of charge held in the capacitors C11 to C14 can be suppressed. Accordingly, raising from the voltage $V_{ORG}$ to the voltage $V_{POG}$ can be efficiently performed.

Figure 49B:
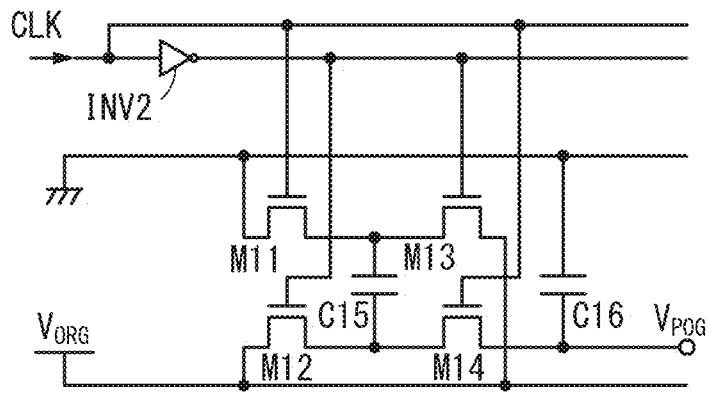

The voltage generation circuit 903B illustrated in FIG. 49B includes transistors M11 to M14, capacitors C15 and C16, and an inverter INV2. The clock signal CLK is supplied to gates of the transistors M11 to M14 directly or through the inverter INV2. The voltage $V_{POG}$ can be obtained by increasing the voltage $V_{ORG}$ by a voltage twice the potential difference between the voltage $V_{ORG}$ and the voltage $V_{SS}$ with the application of the clock signal CLK. In the voltage generation circuit 903B in FIG. 49B, off-state current of each of the transistors M11 to M14 can be small when the transistors M11 to M14 are OS transistors, and leakage of charge held in the capacitors C15 and C16 can be suppressed. Accordingly, raising from the voltage $V_{ORG}$ to the voltage $V_{POG}$ can be efficiently performed.

Figure 49C:
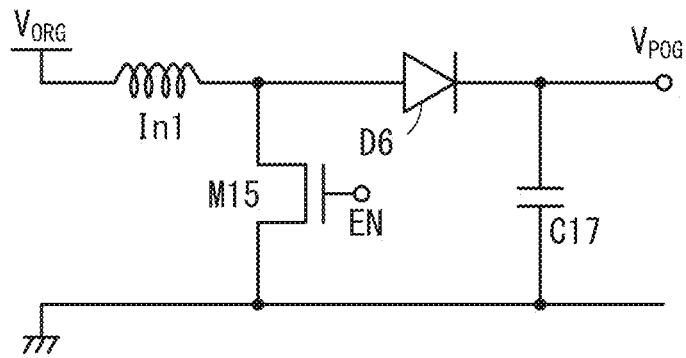

The voltage generation circuit 903C in FIG. 49C includes an inductor In1, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 49C increases the voltage using the inductor In1, the voltage can be increased efficiently.

Figure 50A:
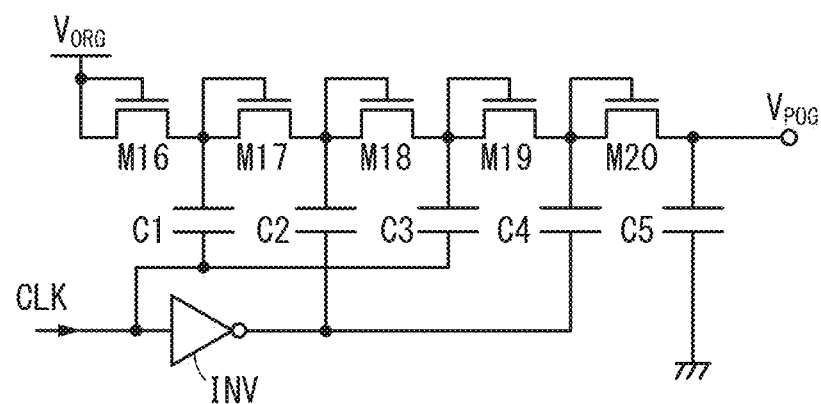
FIGS. 50A and 50B are each a circuit diagram illustrating one embodiment of the present invention.

A voltage generation circuit 903D illustrated in FIG. 50A has a configuration in which the diodes D1 to D5 of the voltage generation circuit 903 illustrated in FIG. 48A are replaced by diode-connected transistors M16 to M20. In the voltage generation circuit 903D in FIG. 50A, when OS transistors are used as the transistors M16 to M20, the off-state current can be reduced, so that leakage of charge held in the capacitors C1 to C5 can be inhibited. Accordingly, raising from the voltage $V_{ORG}$ to the voltage $V_{POG}$ can be efficiently performed.

Figure 50B:
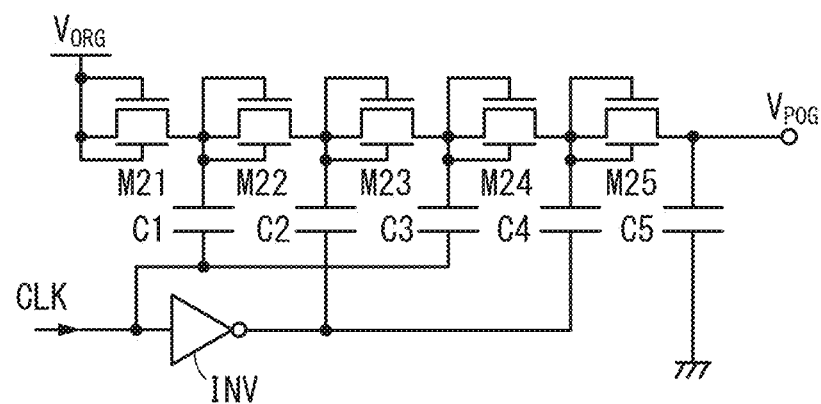

A voltage generation circuit 903E in FIG. 50B has a configuration in which the transistors M16 to M20 of the voltage generation circuit 903D in FIG. 50A are replaced with transistor M21 to M25 having back gates. In the voltage generation circuit 903E illustrated in FIG. 50B, the back gates can be supplied with the same voltages as the respective gates; thus, the amount of current flowing in the transistor can be increased. Accordingly, raising from the voltage $V_{ORG}$ to the voltage $V_{POG}$ can be efficiently performed.

Figure 51A:
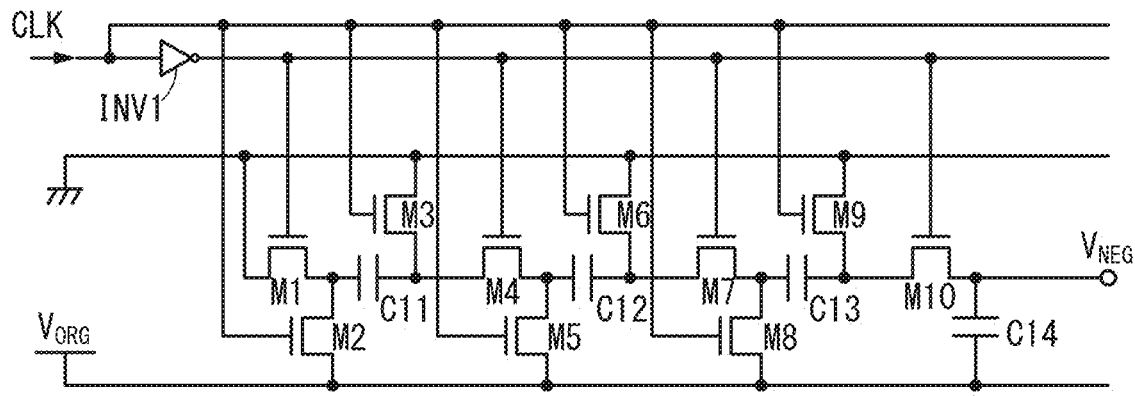
FIGS. 51A to 51C are each a circuit diagram illustrating one embodiment of the present invention.
Figure 51B:
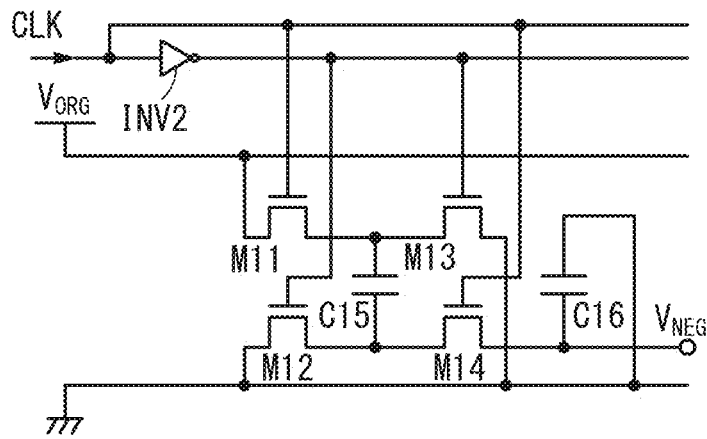
Figure 51C:
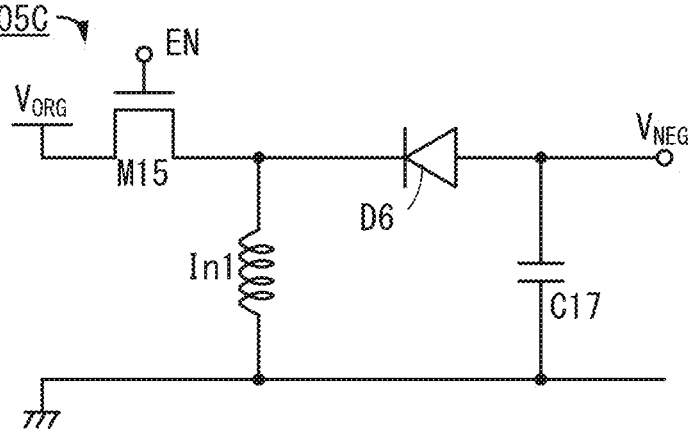
Figure 52A:
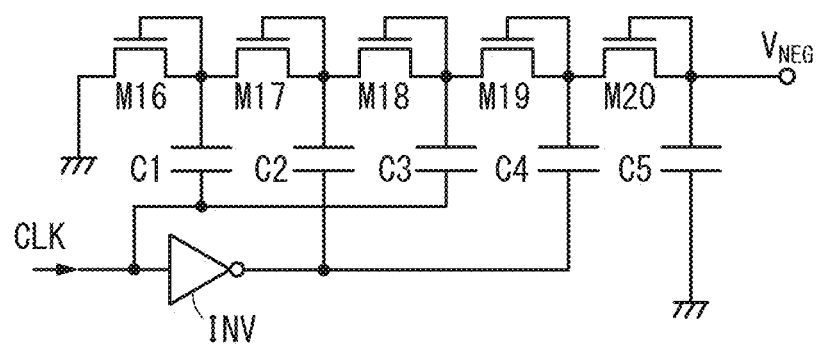
FIGS. 52A and 52B are each a circuit diagram illustrating one embodiment of the present invention.
Figure 52B:
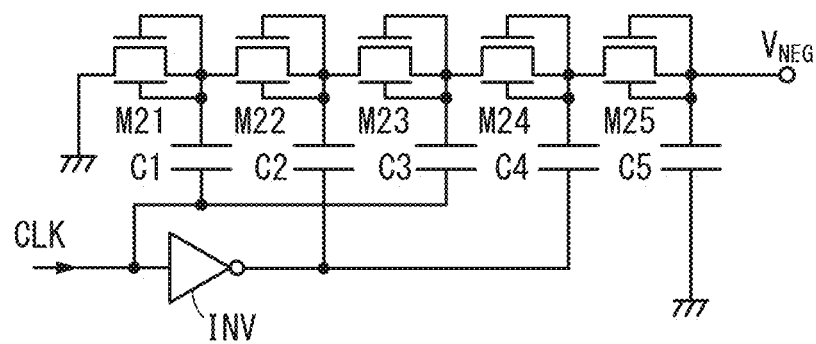

Note that a modification example of the voltage generation circuit 903 can be applied to the voltage generation circuit 905 illustrated in FIG. 48B. The configurations of a circuit diagram in this case are illustrated in FIGS. 51A to 51C and FIGS. 52A and 52B. In a voltage generation circuit 905A illustrated in FIG. 51A, the voltage $V_{NEG}$, which has been reduced from the voltage $V_{SS}$ to a negative voltage having a negatively tripled value of the voltage $V_{ORG}$ by application of the clock signal CLK, can be obtained. When a voltage generation circuit 905B illustrated in FIG. 51B is supplied with the clock signal CLK, the voltage $V_{NEG}$, which has been reduced from the voltage $V_{SS}$ to a negative voltage having a negatively doubled value of the voltage $V_{ORG}$, can be obtained.

The voltage generation circuits 905A to 905E in FIGS. 51A to 51C and FIGS. 52A and 52B have configurations in which the voltage applied to each wiring or the arrangement of the elements are changed in the voltage generation circuits 903A to 903E in FIGS. 49A to 49C and FIGS. 50A and 50B. In the voltage generation circuits 905A to 905E in FIGS. 51A to 51C and FIGS. 52A and 52B, as in the voltage generation circuits 903A to 903E, efficient voltage decrease from the voltage $V_{SS}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

Note that this embodiment can be combined with any of the other embodiments and examples in this specification as appropriate.

Embodiment 13

In this embodiment, a display module using a semiconductor device of one embodiment of the present invention is described with reference to FIG. 53.
<Display Module>

Figure 53:
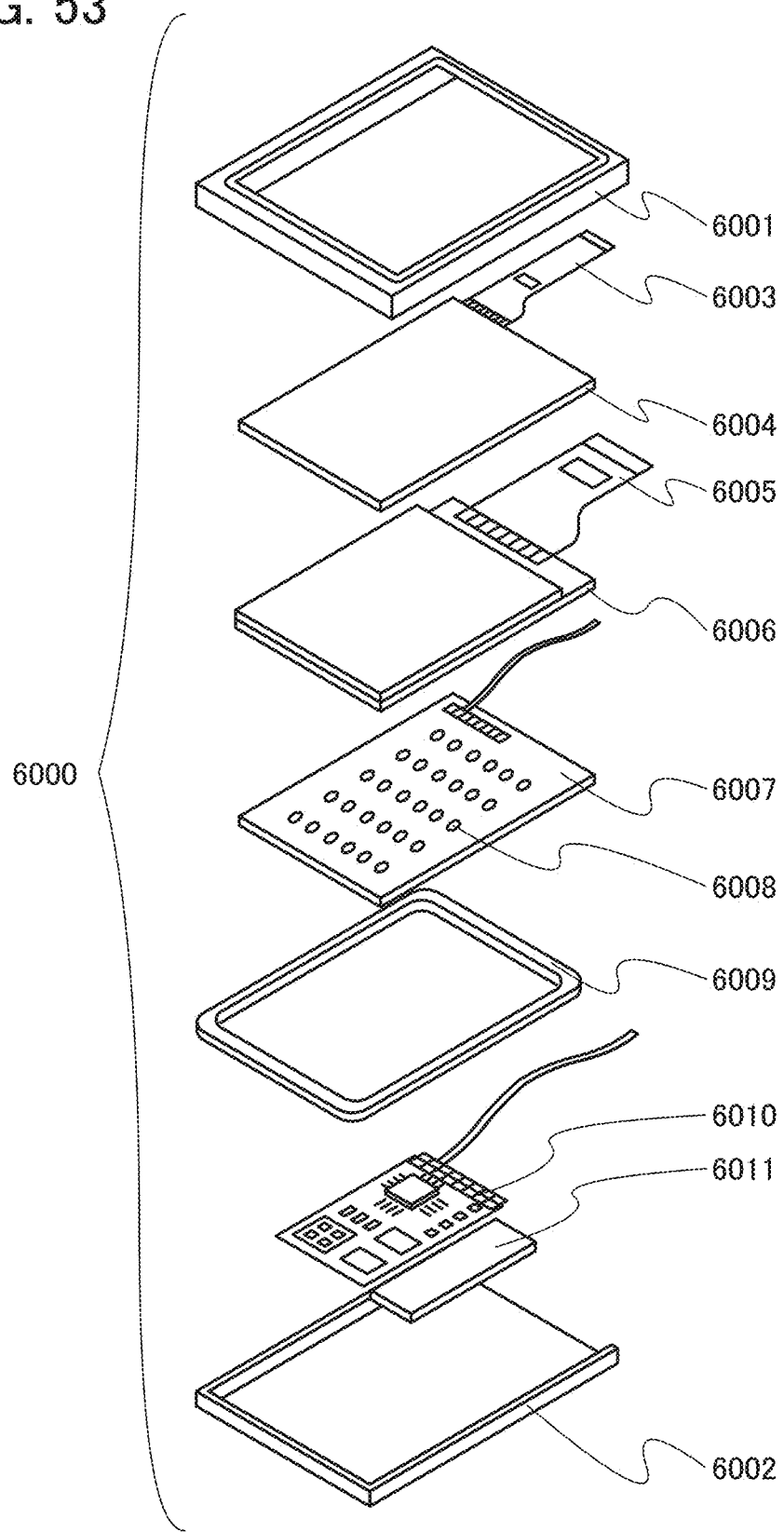
FIG. 53 illustrates a display module.

In a display module 6000 in FIG. 53, a touch panel 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch panel 6004, and the like are not provided in some cases.

The semiconductor device of one embodiment of the present invention can be used for the display panel 6006, an integrated circuit mounted on a printed circuit board, or the like.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed to overlap with the display panel 6006. A counter substrate (sealing substrate) of the display panel 6006 can have a touch panel function. A photosensor may be provided in each pixel of the display panel 6006 so that an optical touch panel function is added. An electrode for a touch sensor may be provided in each pixel of the display panel 6006 so that a capacitive touch panel function is added.

The backlight unit 6007 includes a light source 6008. The light source 6008 may be provided at an end portion of the backlight unit 6007 and a light diffusing plate may be used.

The frame 6009 protects the display panel 6006 and also functions as an electromagnetic shield for blocking electromagnetic waves generated from the printed circuit board 6010. The frame 6009 may function as a radiator plate.

The printed circuit board 6010 has a power supply circuit and a signal processing circuit for outputting a video signal and a clock signal. As a power source for supplying power to the power supply circuit, an external commercial power source or the battery 6011 provided separately may be used. Note that the battery 6011 is not necessary in the case where a commercial power source is used.

The display module 6000 can be additionally provided with a member such as a polarizing plate, a retardation plate, or a prism sheet.

Note that this embodiment can be combined with any of the other embodiments and examples in this specification as appropriate.

Embodiment 14

<Package Using a Lead Frame Interposer>

Figure 54A:
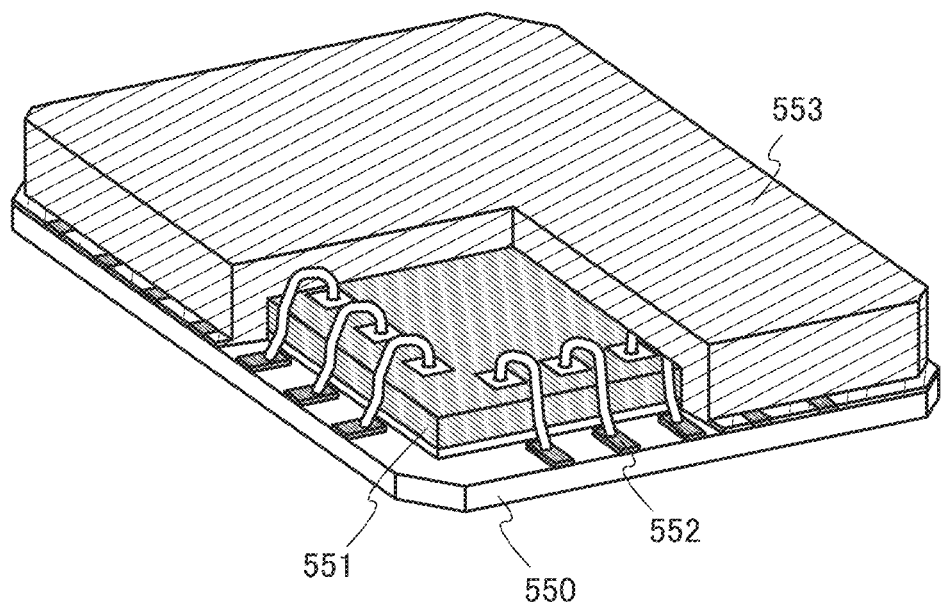
FIG. 54A is a perspective view illustrating a cross-sectional structure of a package using a lead frame interposer.

FIG. 54A is a perspective view illustrating a cross-sectional structure of a package using a lead frame interposer. In the package illustrated in FIG. 54A, a chip 551 corresponding to the semiconductor device of one embodiment of the present invention is connected to a terminal 552 over an interposer 550 by wire bonding. The terminal 552 is placed on a surface of the interposer 550 on which the chip 551 is mounted. The chip 551 may be sealed by a mold resin 553, in which case the chip 551 is sealed such that part of each of the terminals 552 is exposed.

Figure 54B:
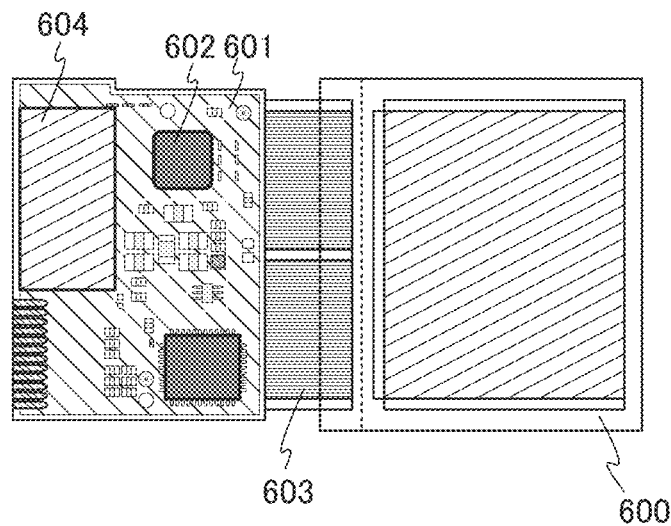
FIG. 54B is a plan view illustrating a structure of a module of a mobile phone.

FIG. 54B illustrates the structure of a module of an electronic device (mobile phone) in which a package is mounted on a circuit board. In the module of the mobile phone in FIG. 54B, a package 602 and a battery 604 are mounted on a printed wiring board 601. The printed wiring board 601 is mounted on a panel 600 including a display element by an FPC 603.

Note that this embodiment can be combined with any of the other embodiments and examples in this specification as appropriate.

Embodiment 15

In this embodiment, electronic devices and lighting devices of one embodiment of the present invention will be described with reference to drawings.
<Electronic Device>

Electronic devices and lighting devices can be fabricated using the semiconductor device of one embodiment of the present invention. In addition, highly reliable electronic devices and lighting devices can be fabricated using the semiconductor device of one embodiment of the present invention. Furthermore, electronic devices and lighting devices including touch sensors with improved detection sensitivity can be fabricated using the semiconductor device of one embodiment of the present invention.

Examples of electronic devices are a television set (also referred to as a television or a television receiver), a monitor of a computer or the like, a camera such as a digital camera or a digital video camera, a digital photo frame, a mobile phone (also referred to as a cellular phone or a mobile phone device), a portable game console, a portable information terminal, an audio reproducing device, a large-sized game machine such as a pachinko machine, and the like.

In the case of having flexibility, the electronic device or lighting device of one embodiment of the present invention can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

Figure 55A:
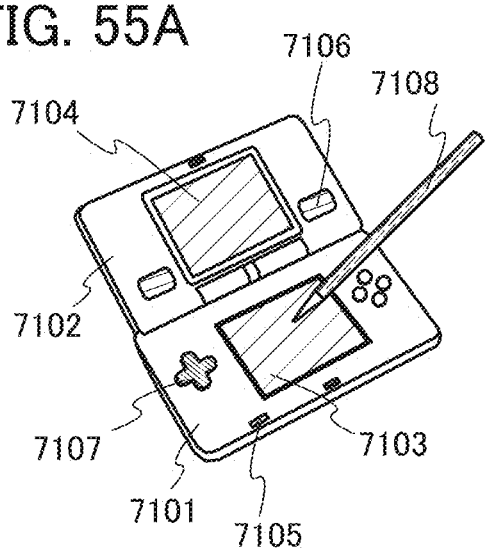
FIGS. 55A to 55E each illustrate an electronic device of one embodiment of the present invention.

FIG. 55A illustrates a portable game machine including a housing 7101, a housing 7102, a display portion 7103, a display portion 7104, a microphone 7105, speakers 7106, an operation key 7107, a stylus 7108, and the like. The semiconductor device of one embodiment of the present invention can be used for an integrated circuit, a CPU, or the like incorporated in the housing 7101. When the display device according to one embodiment of the present invention is used as the display portion 7103 or 7104, it is possible to provide a user-friendly portable game machine with quality that hardly deteriorates. Although the portable game machine illustrated in FIG. 55A includes two display portions, the display portion 7103 and the display portion 7104, the number of display portions included in the portable game machine is not limited to two.

Figure 55B:
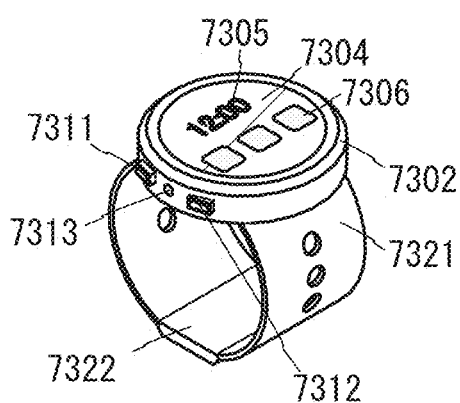

FIG. 55B illustrates a smart watch, which includes a housing 7302, display portions 7304, 7305, and 7306, operation buttons 7311 and 7312, a connection terminal 7313, a band 7321, a clasp 7322, and the like. The semiconductor device of one embodiment of the present invention can be used for a memory, a CPU, or the like incorporated in the housing 7302.

Figure 55C:
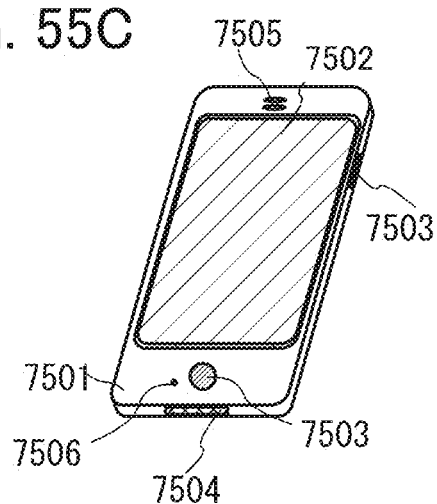

FIG. 55C illustrates a portable information terminal, which includes a display portion 7502 incorporated in a housing 7501, operation buttons 7503, an external connection port 7504, a speaker 7505, a microphone 7506, a display portion 7502, and the like. The semiconductor device of one embodiment of the present invention can be used for a mobile memory, a CPU, or the like incorporated in the housing 7501. Note that the display portion 7502 is small- or medium-sized but can perform full high vision, 4K, or 8K display because it has greatly high definition; therefore, a significantly clear image can be obtained.

Figure 55D:
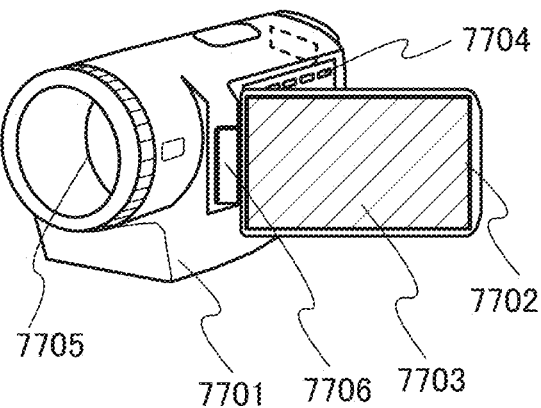

FIG. 55D illustrates a video camera including a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device of one embodiment of the present invention can be used in a portion corresponding to a focus of the lens 7705. The semiconductor device of one embodiment of the present invention can be used for an integrated circuit, a CPU, or the like incorporated in the first housing 7701.

Figure 55E:
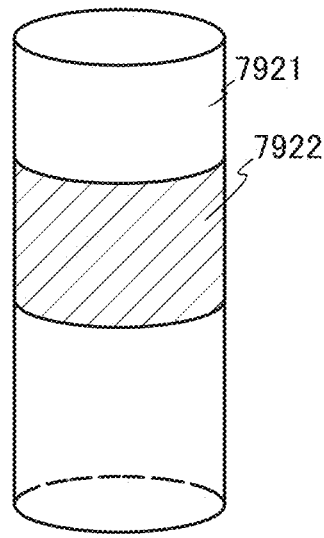

FIG. 55E illustrates a digital signage, which includes a display portion 7922 provided on a utility pole 7921. The display device of one embodiment of the present invention can be used for a control circuit of the display portion 7922.

Figure 56A:
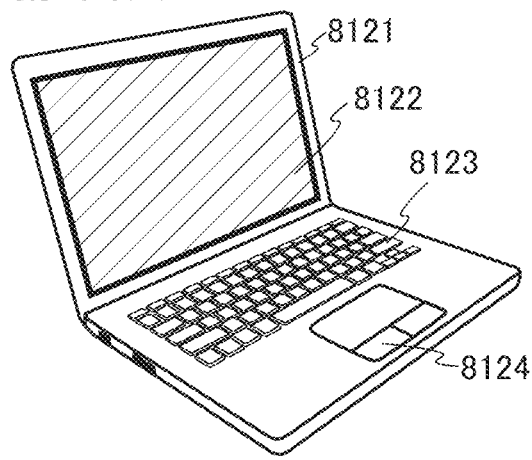
FIGS. 56A to 56D each illustrate an electronic device of one embodiment of the present invention.

FIG. 56A illustrates a notebook personal computer, which includes a housing 8121, a display portion 8122, a keyboard 8123, a pointing device 8124, and the like. The semiconductor device of one embodiment of the present invention can be used for a CPU, a memory, or the like incorporated in the housing 8121. Note that the display portion 8122 is small- or medium-sized but can perform 8 k display because it has greatly high resolution; therefore, a significantly clear image can be obtained.

Figure 56B:
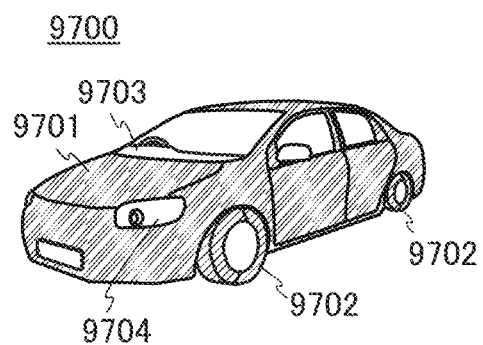
Figure 56C:
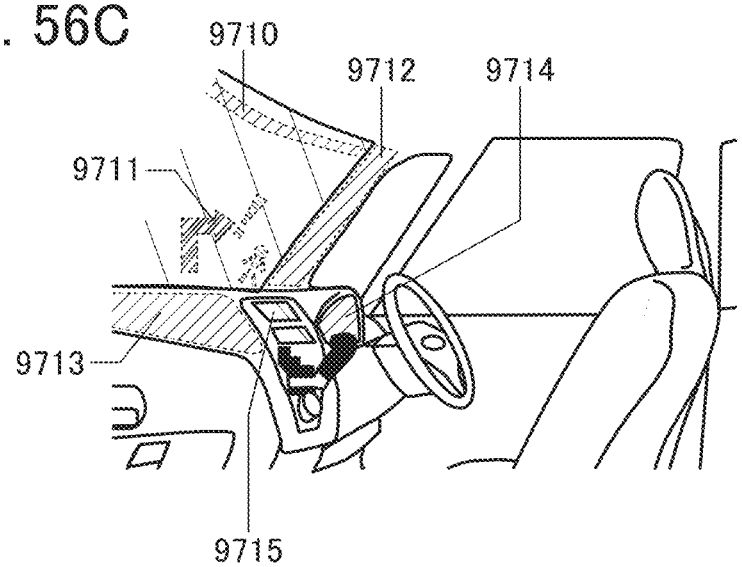

FIG. 56B is an external view of an automobile 9700. FIG. 56C illustrates a driver's seat of the automobile 9700. The automobile 9700 includes a car body 9701, wheels 9702, a dashboard 9703, lights 9704, and the like. The semiconductor device of one embodiment of the present invention can be used in a display portion and a control integrated circuit of the automobile 9700. For example, the semiconductor device of one embodiment of the present invention can be used in display portions 9710 to 9715 illustrated in FIG. 56C.

The display portion 9710 and the display portion 9711 are display devices or input/output devices provided in an automobile windshield. The display device or input/output device of one embodiment of the present invention can be a see-through display device or input/output device, through which the opposite side can be seen, by using a light-transmitting conductive material for its electrodes. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar portion by showing an image taken by an imaging unit provided on the car body. The display portion 9713 is a display device provided on the dashboard. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 56D:
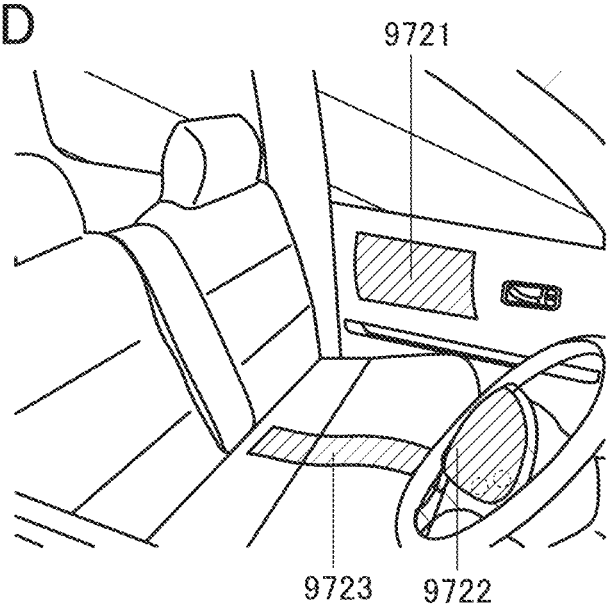

FIG. 56D illustrates the inside of a car in which bench seats are used for a driver seat and a front passenger seat. A display portion 9721 is a display device or input/output device provided in a door portion. For example, the display portion 9721 can compensate for the view hindered by the door portion by showing an image taken by an imaging unit provided on the car body. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Figure 57A:
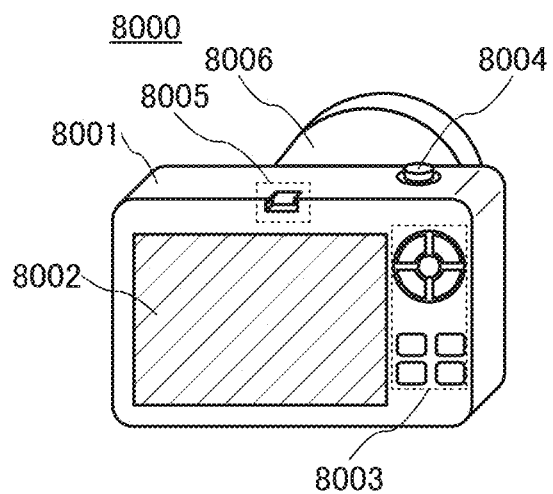
FIGS. 57A to 57C each illustrate an electronic device of one embodiment of the present invention.

FIG. 57A illustrates an external view of a camera 8000. The camera 8000 includes a housing 8001, a display portion 8002, an operation button 8003, a shutter button 8004, a connection portion 8005, and the like. A lens 8006 can be put on the camera 8000.

The connection portion 8005 includes an electrode to connect a finder 8100, which is described below, a stroboscope, or the like.

Although the lens 8006 of the camera 8000 here is detachable from the housing 8001 for replacement, the lens 8006 may be included in the housing 8001.

Images can be taken at the press of the shutter button 8004. In addition, images can be taken at the touch of the display portion 8002 which serves as a touch panel.

The display device or input/output device of one embodiment of the present invention can be used in the display portion 8002.

Figure 57B:
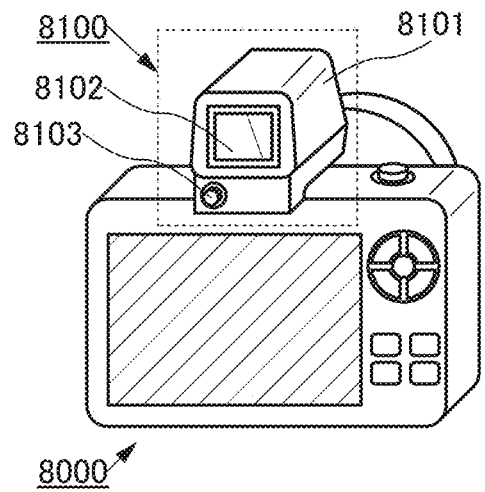

FIG. 57B shows the camera 8000 with the finder 8100 connected.

The finder 8100 includes a housing 8101, a display portion 8102, a button 8103, and the like.

The housing 8101 includes a connection portion for engagement with the connection portion 8005 of the camera 8000 so that the finder 8100 can be connected to the camera 8000. The connection portion includes an electrode, and an image or the like received from the camera 8000 through the electrode can be displayed on the display portion 8102.

The button 8103 functions as a power supply button. With the button 8103, the display portion 8102 can be turned on and off.

The semiconductor device of one embodiment of the present invention can be used for an integrated circuit and an image sensor included in the housing 8101.

Although the camera 8000 and the finder 8100 are separate and detachable electronic devices in FIGS. 57A and 57B, the housing 8001 of the camera 8000 may include a finder having the display device or input/output device of one embodiment of the present invention.

Figure 57C:
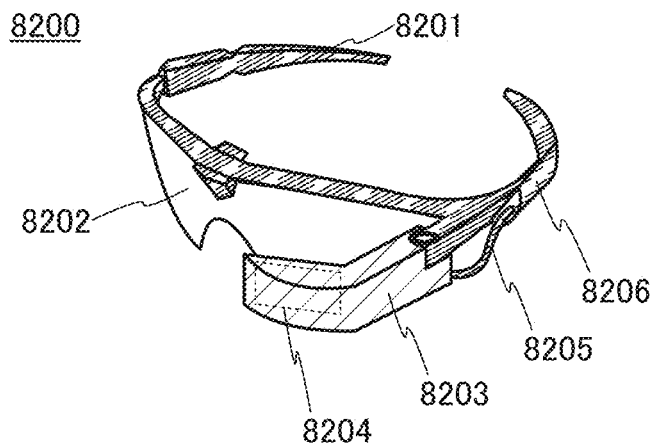

FIG. 57C illustrates an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The semiconductor device of one embodiment of the present invention can be used for an integrated circuit included in the main body 8203.

At least part of this embodiment can be implemented in combination with any of the other embodiments and the other examples described in this specification as appropriate.

Embodiment 16

In this embodiment, application examples of an RF tag using the semiconductor device of one embodiment of the present invention will be described with reference to FIGS. 58A to 58F.

Application Examples of RF Tag

Figure 58A:
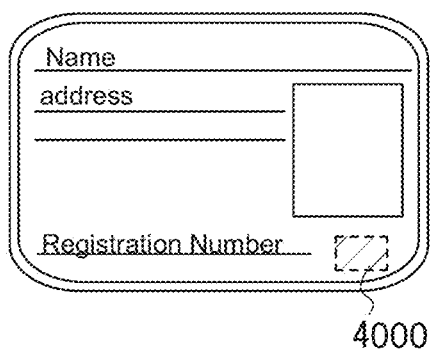
FIGS. 58A to 58F each illustrate an application example of an RF tag of one embodiment of the present invention.
Figure 58B:
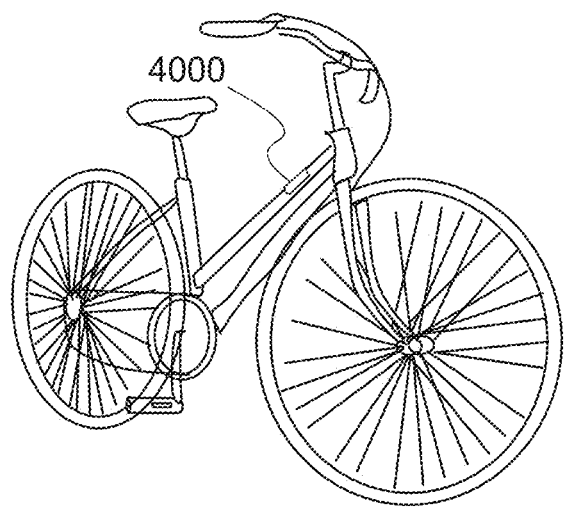
Figure 58C:
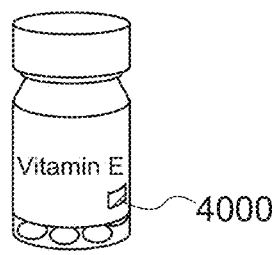
Figure 58D:
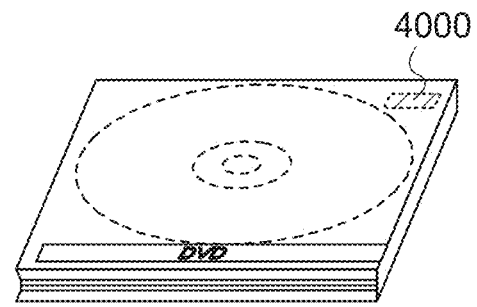
Figure 58E:
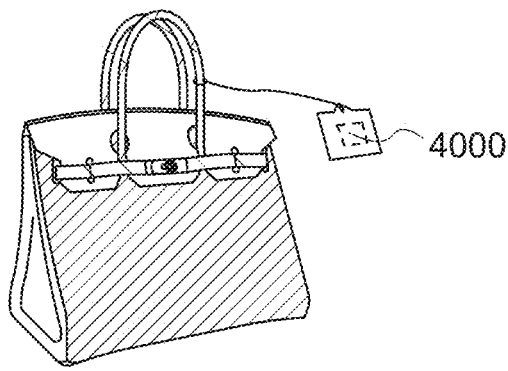
Figure 58F:
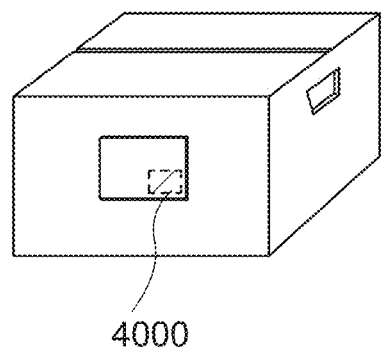

The RF tag is widely used and can be provided for, for example, products such as bills, coins, securities, bearer bonds, documents (e.g., driver's licenses or resident's cards, see FIG. 58A), vehicles (e.g., bicycles, see FIG. 58B), packaging containers (e.g., wrapping paper or bottles, see FIG. 58C), recording media (e.g., DVDs or video tapes, see FIG. 58D), personal belongings (e.g., bags or glasses), foods, plants, clothing, household goods, medical supplies such as medicine and chemicals, and electronic appliances (e.g., liquid crystal display devices, EL display devices, television sets, or cellular phones), animals, human bodies, or tags on products (see FIG. 58E and FIG. 58F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic appliances, or the like. Vehicles can also have a higher level of security against theft or the like by being provided with the RF tag of one embodiment of the present invention.

As described above, by using the RF tag including the semiconductor device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with any of the other embodiments and examples in this specification as appropriate.

Example 1

In this example, a sample including a capacitor of the present invention was fabricated, and capacitance of the capacitor was measured.

The sample was fabricated in such a manner that a 400-nm-thick first silicon oxide film was formed on a single crystal silicon wafer by a thermal oxidation method. Next, a 50-nm-thick tungsten-silicon alloy film was deposited by a sputtering method over the first silicon oxide film. Then, a resist mask was formed over the tungsten-silicon alloy film by a lithography method.

Next, the tungsten-silicon alloy film was processed by a dry etching method with use of the resist mask as an etching mask, so that a first electrode including the tungsten-silicon alloy film was formed.

Next, a surface of the first electrode including the tungsten-silicon alloy film was oxidized by plasma treatment containing an oxygen gas, so that an oxide film of the tungsten-silicon alloy film was formed on the surface of the first electrode including the tungsten-silicon alloy film. The tungsten-silicon alloy film was oxidized with use of an apparatus including a high-density plasma source (high-density plasma apparatus). For the oxidation, a mixed gas including an Ar gas (flow rate: 900 sccm) and an oxygen gas (flow rate: 40 sccm) was used, and a microwave power of 4000 W was applied at a pressure of 666.65 Pa and a temperature of 400° C. for a treatment time of 3600 sec.

Next, a 30-nm-thick tantalum nitride film was deposited by a sputtering method over the oxide film of the tungsten-silicon alloy film, and a 170-nm-thick tungsten film was deposited successively thereover. Next, a resist mask was formed by a lithography method over the tungsten film.

Next, the tungsten film and the tantalum nitride film were processed by a dry etching method using the resist mask as an etching mask, so that a second electrode including the tungsten film and the tantalum nitride film was formed.

Next, a 300-nm-thick second silicon oxide film was formed by a CVD method. Then, a contact hole reaching a top surface of the first electrode through the second silicon oxide film and the oxide film of the tungsten-silicon alloy film was formed by a lithography method, and a contact hole reaching a top surface of the second electrode through the second silicon oxide film was formed by a lithography method.

Next, a 50-nm-thick titanium film, a 200-nm-thick aluminum film, and a 50-nm-thick titanium film were successively formed by a sputtering method.

Next, the titanium film, the aluminum film, and the titanium film were processed by a lithography method, so that a leading wiring and a measurement electrode each including the titanium film, the aluminum film, and the titanium film were formed. In the above manner, a capacitor was fabricated.

Figure 59:
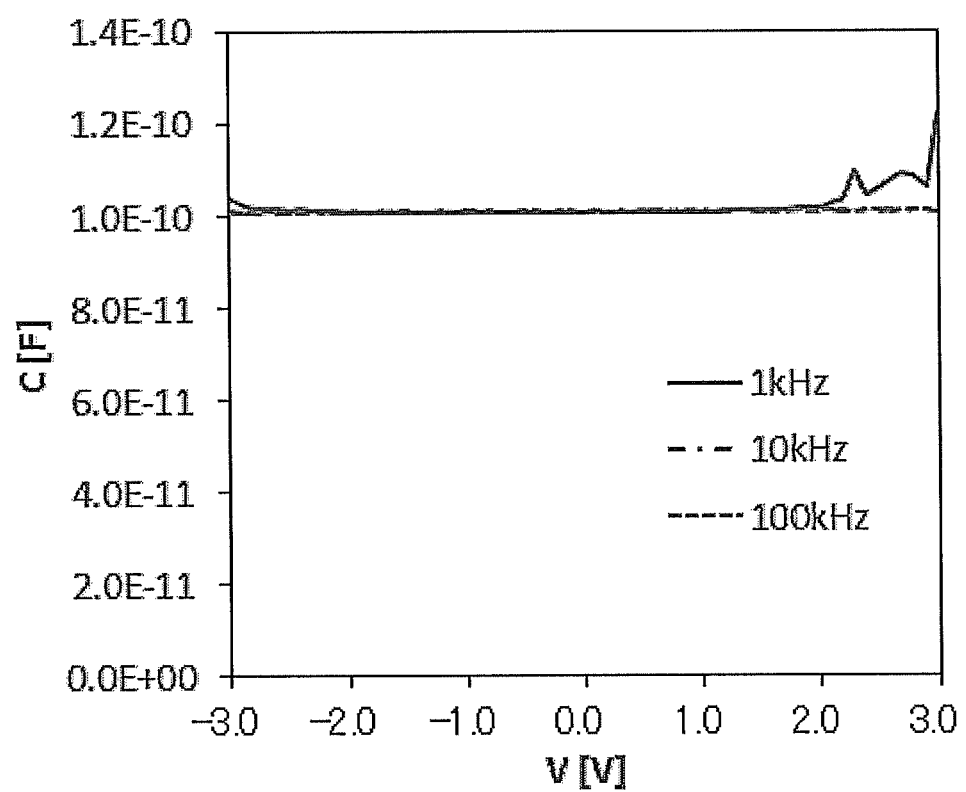
FIG. 59 is a graph showing a C-V measurement in Example 1.

Next, a capacitance-voltage measurement (C-V measurement) of the fabricated capacitor was performed. The range of the measurement voltage was from −3 V to +3V, and the measurement frequencies were 1 kHz, 10 kHz, and 100 kHz. The measured capacitor had a size of 380 μm×110 μm. FIG. 59 shows a result of the C-V measurement. According to the C-V measurement, the capacitance of the capacitor was measured to be $1.01 \times 10^{-10}$ [F].

Figure 60:
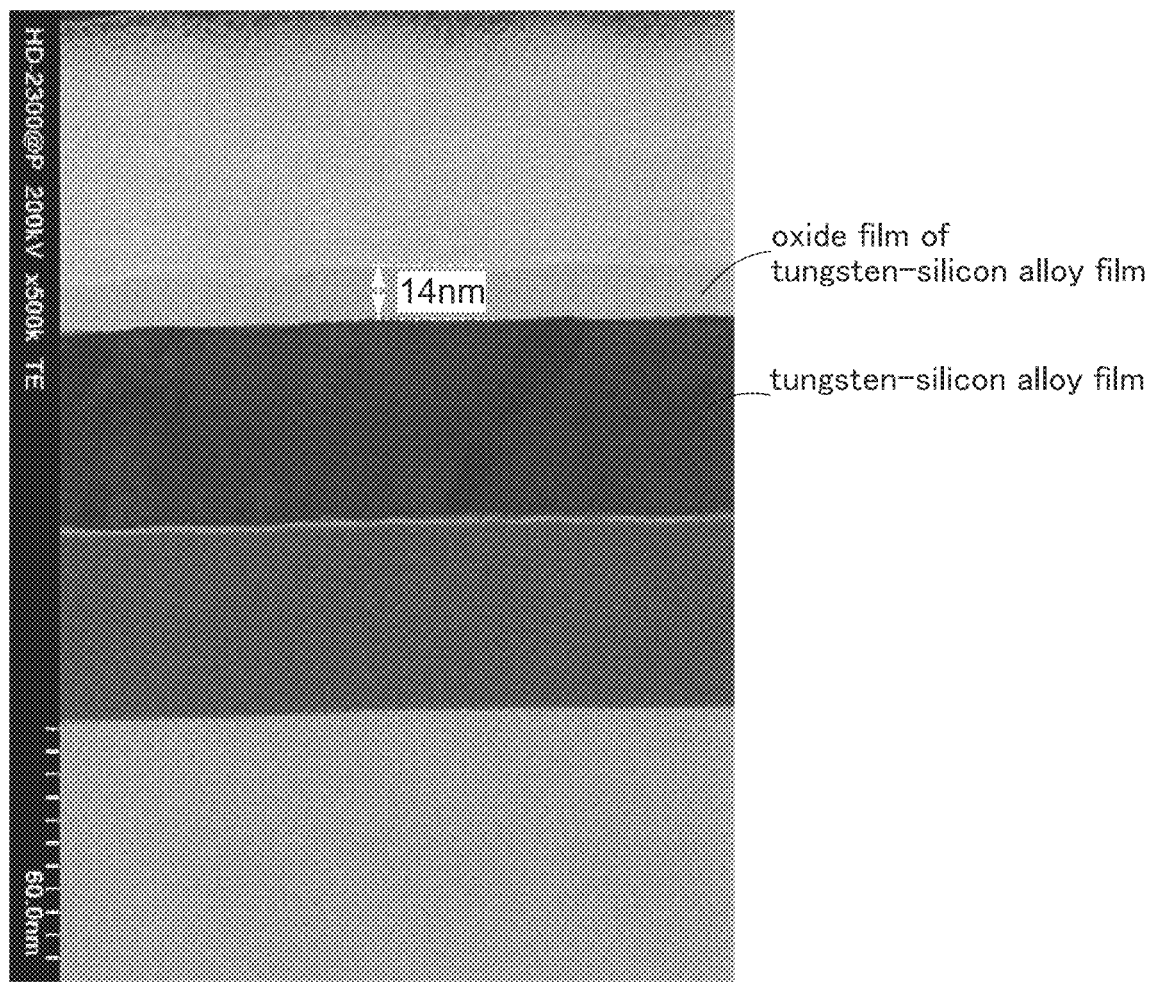
FIG. 60 shows a cross-sectional STEM image in Example 1.

In order to measure the thickness of the oxide film of the tungsten-silicon alloy film, a cross-section of a sample fabricated under the same oxidation condition as that of the above sample was observed with scanning transmission electron microscopy (STEM). FIG. 60 shows an STEM cross-sectional image. According to FIG. 60, the thickness of the oxide film of the tungsten-silicon alloy film was approximately 14 nm.

Next, assuming that the oxide film of the tungsten-silicon alloy film was a silicon oxide film, the capacitance value was calculated with use of the following formula: $C_{Ox}=(\varepsilon \times \varepsilon_0)/t_{Ox}$, where $C_{Ox}$, $\varepsilon_0$, $\varepsilon$, and $t_{Ox}$ represent a capacitance of the oxide film, a vacuum permittivity, a relative dielectric constant of the oxide film, and a thickness of the oxide film, respectively. When $\varepsilon=3.8$, $\varepsilon_0=8.854\times 10^{-12}$, and $t_{Ox}=14\times 10^{-9}$ in the silicon oxide film, $C_{Ox}=2.4\times 10^{-3}$ [F/m$^2$].

Thus, the capacitance C of the capacitor with a size of 380 μm×110 μm was calculated to $2.4\times 10^{-3} \times 380 \times 10^{-6} \times 110 \times 10^{-6} = 1.00 \times 10^{-10}$ [F], which is approximately equal to the above C-V measurement value, $1.01 \times 10^{-10}$ [F]. From the result, the oxide film of the tungsten-silicon alloy film was estimated to have the relative dielectric constant substantially equal to that of the silicon oxide film.

Example 2

In this example, X-ray photoelectron spectroscopy (XPS) analysis of an oxide film of a tungsten-silicon alloy film was conducted. As a sample, first, a 50-nm-thick silicon oxide film was formed by a thermal oxidation method over a single crystal silicon wafer. Then, a 50-nm-thick tungsten-silicon alloy film was deposited by a sputtering method over the silicon oxide film. Next, thermal treatment was performed at 400° C. in an air atmosphere for an hour, so that an oxide film of the tungsten-silicon alloy film was formed over the tungsten-silicon alloy film. In the above manner, the sample was fabricated. In addition, as a comparative example, a sample that has not been subjected to thermal treatment was fabricated.

Figure 61A:
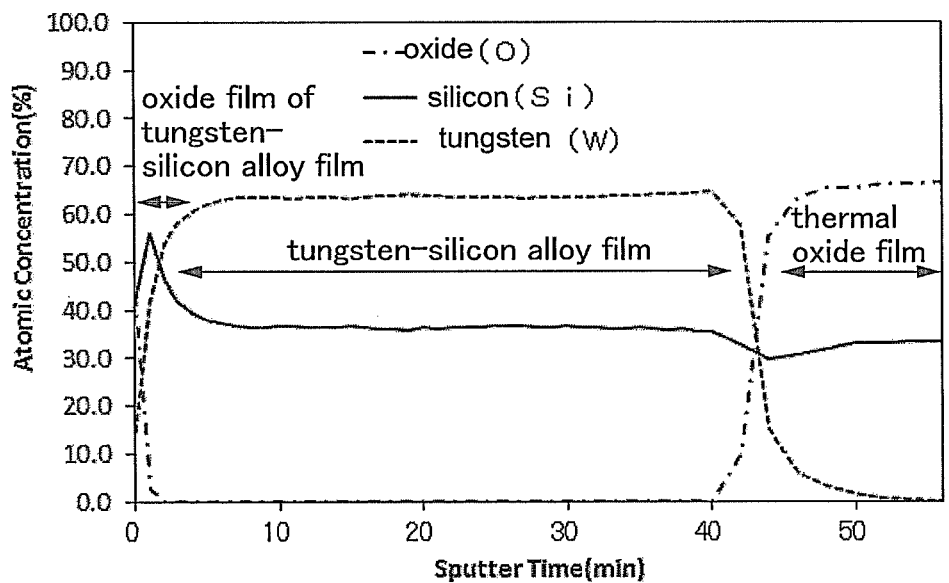
FIGS. 61A and 61B are each a graph showing XPS analysis results in Example 2.
Figure 61B:
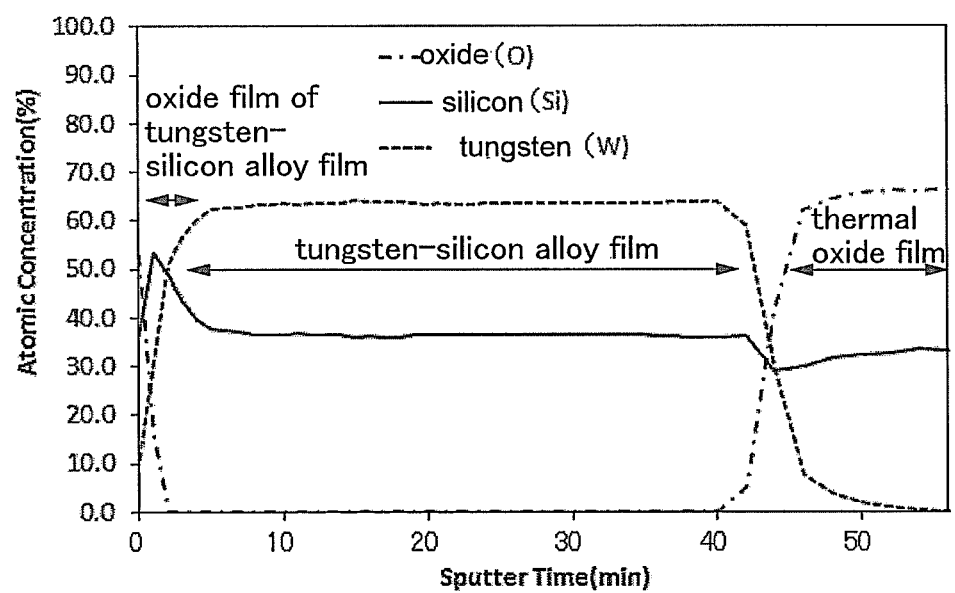

The samples fabricated in the above manner were analyzed by XPS. FIGS. 61A and 61B show depth profiles obtained by the XPS analysis results. FIG. 61A shows the depth profile of the sample that has not been subjected to the thermal treatment. FIG. 61B shows the depth profile of the sample subjected to the thermal treatment. It is found that, regardless of whether the thermal treatment was performed or not, the oxide film of the tungsten-silicon alloy film was formed over the tungsten-silicon alloy film, and that the silicon concentration was higher than the tungsten concentration.

Figure 62A:
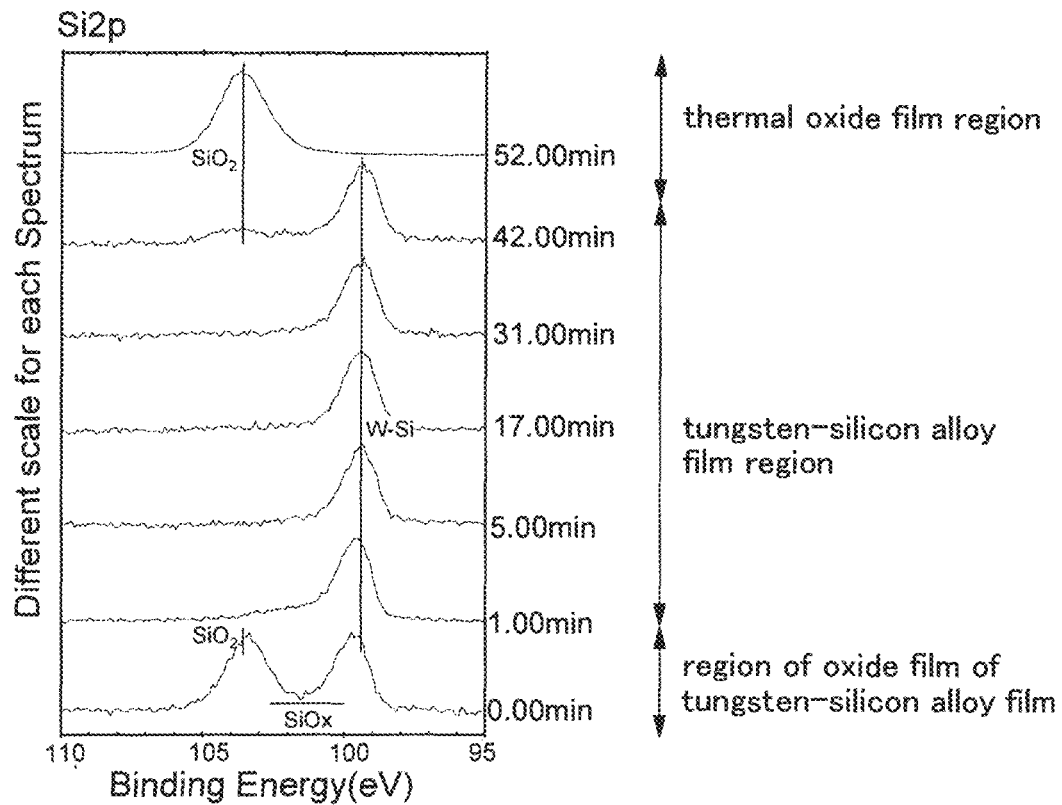
FIGS. 62A and 62B are each a graph showing XPS analysis results in Example 2.
Figure 62B:
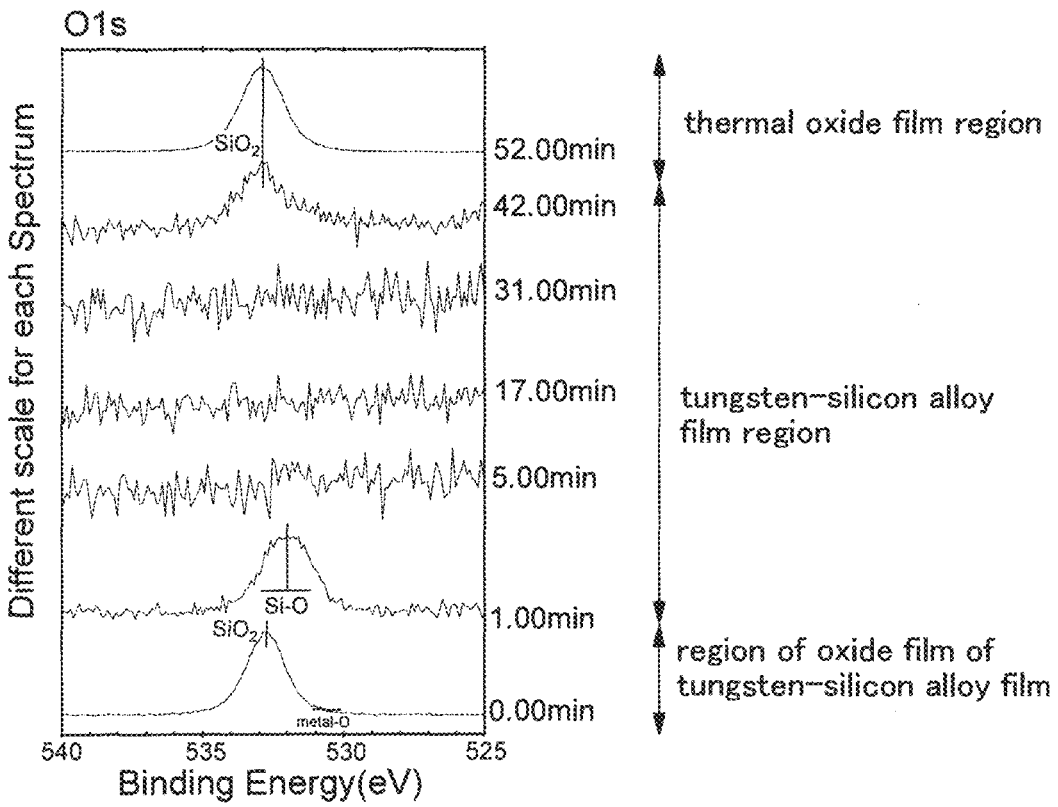

For the sample subjected to the thermal treatment, montage plots were obtained. FIG. 62A shows a montage plot of Si2p spectra, and FIG. 62B shows a montage plot of O1s spectra. The montage plot is a graph where the results of each depth (region) are superposed on the binding energy and plotted. In each graph of montage plot, the horizontal axis represents the binding energy. The vertical axis represents the sputtering time and the depth of the sample. The bottom of the vertical axis corresponds to the sample surface, and the depth is shown along the direction of the vertical axis upward. As shown in each of the graphs, a peak of $SiO_2$ was observed in a region of the oxide film of the tungsten-silicon alloy film, which indicates that the main component of the oxide film of the tungsten-silicon alloy film is $SiO_2$. According to the results, silicon was precipitated on the surface of the tungsten-silicon alloy film before the thermal treatment, and the precipitated silicon was oxidized by thermal treatment, so that the silicon oxide film was formed. Thus, it is considered that oxidation of tungsten is suppressed. From the above, the results of XPS analysis suggest that silicon oxide is a main component of the oxide film of the tungsten-silicon alloy film. Furthermore, it is found that silicon is oxidized locally.

This application is based on Japanese Patent Application serial no. 2015-214050 filed with Japan Patent Office on Oct. 30, 2015, the entire contents of which are hereby incorporated by reference.

What is claimed is:

1. A semiconductor device comprising:
a first transistor comprising silicon in a channel formation region;
a second transistor comprising an oxide semiconductor in a channel formation region; and
a capacitor,
wherein a gate electrode of the first transistor, one of a source region and a drain region of the second transistor, and one electrode of the capacitor are electrically connected to one another,
wherein the semiconductor device further comprises:
  a first insulating layer over the channel formation region of the first transistor;
  a first conductive layer in direct contact with a top surface of the first insulating layer and serving as a first gate electrode of the second transistor;
  a second conductive layer in direct contact with the top surface of the first insulating layer and comprising a same material as the first conductive layer;
  an oxide semiconductor layer over the first conductive layer and comprising the channel formation region of the second transistor;
  a third conductive layer over the oxide semiconductor layer and serving as a second gate electrode of the second transistor;
  a second insulating layer over the third conductive layer;
  a fourth conductive layer in direct contact with a top surface of the second insulating layer and electrically connected to the one of the source region and the drain region of the second transistor and to the gate electrode of the first transistor;
  a fifth conductive layer in direct contact with the top surface of the second insulating layer and electrically connected to the other of the source region and the drain region of the second transistor and to one of a source region and a drain region of the first transistor;
  a sixth conductive layer in direct contact with the top surface of the second insulating layer and electrically connected to the second conductive layer;
  a third insulating layer in direct contact with a top surface of the fourth conductive layer, a top surface of the fifth conductive layer, and a top surface of the sixth conductive layer; and
  a seventh conductive layer over the third insulating layer,
wherein the fourth conductive layer, the fifth conductive layer, and the sixth conductive layer comprise a same material, and
wherein the seventh conductive layer is electrically connected to the second conductive layer through the sixth conductive layer.

2. The semiconductor device according to claim 1, further comprising an eighth conductive layer,
wherein the eighth conductive layer is in direct contact with the top surface of the second insulating layer, comprises the same material as the fourth conductive layer, the fifth conductive layer, the sixth conductive layer, and overlaps with the channel formation region of the second transistor.

3. A semiconductor device comprising:
a first transistor comprising silicon in a channel formation region;
a second transistor comprising an oxide semiconductor in a channel formation region; and
a capacitor,
wherein a gate electrode of the first transistor, one of a source region and a drain region of the second transistor, and one electrode of the capacitor are electrically connected to one another,
wherein the semiconductor device further comprises:
  a first insulating layer over the channel formation region of the first transistor;
  a first conductive layer in direct contact with a top surface of the first insulating layer and serving as a first gate electrode of the second transistor;
  a second conductive layer in direct contact with the top surface of the first insulating layer and comprising a same material as the first conductive layer;
  an oxide semiconductor layer over the first conductive layer and comprising the channel formation region of the second transistor;

a third conductive layer over the oxide semiconductor layer and serving as a second gate electrode of the second transistor;
a second insulating layer over the third conductive layer;
a fourth conductive layer in direct contact with a top surface of the second insulating layer and electrically connected to the one of the source region and the drain region of the second transistor and to the gate electrode of the first transistor;
a fifth conductive layer in direct contact with the top surface of the second insulating layer and electrically connected to the other of the source region and the drain region of the second transistor and to one of a source region and a drain region of the first transistor;
a sixth conductive layer in direct contact with the top surface of the second insulating layer and electrically connected to the second conductive layer;
a third insulating layer in direct contact with a top surface of the fourth conductive layer, a top surface of the fifth conductive layer, and a top surface of the sixth conductive layer; and
a seventh conductive layer over the third insulating layer,
wherein the fourth conductive layer, the fifth conductive layer, and the sixth conductive layer comprise a same material,
wherein the seventh conductive layer is electrically connected to the second conductive layer through the sixth conductive layer, and
wherein the first conductive layer and the third conductive layer are electrically connected to each other.

4. The semiconductor device according to claim 3, further comprising an eighth conductive layer,
wherein the eighth conductive layer is in direct contact with the top surface of the second insulating layer, comprises the same material as the fourth conductive layer, the fifth conductive layer, the sixth conductive layer, and overlaps with the channel formation region of the second transistor.

5. A semiconductor device comprising:
a first transistor comprising silicon in a channel formation region;
a second transistor comprising an oxide semiconductor in a channel formation region; and
a capacitor,
wherein a gate electrode of the first transistor, one of a source region and a drain region of the second transistor, and one electrode of the capacitor are electrically connected to one another,
wherein the semiconductor device further comprises:
a first insulating layer over the channel formation region of the first transistor;
a first conductive layer in direct contact with a top surface of the first insulating layer and serving as a first gate electrode of the second transistor;
a second conductive layer in direct contact with the top surface of the first insulating layer and comprising a same material as the first conductive layer;
a second insulating layer in direct contact with a top surface of the first conductive layer and a top surface of the second conductive layer and serving as a first gate insulating layer of the second transistor;
an oxide semiconductor layer over the second insulating layer and comprising the channel formation region of the second transistor;
a third insulating layer in direct contact with a top surface of the oxide semiconductor layer and serving as a second gate insulating layer of the second transistor;
a third conductive layer over the third insulating layer and serving as a second gate electrode of the second transistor;
a fourth insulating layer over the third conductive layer;
a fourth conductive layer in direct contact with a top surface of the fourth insulating layer and electrically connected to the one of the source region and the drain region of the second transistor through a first opening and to the gate electrode of the first transistor through a second opening;
a fifth conductive layer in direct contact with the top surface of the fourth insulating layer and electrically connected to the other of the source region and the drain region of the second transistor and to one of a source region and a drain region of the first transistor;
a sixth conductive layer in direct contact with the top surface of the fourth insulating layer and electrically connected to the second conductive layer;
a fifth insulating layer in direct contact with a top surface of the fourth conductive layer, a top surface of the fifth conductive layer, and a top surface of the sixth conductive layer; and
a seventh conductive layer over the fifth insulating layer,
wherein the first opening is in the third insulating layer and the fourth insulating layer,
wherein the second opening is in the second insulating layer, the third insulating layer, and the fourth insulating layer,
wherein the first opening and the second opening do not overlap with each other,
wherein the fourth conductive layer, the fifth conductive layer, and the sixth conductive layer comprise a same material, and
wherein the seventh conductive layer is electrically connected to the second conductive layer through the sixth conductive layer.

6. The semiconductor device according to claim 5, further comprising an eighth conductive layer,
wherein the eighth conductive layer is in direct contact with the top surface of the fourth insulating layer, comprises the same material as the fourth conductive layer, the fifth conductive layer, the sixth conductive layer, and overlaps with the channel formation region of the second transistor.

* * * * *